(12) United States Patent
Chou et al.

(10) Patent No.: US 11,023,642 B2
(45) Date of Patent: *Jun. 1, 2021

(54) EVENT-DRIVEN DESIGN SIMULATION

(71) Applicant: MONTANA SYSTEMS INC., Rolling Hills Estates, CA (US)

(72) Inventors: Vivian Chou, Rancho Palos Verdes, CA (US); Sherman Lee, Rancho Palos Verdes, CA (US)

(73) Assignee: Montana Systems Inc., Rolling Hills Estates, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/736,720

(22) Filed: Jan. 7, 2020

(65) Prior Publication Data

US 2020/0143097 A1 May 7, 2020

Related U.S. Application Data

(62) Division of application No. 15/920,937, filed on Mar. 14, 2018, now Pat. No. 10,755,014.

(51) Int. Cl.
*G06F 30/00* (2020.01)
*G06F 30/367* (2020.01)
*G06F 30/3323* (2020.01)
*G06F 30/39* (2020.01)
*G06F 30/33* (2020.01)

(52) U.S. Cl.
CPC ............ *G06F 30/367* (2020.01); *G06F 30/33* (2020.01); *G06F 30/3323* (2020.01); *G06F 30/39* (2020.01)

(58) Field of Classification Search
CPC .... G06F 30/367; G06F 30/39; G06F 30/3323; G06F 30/33
See application file for complete search history.

(56) References Cited

U.S. PATENT DOCUMENTS

| | | | | |
|---|---|---|---|---|
| 4,899,273 A | * | 2/1990 | Omoda | G01R 31/31705 703/14 |
| 5,081,601 A | * | 1/1992 | Eirikasson | G06F 8/458 703/17 |
| 5,446,748 A | * | 8/1995 | Hasebe | G06F 11/261 714/814 |
| 6,108,745 A | | 8/2000 | Gupta et al. | |
| 6,594,806 B1 | * | 7/2003 | Casavant | G06F 30/3312 716/102 |
| 6,625,081 B2 | | 9/2003 | Roohparvar et al. | |
| 6,836,877 B1 | | 12/2004 | Dupenloup | |
| 6,856,950 B1 | * | 2/2005 | Abts | G06F 30/33 703/13 |

(Continued)

*Primary Examiner* — Naum Levin
(74) *Attorney, Agent, or Firm* — J.H. Lin Patent Law P.C.; John H. Lin

(57) ABSTRACT

An event-driven simulation system is provided. The simulation system classifies events into bypass-events and perform-events. The simulation system performs simulation by executing instructions based on the perform-events and skips simulation for the bypass-events. The simulation system produces partial simulation result data based events that are actually simulated but not the events that are skipped. A post processor is provided to generate the missing simulation result data for the bypass-events and to merge the bypass-event with the partial simulation result to generate a complete simulation result.

16 Claims, 52 Drawing Sheets

(56) References Cited

U.S. PATENT DOCUMENTS

| | | | |
|---|---|---|---|
| 7,171,602 B2* | 1/2007 | Gomes | G01R 31/318328 714/738 |
| 7,334,203 B2* | 2/2008 | Chan | G06F 30/3312 716/108 |
| 7,487,483 B2* | 2/2009 | Seawright | G06F 30/3323 716/113 |
| 7,502,724 B2* | 3/2009 | Tada | G01R 31/318357 703/14 |
| 7,567,893 B2 | 7/2009 | Torossian et al. | |
| 7,761,279 B1* | 7/2010 | Cai | G06F 30/367 703/17 |
| 7,761,828 B2* | 7/2010 | Miczo | G06F 30/33 716/103 |
| 7,912,694 B2* | 3/2011 | Bobok | G06F 30/33 703/16 |
| 8,327,187 B1 | 12/2012 | Metcalf | |
| 8,549,258 B2 | 10/2013 | Lee et al. | |
| 8,738,350 B2* | 5/2014 | Whisnant | G06F 30/33 703/16 |
| 8,849,644 B2* | 9/2014 | Tan | G06F 30/33 703/16 |
| 8,977,997 B2* | 3/2015 | Stamness | G06F 30/33 716/106 |
| 9,311,259 B2 | 4/2016 | Greiner et al. | |
| 10,002,217 B2* | 6/2018 | McGaughy | G06F 30/30 |
| 10,789,405 B2* | 9/2020 | Chou | G06F 30/331 |
| 2002/0126581 A1* | 9/2002 | Endo | G06F 30/3312 368/13 |
| 2002/0133325 A1* | 9/2002 | Hoare, II | G06F 30/20 703/17 |
| 2008/0184195 A1 | 7/2008 | Lee et al. | |
| 2014/0282312 A1 | 9/2014 | Stamness et al. | |
| 2015/0331982 A1* | 11/2015 | McGaughy | G06F 30/30 703/14 |
| 2018/0203964 A1* | 7/2018 | Chou | G06F 30/367 |
| 2018/0203967 A1* | 7/2018 | Chou | G06F 30/39 |

* cited by examiner

At time 1000 ns:

At time 1003 ns:

340 — Event Time Wheel

At time 1003 ns:        At time 1010 ns:

Group 7   Group 8        Group 1 aa.0=0    gg.0=0         O.1=1
bb.0=1    jj.0=1         T.2 =0
cc.2=0
dd.0=1

• • •

320 — Data Memory

Group 7    Group 8    Group 9     Group 10    Group 11 aa={0}     gg={0}     qq={1}      rr={0,1}    xx={1}
bb={1}     hh={1}     ww={1}      tt={1}      yy={1,0}
cc={0,0}   ii={1}     ee={0,1}    pp={0,1}    zz={0,0}
dd={1}     jj={1}

• • •

330 — Event Table

Group 7    Group 8    Group 9    Group 10    Group 11 aa: ☒      gg: ☒      qq: ☐      rr: ☐☐      xx: ☐ bb: ☒      hh: ☐      ww: ☐      tt: ☐       yy: ☐☐ cc: ☐☒     ii: ☐      ee: ☐☐     pp: ☐☐      zz: ☐☐ dd: ☒      jj: ☒

*Figure 13b*

EVENT-DRIVEN DESIGN SIMULATION

CLAIM OF BENEFIT TO PRIOR APPLICATIONS

This application is a divisional application of presently pending U.S. patent application Ser. No. 15/920,937, filed on Mar. 14, 2018 and issued as U.S. Pat. No. 10,755,014 on Aug. 25, 2020. U.S. patent application Ser. No. 15/920,937 is a continuation-in-part application of U.S. patent application Ser. No. 15/399,982, filed Jan. 6, 2017 and issued as U.S. Pat. No. 10,503,504 on Dec. 10, 2019. U.S. patent application Ser. No. 15/399,982 claims the benefit of U.S. Provisional Patent Application 60/304,110, filed Mar. 4, 2016. U.S. Provisional Patent Application 60/304,110, U.S. Pat. No. 10,503,504, and U.S. Pat. No. 10,755,014, and are incorporated herein by reference.

BACKGROUND

Verification of design by simulation is a key component of the engineering process for building complex hardware such as integrated circuits (ICs). Design simulation helps engineers verify and validate the intended function of a product under development, as well as the manufacturability of the product.

SUMMARY

Some embodiments of the disclosure provide an improved simulation system. The simulation system has a simulation accelerator that accelerates simulation of a testbench for a register transfer level (RTL) design by hiding memory latency and exploiting available parallelism in the design. The RTL design and the testbench models are implemented as instructions executable by the simulation accelerator. In some embodiments, the simulation accelerator performs event driven simulation when executing instructions compiled from RTLs and testbench models. The instructions of the compiled RTLs are sorted into groups, each group having instructions that are logically independent of each other.

In some embodiments, the accelerator executes an instruction when the instruction has a pending input event. The accelerator uses the event table to keep track of pending input events and to identify instructions that need to be executed. In some embodiments, the simulation accelerator determines which instructions to fetch and execute based on which instructions have pending events in the current time step. When instructions are group-sorted into groups of logically independent instructions, the simulation accelerator determines which group of instructions to fetch and execute based on which groups of instructions have pending events.

For some embodiments, the event table has several component tables, including an instruction event table and a group event table. Each group has one respective corresponding bit in the group event table for indicating whether the group has at least one pending event in the current time step. Each instruction of each group has a corresponding bit in the instruction event table for indicating whether the instruction has at least one pending event in the current time step. In some embodiments, each instruction has a corresponding bit for each input of the instruction. In some embodiments, each instruction has one bit for indicating whether the instruction has a pending event at any of its inputs. The simulation accelerator uses the group event table to identify a group that has at least one pending event. The simulation accelerator also uses the instruction event table to identify instructions having at least one pending event in the identified group. The simulation accelerator sets the identified group as the current group.

In some embodiments, the pending events indicators of the current group are retrieved from the instruction event table to a current group event register. The current group event register records pending events for instructions in the current group The content of the current group event register is used to identify the instructions having pending events in the current group. The simulation accelerator executes the instructions identified by the current group event register as having pending events.

An instruction may occupy one instruction word or multiple instruction words in the instruction memory, each instruction word corresponding to a unique instruction address within its group. Each bit in the current group event register corresponds to an instruction word. In some embodiments, the bit that corresponds to the first address location occupied by the instruction is used to indicate whether the instruction has a pending event in the current time step, and the bit position of each pending event in the current group event register is used by the instruction fetching module to identify the starting address location occupied by the instruction. In other words, each instruction word of the current group has a corresponding bit in the current group event register for indicating whether an instruction starting at the instruction word has at least one pending event in the current time step.

In some embodiments, the simulation system classifies events into bypass-events and perform-events. The simulation system executes instructions based on the perform-events and skips simulation for the bypass-events. In some embodiments, scheduled events having sufficiently high number of triggered instructions are classified as perform-events while events that do not have sufficient number of triggered instructions are classified as bypass-events. In some embodiments, scheduled events that trigger only stateless instructions are classified as bypass-events. In some embodiments, all events generated by a particular module are classified as bypass-events. In such instances, the simulation accelerator would not execute any instruction for the particular module. In some embodiments, the user may specify through a user interface that a particular type of scheduled events at a particular signal construct to be bypass-events. In some embodiments, the source codes of the testbench may directly specify a particular type of scheduled events at a particular signal construct to be bypass-events.

Different embodiments use different methods and/or apparatus to skip simulation of bypass-events. In some embodiments, the compiler does not generate any instructions that triggers on bypass-events. In some embodiments, an event scheduler that generates both bypass-events and perform-events is compiled into instructions that generate only perform-events.

In some embodiments, an event-driven simulation produces only the simulation result data for events that are actually simulated but not the events that are skipped. In other words, the simulation result data is partial simulation result data that lacks data for the bypass-events and/or time steps. In order to create a complete simulation result data for all events and all time steps, some embodiments provide a post processor to generate the missing simulation result data for the bypass-events and to merge the bypass-event with the partial simulation result to generate a complete simulation result.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 13a-b conceptually illustrate the content of the event time wheel storage, the event table, and the data memory in different time steps.

DETAILED DESCRIPTION

Figure 1A:
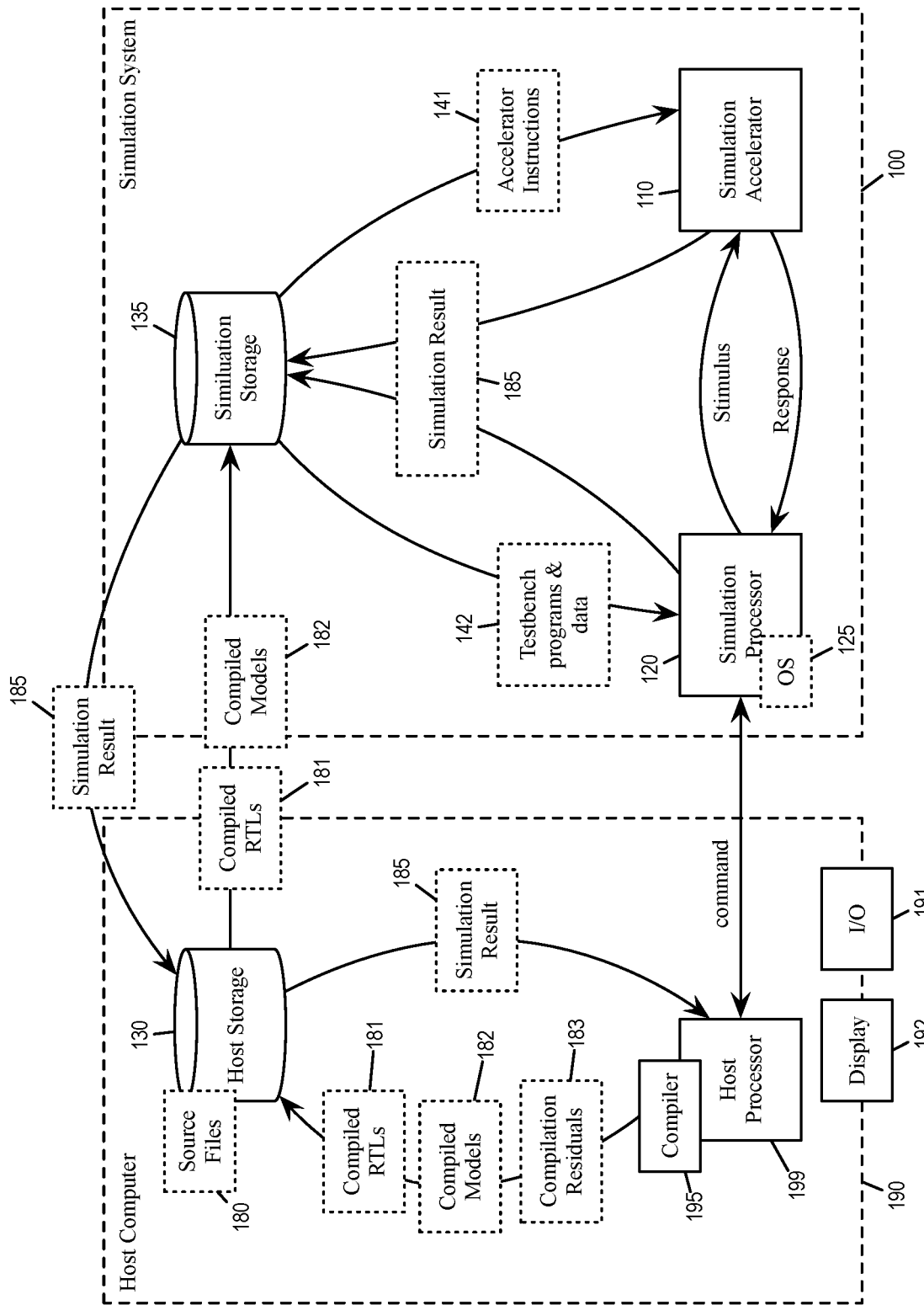
FIG. 1a illustrates a simulation system according to some embodiments of the disclosure.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Software implementations of design simulators are traditionally relied upon as the most flexible solution for simulating hardware and performing design verification. Simulators compliant with IEEE 1800-2012 support arbitrary mixtures of legacy C/C++, Verilog, and SystemVerilog using methodologies ranging from the industry-standard Universal Verification Methodology (UVM) to unstructured ad hoc approaches. As software platforms, these products absorb productivity-enhancing software engineering abstractions—object-oriented programming, re-entrant code, garbage collection, namespaces, etc.—and integrate them into the verification community.

The effective capacity of software simulators expands along with advancing computer speeds and memory resources. As the growth of central processing unit (CPU) speeds began to plateau in recent years, parallel processing based on multiple cores with multi-threaded execution are touted as the key to increased computing throughput. However, software-based simulators running on CPUs have been unable to realize the promises of parallel computing due to fundamental mismatches between the underlying hardware architecture and the specific demands of the task. A key impediment to realizing the promises of parallel computing is memory access latency. Experimental results show that Verilog simulations use fewer than 5% of the cycles for actual execution while spending overwhelming majority of the remaining cycles waiting for memory access through layers of CPU cache.

An alternative to software design simulators is hardware emulator. Under hardware emulation, synthesized register transfer level (RTL) descriptions of digital circuits is mapped directly to FPGA logic blocks or specialized processors. The result is a cycle-accurate version of the target design running in hardware at speeds considerably greater than software simulation. Every active block or processor is assigned a specific set of synthesized gates to compute during each clock cycle. In other words, hardware emulation simulates the design by completely implementing the design, albeit with relaxed timing requirements.

As a result of this hardware assignment, the computational efforts to compile and map RTL onto emulator fabrics are significant. Furthermore, expanding the scope of an emulated design can become non-trivial, possibly triggering repartitioning or requiring physical expansion of the emulator substrate with more FPGAs or more processors. This negatively impacts the efficiency of the compile-run-modify design iteration cycle. Furthermore, like the target system, its emulated counterpart employs only two-state logic while software simulators benefit from the enhanced diagnostic capabilities granted by four-state (or more) logic. The loss of abstraction suffered in moving from flexible software to fixed hardware impacts debugging in other ways as well.

I. Simulation System

Some embodiments of the disclosure provide an improved simulation system. The simulation system has a simulation accelerator that accelerates RTL simulations by hiding memory latency and exploiting available parallelism in the RTLs. The simulation system also has a dedicated simulation processor for executing testbench codes. This allows the testbench codes to more efficiently interact with the RTLs than relying on a general-purpose host computer to execute testbench codes.

FIG. 1a illustrates a simulation system 100 according to some embodiments of the disclosure. The simulation system 100 uses parallel processing to accelerate the simulation of a design while minimizing memory access latency. The simulation system 100 receives user communications through a host computer 190. The simulation system 100 also receives compiled design data 181-182 from a compiler 195 running on a host computer 190.

The host computer 190 is a computing device that the user interfaces when using the simulation system 100. The host computer 190 includes a host processor 199, a host storage 130, a set of input/output devices (I/O) 191 and display 192. It is a general-purpose computer that includes an operating system and provides a user interface through its I/O 191 and its display device 192. The host processor 199 is also a CPU that operates several layers of caching structure.

The host computer 190 receives commands from the user and directs the simulation system 100 to perform operations based on the received user commands, including initiating and/or terminating simulation. It also collects simulation results from the simulation system 100 and presents the result data to the user. In some embodiments, the host computer 190 is running a simulation viewing application at a graphical user interface (GUI) for presenting the collected simulation result to the user. In some embodiments, the host computer 190 and the simulation system 100 are not physically in a same device, so they communicate through an inter-device communications medium such as Universal Serial Bus (USB), Ethernet cable, Bluetooth connections, wired or wireless networks, PCI or PCI-Express, etc. These inter-device communications mediums are often shared by multiple data sources and are typically of lower bandwidth and higher latency than intra-device data transport mediums. To avoid slowing down the accelerated simulation operations of the simulation system 100, the host computer 190 in some embodiments does not participate in real-time simulation operations of the simulation system 100. Its interaction with the simulation system 100 is limited to non-real-time control operations such as configuration, reset, simulation start, simulation termination, interrupts, retrieving simulation result, and other latency-tolerant operations.

The compiler 195 is a program that compiles the source files 180 into compiled design files 181-183 by translating or converting the content of the source file into data structures in formats that can be understood by the simulation processor 120 and/or the simulation accelerator 110. As illustrated, the compiled design files 181-183 includes files for compiled RTLs 181, compiled models 182, and compilation residual items 183. The compiled RTLs 181 and the compiled models 182 are in a format that can be understood and operated upon by the simulation system 100, while the compilation residual items 183 are to be handled by the host computer 190. In digital circuit design, RTL is a design abstraction which models a synchronous digital circuit in terms of the flow of digital signals (data) between hardware registers, and the logical operations performed on those signals.

As illustrated, the host computer 190 operates the compiler program 195. In some embodiments, another computing device (not illustrated) operating the compiler program 195 compiles the source files 180 into the compiled design files 181-183. The compiler 195 converts RTL codes into compiled RTLs 181 that includes instructions for the simulation accelerator 110. The compiler 195 also divides the instructions for the simulation accelerator 110 into groups in order to facilitate parallel processing at the accelerator. The compiler 195 compiles models 172 into compiled models 182. The compiled models 182 may include codes that are executable by the simulation processor 120 as well as instructions that are executable by the simulation accelerator 110. The operations of the compiler will be further described by reference to FIG. 7 below.

The host storage 130 is the main storage of the host computing system 190. The host storage 130 stores the source files 180 for the compiler 195 to access. The compiled result, namely the compiled design data 181-183 are stored in the host storage 130. Among these, the compiled RTLs 181 and the compiled models 182 are transported to the simulation system 100 and stored in the simulation storage 135 prior to the start of the simulation. The compilation residual 183 are data structures in the testbench that cannot be handled efficiently by the simulation system 100 so they remain in the host storage 130 to be processed by the host processor 199.

The simulation system 100 is an electronic device that includes both a simulation accelerator 110 and a simulation processor 120. In some embodiments, the simulation system 100 also includes a simulation storage 135 for storing data used by the simulation accelerator 110 and the simulation processor 120. In some embodiments, the simulation accelerator 110 and the simulation processor 120 are implemented in different integrated circuits (ICs). In some embodiments, the simulation system 100 is implemented by an IC that includes both the simulation accelerator 110 and the simulation processor 120. The IC can be a field programmable gate array (FPGAs) or an Application Specific Integrated Circuit (ASIC). In some embodiments, the simulation processor 120 is an embedded processor in an FPGA (e.g., an ARM processor) while the simulation accelerator 110 is implemented by the FPGA's programmable resources. The simulation processor 120 and the simulation accelerator 110 are communicatively coupled by intra-device communications medium such as dedicated conductors or signal pathways. During design simulation, the simulation processor 120 and the simulation accelerator 110 exchange real-time data over the intra-device communications medium with little latency.

The simulation accelerator 110 is for simulating RTLs. It accelerates the simulation of the RTLs by performing parallel processing on the compiled RTLs 181. Simulation accelerator 110 will be further described by reference to Sections II and III below.

The simulation processor 120 is a processor or CPU dedicated to executing non-synthesizable testbench codes during design simulation (through some non-synthesizable testbench codes are compiled into instructions and executed by the simulation accelerator 110). The simulation processor 120 generates stimulus to the simulation accelerator 110 for testing the RTLs. The simulation processor 120 also receives responses from the accelerator 110 in real-time, which allows the simulation processor 120 to generate follow-up stimulus to the simulation accelerator 110. The simulation processor 120 is also executing an operating system 125, which supports file management operations by the simulation system 100. Having its own operating system 125 at the simulation processor 120 enables the simulation system 100 to transport (or retrieve) files and data (such as the compiled design data 181 and 182) directly from the host storage 130 into the simulation storage 135. The simulation system 100 therefore does not rely on the host computer 190 for file access, thereby avoiding operational latencies associated with data transport with the host computer system 190.

The simulation storage 135 is on the same electronic device (or a same IC) as the simulation processor 120 and the simulation accelerator 110 so that the simulation processor 120 and the accelerator 110 can access the simulation storage 135 via fast intra-device communications medium. During design simulation, the simulation storage 135 provides the compiled models 182 and the compiled RTLs 181 to the simulation accelerator 110 and the simulation processor 120, which are in the form of instructions 141 for the simulation accelerator and testbench programs/data 142 for the simulation processor 120. The simulation storage 100 also stores simulation result 185 produced by the simulation accelerator 110 and by the simulation processor 120. The stored simulation result 185 can be transported to the host computer 190 later. The use of the simulation storage 135 therefore minimizes the impact of host system latency, because the simulation processor 120 and the simulation accelerator 110 can access the simulation storage 135 rather than the host system storage 130 during simulation.

Figure 1B:
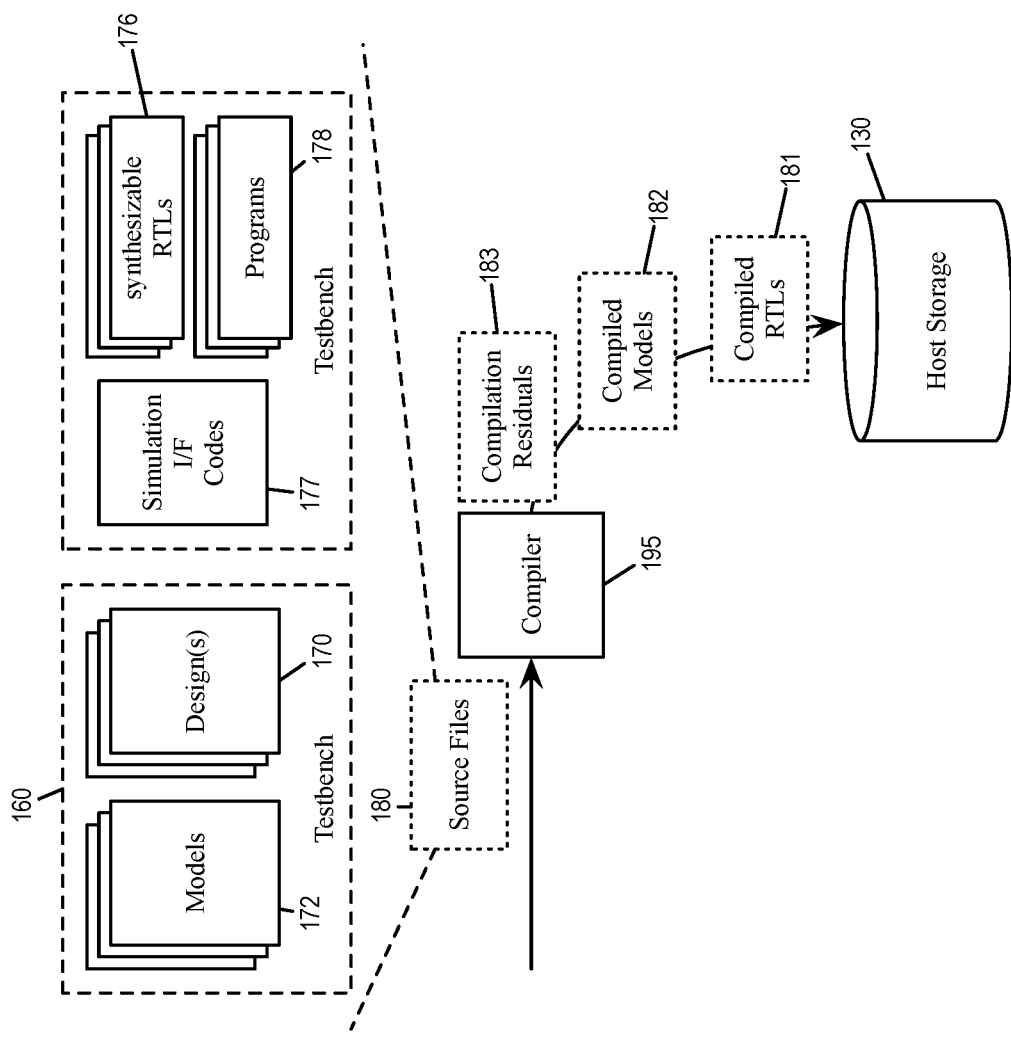
FIG. 1b illustrates the generation of the compiled design data based on a testbench.

FIG. 1b illustrates the generation of the compiled design data 181-183 based on a testbench 160. A testbench is a virtual environment used to verify the correctness of a design or model of a digital circuit or a set of digital circuits. The testbench 160 specifies a virtual environment for testing a design 170 of digital circuits. The testbench 160 can be viewed as including the design 170 and models 172. The design 170 includes descriptions of behaviors and/or structures of a digital circuit or of a set of digital circuits being engineered. The models 172 are models of the testing environment that provide stimulus to the design 170. The testbench 160 can also be viewed as including synthesizable codes 176 and programs 178. The synthesizable codes 176 (also referred to as RTLs) are codes that can be synthesized into digital circuit elements such as gates and/or transistors. The programs 178 are codes that cannot be translated into digital circuit elements, but can nevertheless be executed to perform operations within the testbench 160. In some embodiments, the testbench 160 may also include simulation interface codes 177 such as VPI or PLI commands.

The design 170 is written in synthesizable codes that describe the structures and/or behaviors of the design. For digital circuits, such synthesizable codes are RTLs written in Verilog, VHDL, or other types of hardware description language. The design 170 is also referred to as the device under test (DUT), since the testbench is set up to simulate and test the design 170. The RTLs that describe the design 170 are therefore referred to as the DUT RTLs.

The models 172 are not part of the design and can be written in codes that cannot be synthesized into digital circuits. These models can be written in Verilog, VHDL, System Verilog, but can also be written in common computer programming languages such as C++.

The testbench 160 describes the testing platform for the design 170. It may include both synthesizable code and non-synthesizable code written in hardware description languages such as Verilog, VHDL, and System Verilog. In some embodiments, the testbench is written in language capable of supporting data exchange between programs (such as models written in C++) and synthesizable codes (such as RTLs written in Verilog).

As illustrated, the testbench 160 (including the design 170 and the models 172) is stored as a set of source files 180. The compiler 195 compiles the source files 180 into the compiled design data 181-183. The compiled design data 181-183 are stored in the host storage 130, while the compiled design data 181-182 are also transported to the simulation storage 135. The compiled design files 181-183 include files for the compiled RTLs 181, the compiled models 182, and the compilation residuals 183.

The compiled RTLs 181 is a set of processed data structures that are derived from the synthesizable codes 176. The synthesizable codes of the testbench 160 (including the design 170) includes computational elements and timing elements. Computational elements are units at which computations take place. Timing elements are units at which signals, data, and result of computations are held for over a period of time. In a synthesized digital circuit, timing elements correspond to delays, memories, registers, latches, or clocks, while computational elements correspond to Boolean gates, arithmetic units, or other types of combinational logic elements.

In the compiled RTLs 181, the computational elements are implemented as instructions executable by the simulation accelerator 110 (i.e., as accelerator instructions 141). These instructions of the compiled RTLs emulate or model the behaviors and/or structures of the design 170. These accelerator instructions perform computation operations such as Boolean computations (logic gates such as NAND, NOR, XOR, MUX, etc.), bitwise computations (shift, mask, etc.), arithmetic computations (add, subtract, multiply, divide, etc.), and other types of computation operations that can be performed by the simulation accelerator 110.

The compiled models 182 are executable programs compiled from non-synthesizable codes 178 (such as those written in C++ and some non-synthesizable Verilog syntax). These programs are executable by the simulation processor 120 and the operating system 125 and delivered to the simulation processor 120 as the testbench programs/data 142. Some of the compiled models are implemented as instructions that are executable at the simulation accelerator 110 (i.e., as accelerator instructions 141). These instructions include program flow constructs (such as for-loop, while-loop, branch, and initial block, etc.), data storage operations (such as load, move, copy, delete, etc.), and other types of instructions that can be performed by the simulation accelerator 110.

The compilation residuals 183 are data specified in the testbench 160 that cannot be processed by the simulation accelerator 110 or the simulation processor 120. For example, the testbench 160 may include elements that invoke resources that are not available in the simulation processor 120 or the simulation accelerator 110, such as display related commands or user interface related commands. These commands are part of the residual 183 handled by the host computer 190, which has display resource 192 and user interface resources 191. In some embodiments, some simulation interface codes written in VPI or PLI are also handled by the host computer 190 as part of the compilation residual 183.

Based on the compiled RTLs 181, the compiled models 182, and the residual 183, the simulation system 100 conducts the testing of the design 170 by simulation in coordination with the host computer 190. Specifically, the simulation accelerator 110 performs simulation of the design 170 by executing the accelerator instructions 141 (from the compiled RTLs 181 and/or from the compiled models 182), while the simulation processor 120 uses testbench program/data 142 (from the compiled models 182) to provide stimulus to the simulation accelerator 110 and to capture responses from the simulation accelerator 110.

The simulation processor 120 uses the captured responses to produce further stimulus for the simulation accelerator 110, and/or to generate data that serve as part of the simulation results 185. The simulation result 185 also includes instrumentation data about the design 170 collected from the simulation accelerator 110. The simulation result 185 is stored in the simulation storage 135, and the host computer 190 retrieves the simulation result 185 and presents them to the user (e.g., as part of a design verification program.) The host computer may also perform certain simulation tasks that cannot be performed by the simulation accelerator 110 and the simulation processor 120.

II. Event Driven Simulation

In some embodiments, the simulation accelerator performs event driven simulation when executing instructions compiled from RTLs and testbench models. Event driven simulation is a simulation technique that models the operations of a system as a discrete sequence of events in time. Each event occurs at a particular instant in time and marks a change of state in the system. Between consecutive events, no change in the system is assumed to occur. Thus, the simulation can directly jump in time from one event to the next.

An event driven simulation is one in which events trigger instructions to execute, which in turn generate more events to trigger the execution of more instructions. A pending event is one that is waiting to trigger the execution of an instruction. A pending event may indicate a signal change (e.g., rising or falling edge due to change of polarity) at an input of the instruction, or simply be a command to execute the instruction, with or without signal change.

Figure 2:
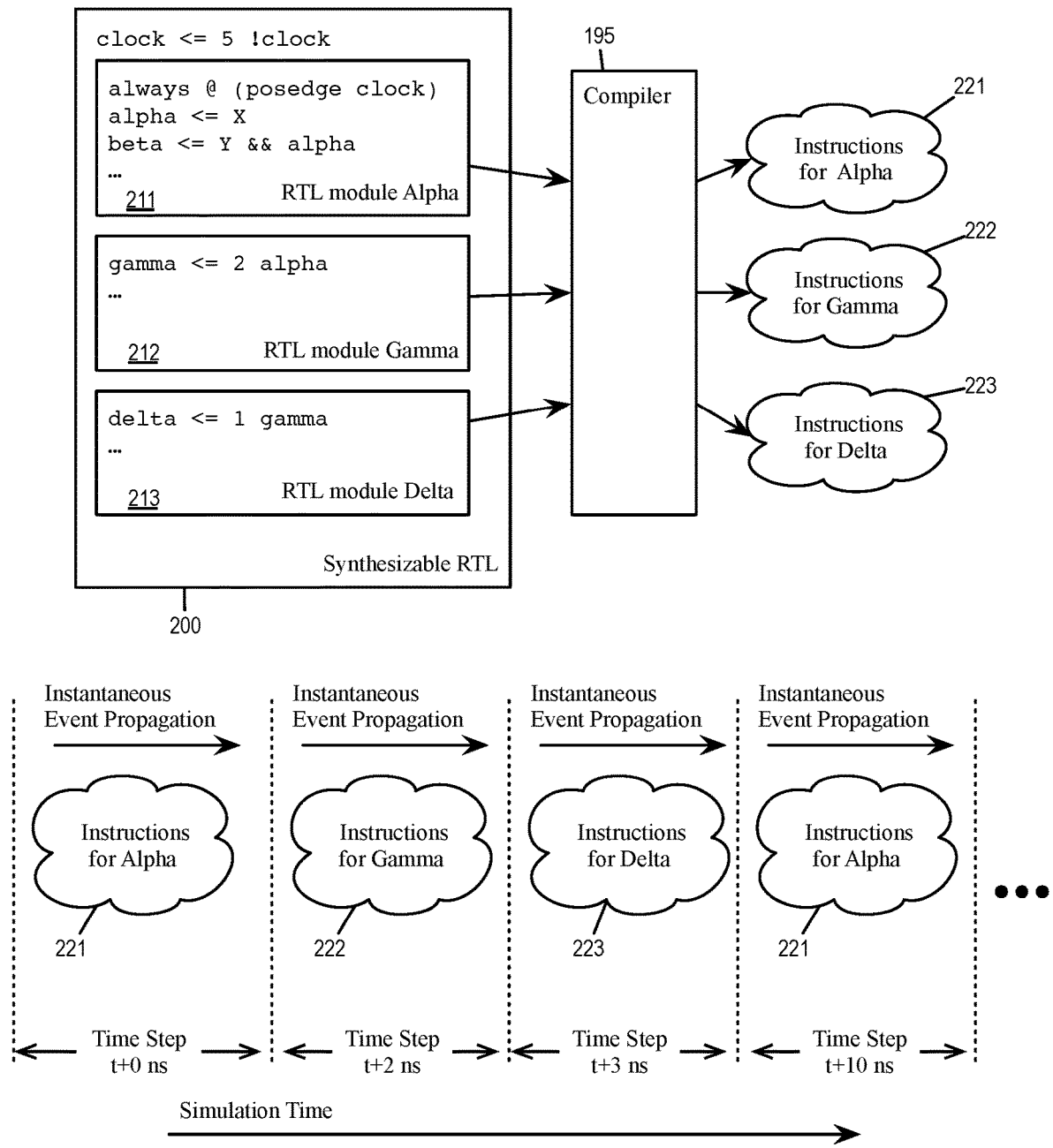
FIG. 2 conceptually illustrates event driven simulation of a RTL.

FIG. 2 conceptually illustrates event driven simulation of a RTL 200. The RTL includes different RTL modules (Alpha, Gamma, and Delta). Each RTL module includes a set of computational elements that are temporally separated from other computational elements. Specifically, the RTL module Alpha includes a set of computational elements 211, the RTL module Gamma includes a set of computational elements 212, and the RTL module Delta includes a set of computational elements 213. Each set of computational elements 211-213 performs computation at its corresponding specified simulation time instants, also referred to as time steps. In the example illustrated, the set of computational elements 211 computes whenever the signal "clock" is at a positive edge, the set of computational elements 212 computes 2 nanoseconds after whenever the signal "alpha" changes value, and the set of computational elements 213 computes 1 nanosecond after whenever the signal gamma changes. (Nanosecond is chosen as the simulation time unit for this example for illustration purposes.)

Computational elements that are separated from other computational elements by timing elements are collectively referred to as a combinational cloud. In an event driven simulation system, an event (e.g., signal change) propagates through the computational elements of a combinational cloud in the same time instant. The sets of computational elements 211-213 can therefore be referred to as combinational clouds 211-213, respectively. Each combinational cloud is compiled into a set of instructions for the accelerator 110.

To simulate the RTL 200 in the simulation system 100, the compiler 195 converts the RTL into sets of computation instructions 221-223 for the simulation accelerator 110. The computation instructions include instructions set 221 performing the operations of the combinational cloud 211, instructions set 222 performing the operations of the combinational cloud 212, and instructions set 223 performing the operations of the combinational cloud 213.

The simulation accelerator 110 is an event driven simulator. When simulation time reaches a particular time step, the accelerator 110 executes the instructions that have pending events for that particular time step. In this example, the simulation accelerator 110 executes the instructions in the set 221 when the simulation time reaches the time step t+0 ns, the instructions in the set 222 when the simulation time reaches the time step t+2 ns, the instructions in the set 223 when the simulation time reaches the time step t+3 ns, the instructions in the set 221 when the simulation time reaches the time step t+10 ns, so on and so forth. The accelerator 110 executes the instructions of each time step as if events propagate through the computational elements of the time step without elapsing any simulation time. It can also be said that, at each time step, the accelerator 110 executes all instructions having pending events scheduled for that time step.

A set of instructions that are scheduled to always execute at the same simulation time step(s) is referred to as an instruction cloud. The sets of instructions 221-223 can therefore be referred to as instruction clouds 221-223, respectively. An instruction cloud can include instructions from the compiled RTLs 181 that perform the operations of the computation elements in a combinational cloud (such as combinational clouds 211-213). An instruction cloud can also include instructions from the compiled models 182 that perform the operations of the non-synthesizable testbench components. For some embodiments, an instruction cloud includes logic operations belong to a same clock domain, i.e., instructions that are triggered to execute by the rising and/or falling events of a same clock.

Figure 3A:
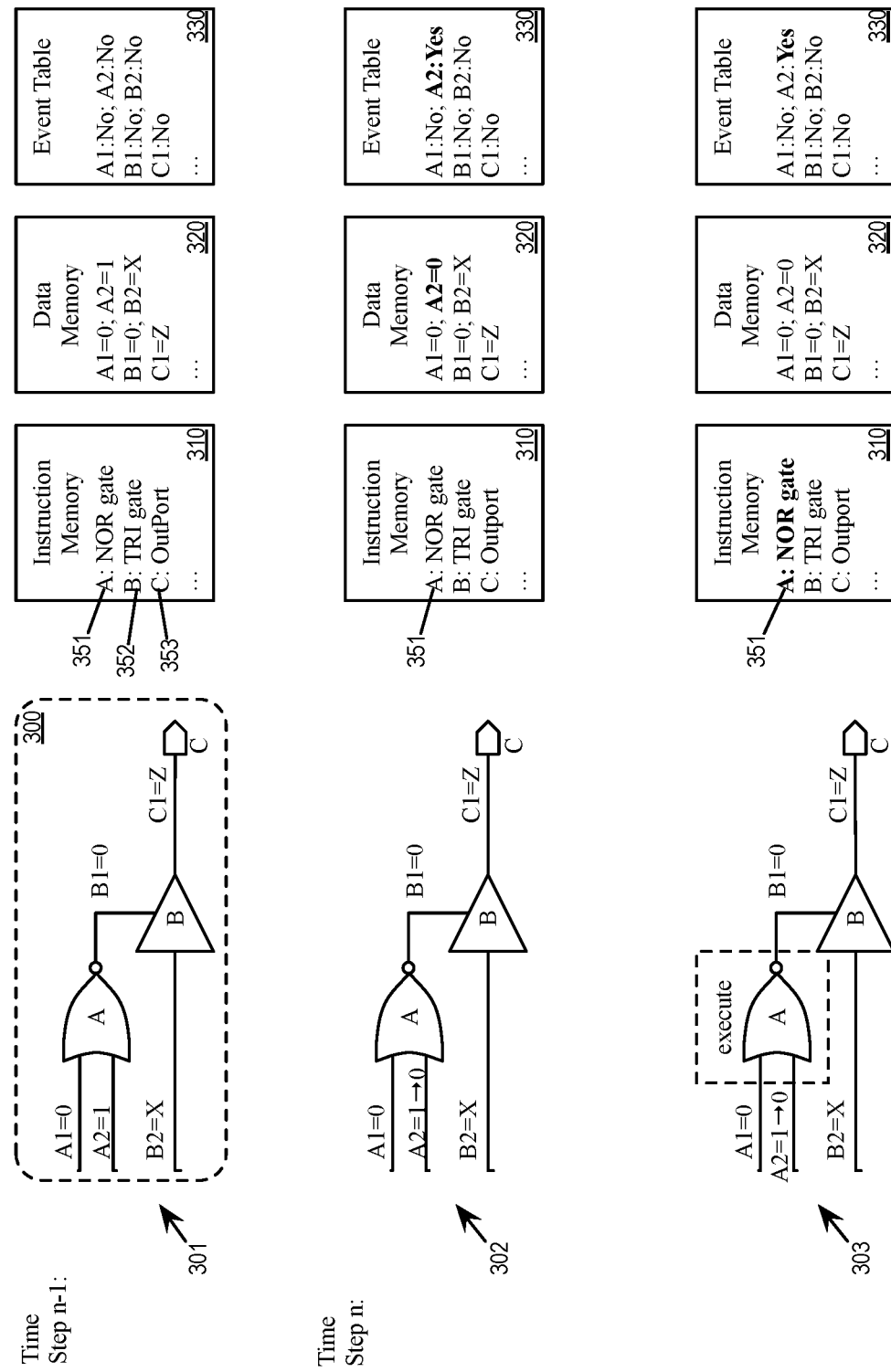
FIGS. 3a-b illustrates the execution of instructions by the simulation accelerator when simulating RTLs.
Figure 3B:
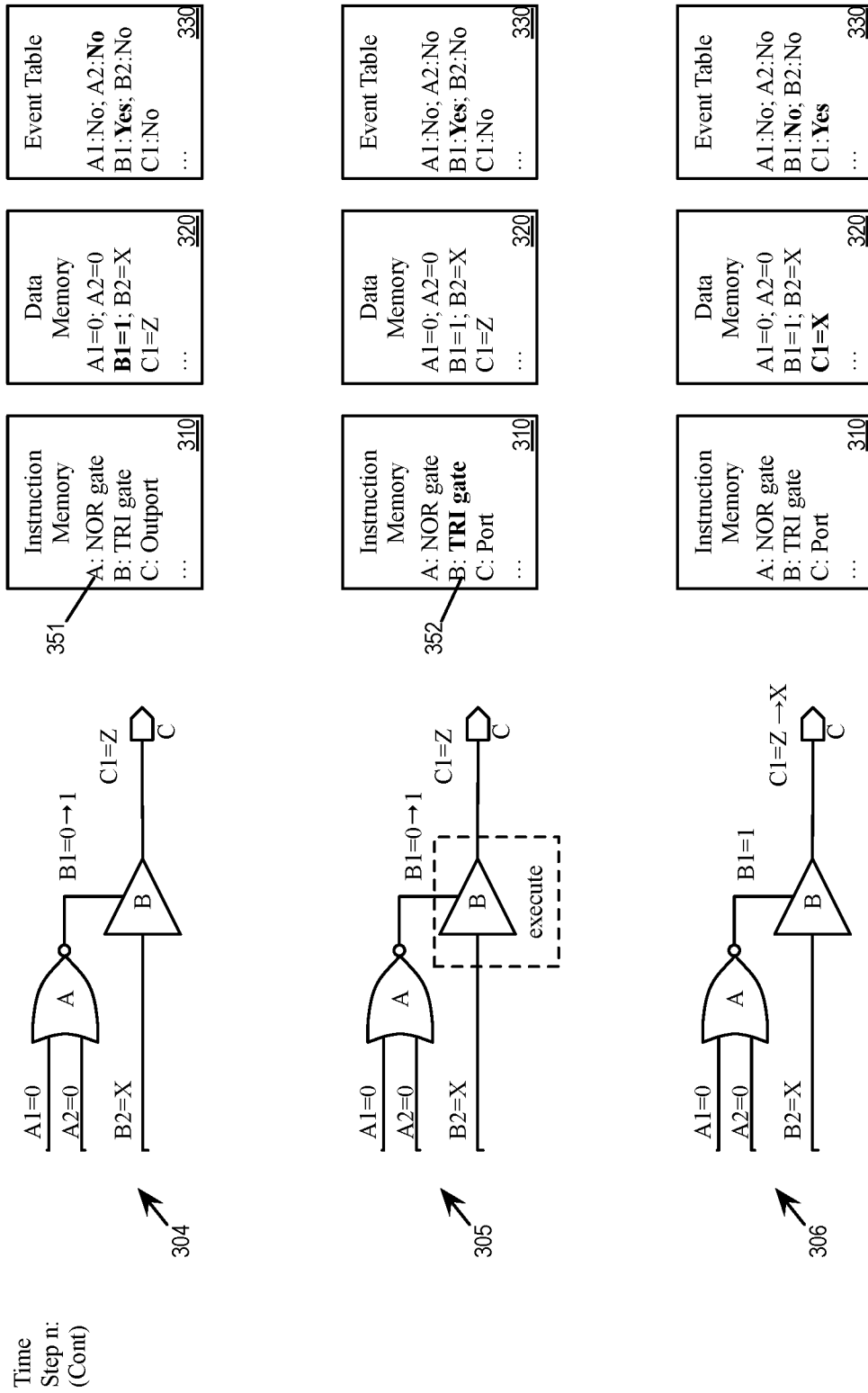

FIGS. 3a-b illustrates the execution of instructions by the simulation accelerator when simulating RTLs. The figures show the simulation of an example design of a digital circuit 300, which includes a NOR gate "A", a tri-state buffer "B", and an output port "C". The NOR gate "A" has two inputs "A1" and "A2". The tri-state buffer "B" has two inputs "B1" and "B2". The input "B1" is connected to the output of the NOR gate "A". The input "B1" is the tri-state control of the tri-state buffer "B". When the input B1 is high, the input "B2" is allowed to reach the output port "C". When the input B1 is low, the tri-state buffer "B" is tri-stated and the port "C" is also tri-stated.

The accelerator 110 uses several data structures when performing simulation. These data structures include an instruction memory 310, a data memory 320, and an event table 330. The compiler 195 compiles the RTL of the circuit 300 into instructions that can be executed by the accelerator 110, and the accelerator 110 stores the instructions in the instruction memory 310. Each instruction has a corresponding set of input data (i.e., the signal value currently sitting at the input of the instruction), and the accelerator stores the input data of each instruction at a corresponding location in the data memory 320 for each instruction. The accelerator 110 would execute an instruction only when at least one of the instruction's input data has changed (i.e., there is a pending event at an input of the instruction, or a pending input event). The accelerator uses the event table 330 to keep track of which instructions have pending input events and to identify which instructions need to be executed.

FIGS. 3a-b illustrate the accelerator performing the simulation of the digital circuit 300 by using the instruction memory 310, the data memory 320, and the event table 330 in six stages 301-306. The accelerator 110 has already loaded the instruction memory with the compiled instructions that corresponds to the components of the digital circuit 300, including an instruction 351 for performing the operations of the NOR gate "A", an instruction 352 for performing the operations of the tri-state buffer "B", and an instruction 353 for performing the operations of the output port "C".

At the first stage 301, the simulation is at time step n−1. According to the content of the data memory 320, the inputs "A1" and "A2" of the instruction 351 are respectively at '0' and '1', the inputs B1 and B2 of the instruction 352 are respectively at '0' and 'X' (unknown), and the input "C1" of the instruction 353 is at Z (tri-stated). According to the event table 330, there is no pending event at any of the inputs to the instructions 351-353. This reflect the fact that the output of the NOR gate "A" and the output of the tri-state buffer "B" are both up-to-date with respect to their inputs, and there is no need to execute the instructions 351-353.

It is worth noting that, the simulation accelerator 110 is based on computation of instructions where the propagation of signals is expressed as values stored in memories. It is therefore capable of expressing signal values using 4-state logic, i.e., '1', '0', 'X', and 'Z'. This is unlike hardware emulators, where the signals can only be either '1' or '0' because they are carried by actual physical wires. Furthermore, in some embodiments, instructions can handle inputs and outputs that are of complex data types, not merely bit values.

At the second stage 302, the simulation has progressed to time step n. According to the event table 330, there is a pending event at the A2 input of the instruction 351 (NOR gate "A"). According to the data memory 310, the value at the A2 input has changed from '1' to '0'. The simulation accelerator 110 has not executed the instruction 351, the output of the NOR gate therefore remain the same as before (still at '0'), which is out of date.

At the third stage 303, the simulation is still at time step n. However, based on the content of the event table 330, the accelerator 110 selects the instruction 351 for execution because it has pending input event at its input A2.

At the fourth stage 304, the simulation remains at time step n. The execution of the instruction 351 has produced a new output value '1', which causes the input data of B1 of the instruction 352 (tri-state buffer "B") to change from '0' to '1' in the data memory 320. At the event table 330, the execution of the instruction 351 clears the pending input event at A2 and set a new pending input event at the B1. The output of the tri-state buffer "B" however remains at 'Z', which is out of date.

At the fifth stage 305, the simulation remains at time step n. Based on the content of the event table 330, the accelerator 110 selects the instruction 352 (tri-state buffer "B") for execution because it has pending input event at its input B1.

At the sixth stage 306, the simulation remains at time step n. The execution of the instruction 352 has caused the tri-state buffer "B" to open, which allows the input data at B2 to reach the output of the buffer and change the output of the tri-state buffer. Since the B2 input is 'X' (unknown), the output of the tri-state buffer "B" also becomes 'X'. The output of the tri-state buffer "B" fan-out to the output port "C", changing the value of the input C1 to 'X'. At the event table 330, the execution of the instruction 352 clears the pending input event at B1 and set a new pending event at the C1.

III. Simulation Accelerator

A. Architecture

As mentioned, the simulation system 100 includes a simulation accelerator 110 that uses parallel processing to accelerate the simulation of RTLs while minimizing memory access latency. In some embodiments, the accelerator has an array of parallel computing resources. The simulation accelerator receives a processed (i.e., compiled) version of the design in which the components of the design are mapped to instructions for the parallel computing resources. The instructions in the processed version of the design are divided into groups, in which instructions belonging to a same group are logically independent of each other. The simulation accelerator fetches instructions and data for processing by the parallel computing resources for one group of instructions at a time. Since all instructions thusly fetched are logically independent of each other, the parallel computing resources are free to execute the instructions of a group in parallel and/or in any arbitrary order. In addition, since no instruction has to wait for the completion of another instruction before being fetched or executed, the simulation accelerator can retrieve a block of instructions in a burst or streaming manner. This minimizes the effect of memory access latency during RTL simulation.

Figure 4:
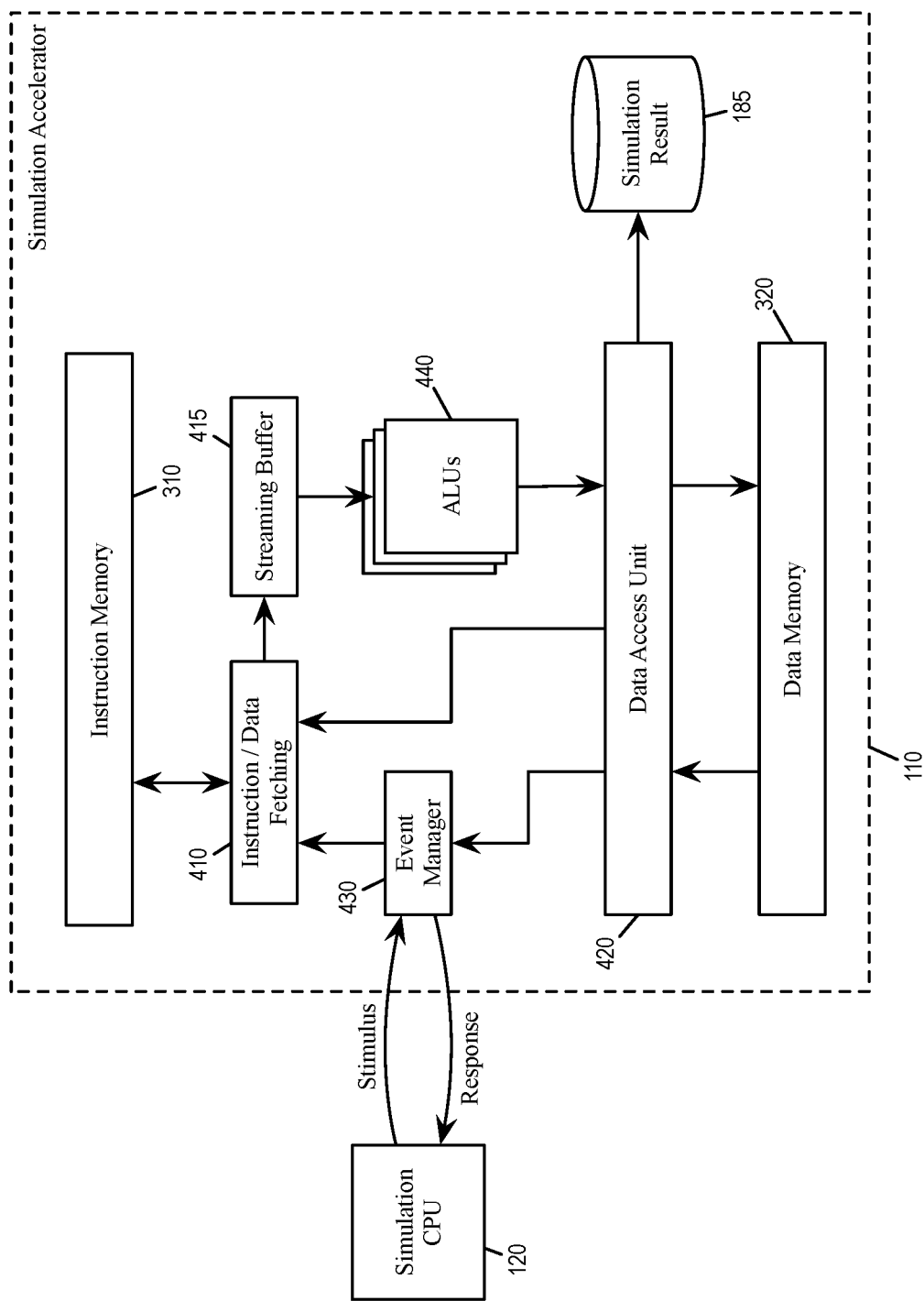
FIG. 4 illustrates a block diagram of the simulation accelerator for some embodiments.

FIG. 4 illustrates a block diagram of the simulation accelerator 110 for some embodiments. As illustrated, the accelerator includes the instruction memory 310, the data memory 320, along with an instruction data fetching unit 410, a streaming buffer 415, a data access unit 420, an event manager 430, and an array of arithmetic logic units (ALUs) 440. In some embodiments in which the simulation accelerator is implemented as digital hardware such as an integrated circuit (IC), these various blocks or modules are implemented by sets of digital circuits. In some embodiments in which the simulation accelerator 110 is implemented as software or firmware being executed by one or more processing units (e.g., processors), these various blocks or modules are implemented as software modules or sets of instructions.

The compiled instructions are stored at the instruction memory 310 and the inputs to the instructions are stored in the data memory 320. The Instruction/Data fetching unit 410 fetches the instructions and their corresponding input data from those memory structures and stores the fetched instruction and data in the streaming buffer 415. The streaming buffer 415 is a buffer between the fetching of instructions from the instruction memory and the execution of the instructions by the array of ALUs 440. Each ALU in the array 440 is an arithmetic and/or logical processing units that executes instructions based on the input data to produce output data. Each instruction stored in the streaming buffer is received and executed by only one ALU, and each ALU executes each received instruction independently of other ALUs. The data access unit 420 receives the output values computed by the ALUs 440 and stores them in the data memory 320 to serve as input data for other instructions. The data access unit 420 also stores the computed output values as simulation result 185 (to be stored in the simulation storage 135 and reported to the host computer 190).

The event manager 430 maintains the event table 330. It reports the content of the event table 330 to the instruction/data fetching unit 410 so it is able to identify instructions having pending input event and decides which instruction to fetch. It also updates the content of the event table 330 by observing, from the data access unit 420, which instructions are being executed and which inputs of which instructions are being updated as the result. The event manager 430 also maintains an event time wheel storage (or event wheel) that stores pending input events for future time steps. The event manager, the event table, and the event time wheel storage will be further descried below in Section III.

Figure 5:
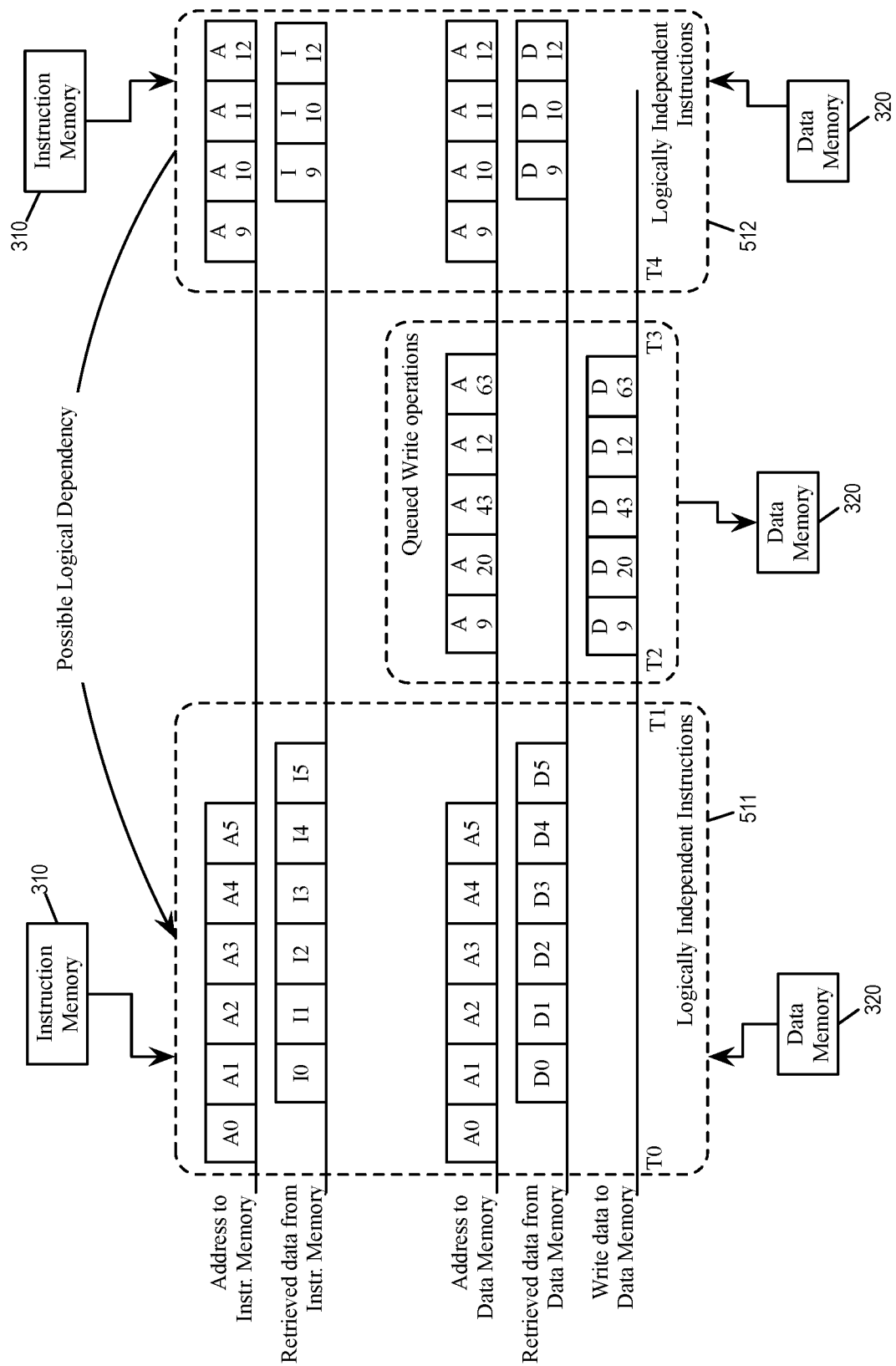
FIG. 5 illustrates the fetching of instruction and data in the simulation accelerator.

As mentioned, the received instructions are organized into groups, where instructions in a same group are logically independent of each other. The instruction/data fetching unit 410 retrieves instructions from one group at a time, and the ALUs receives and executes instructions from the same group before receiving and executing instructions from the next group. FIG. 5 illustrates the fetching of instruction and data in the simulation accelerator 110.

The figure illustrates a time line at the instruction memory 310 and at the data memory 320. Between time T0 and T1, the instruction/data fetching unit 410 is fetching instructions and data for an instruction group 511. The group 511 includes instructions I0 through I5 (with corresponding input data D0 through D5). Since I0 through I5 are instructions that are logically independent of each other, the instruction/data fetching unit 410 would never have to wait for one instruction to complete before deciding which instruction to fetch next. Consequently, the instructions of the group 511 can be retrieved in a burst fashion, thereby minimizing memory access latency.

Between the time T2 and T3, the data access unit 410 is writing the output data of the instructions in the group 511 (instructions I0-I5) to the data memory 320. The output data are written into the data memory 320 to serve as input data for other instructions. Since the instructions in the group 511 are logically independent of each other, their output data is always for instructions of other groups and can never possibly become input data of the instructions in the group 511. The write operation of an output data may therefore occur as soon as the instruction that produces the output data is executed (i.e., T2 may occur before T1). The write operation of the output data may also be delayed (i.e., queued) until there is an opportunity to write the output data into the data memory 320. The logical independence of instructions within a same group facilitates timing flexibility in the write operations, which further reduces memory access latency.

After time T4 (and after the ALUs finish executing the instructions in the group 511), the instruction/data fetching unit 410 fetches instructions and data for another instruction group 512. The instructions in the group 512 are logically independent of each other, but they maybe logically dependent upon the instructions in the group 511. The execution of the group 512 therefore starts only after update to input data has completed. In some embodiments, the accelerator would not execute a group of instructions until all write operations to the data memory 320 have completed. Since the fetching of the instructions in the group 512 occur only after the ALUs in the array 440 have completed executing the instructions of the previous group 511, it is assured that the ALUs are receiving and executing instructions from the same group. The ALUs in the array 440 can therefore execute fetched instructions in parallel since the instructions being executed by the different ALUs are logically independent of each other.

The simulation accelerator 110 therefore accelerates the simulation of RTLs in several ways. By processing the compiled instructions as groups, the array of ALUs can fully function as parallel computing resources to accelerate the simulation of the DUT RTL. The logical independence of the instructions in each group also allows the simulation accelerator 110 to minimize memory access latency by burst mode. The memory access latency is further reduced in comparison to general-purpose computer (such as the host computer) because the fetching of the instructions and data does not go through layers of caching structure. In some embodiments, the ALUs not only perform instructions in parallel, they also supports an instruction set that is tailored toward RTL simulation. Such an instruction set in some embodiments includes instructions that match Verilog commands or constructs, which are not available in general purpose processors (CPUs). A single instruction for the simulation accelerator can encompass a sequence of x86 instructions while also handling either two-state or four-state logic.

B. Group Sort

The simulation accelerator is able to execute the instructions of the compiled RTLs in parallel. This is because the instructions of the compiled RTLs are sorted into groups, each group having instructions that are logically independent of each other. More generally, the simulation receives instructions that are sorted into groups so that the simulation accelerator can execute the instructions in parallel. These instructions can come from the compiled RTLs and/or the compiled models.

Figure 6:
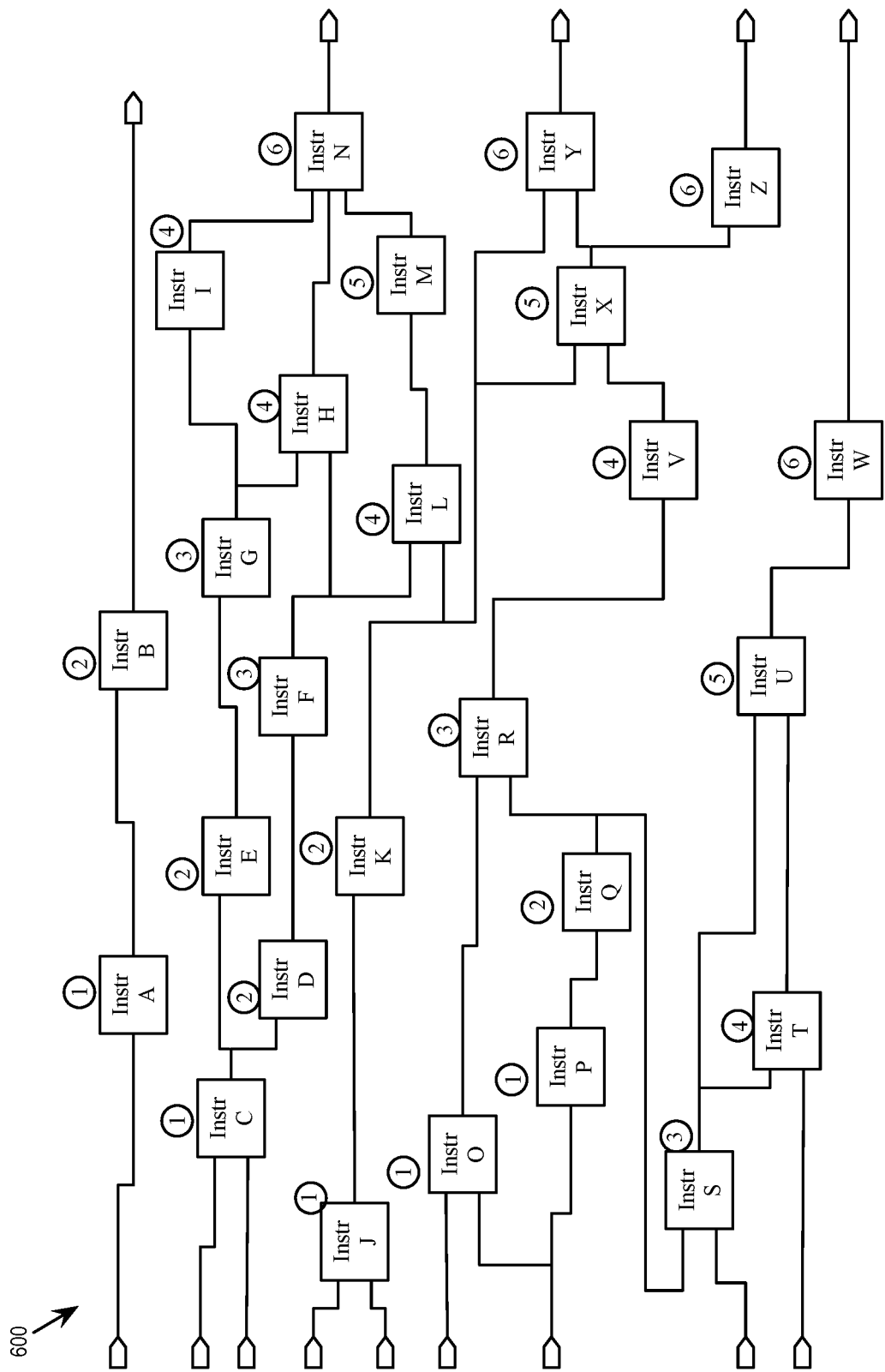
FIG. 6 conceptually the sorting of instruction in an instruction cloud into groups.

FIG. 6 conceptually illustrates the sorting of instructions in an instruction cloud into groups. The figure illustrates an instruction cloud 600. The instructions of the instruction cloud 600 are scheduled to execute at the same time step(s) during event driven simulations by the simulation accelerator 110. The instructions cloud 600 may include instructions that correspond to computational elements in a combination cloud of a compiled RTL. The instructions cloud 600 may also include instructions that correspond to non-synthesizable constructs of the testbench (i.e., from the compiled models of the testbench.)

As illustrated, the instruction cloud 600 includes 26 instructions, labeled A through Z. Each solid line connecting the output of a particular instruction to one or more inputs of other instructions represent the fan-out or propagation of output data from the particular instruction to the other instructions. For example, the output of the instruction Q is connected to inputs of instructions R and S, so the output of the instruction Q fans out to instructions R and S. A particular instruction is said to be logically dependent on another instruction if a change at the output of the other instruction affect an input of the particular instruction. For example, the instruction L receives inputs from the outputs of instructions F and K, so the instruction L is logically dependent on instructions F and K. Furthermore, since instruction F receives an input from the output of instruction D and instruction D receives an input from instruction C, instruction L is also logically dependent on instructions D and C. It is worth noting that two instructions are considered logically independent of each other as long as they do not affect each other's input during the same time step. Whether the output of one instruction affects the input of another instruction at a future time step is irrelevant to the determination of logical dependencies.

According to the logical dependencies of the instruction cloud 600, the compiler sorts the instructions of the instruction cloud 600 into six groups 1 through 6 (each instruction is labeled with its group number.) Group 1 includes instructions A, C, J, O, and P. Group 2 includes B, D, E, K, and Q. Group 3 includes F, G, R, and S. Group 4 includes H, I, L, T, and V. Group 5 includes instructions M, U, and X. Group 6 includes instructions N, W, Y, and Z. As illustrated, within each group, the instructions are logically independent of each other, i.e., no instruction depends on another instruction of the same group for its input (directly or indirectly). For example, the group 2 has five instructions B, D, E, K, and Q. These five instructions are logically independent of each other. A change at the output of instruction B would not affect the inputs of D, E, K, and Q, and a change at the output of instruction D would not affect the inputs of instructions B, E, K, and Q, so on and so forth. It is worth noting that each group of instructions may include both instructions implementing computational elements in RTLs and instructions implementing non-synthesizable testbench components.

In some embodiments, the compiler 195 performs group sort on instructions of an instruction cloud by (1) identifying instructions that depend only on input ports of the instruction cloud as the initial group, (2) identifying instructions that depend only on input ports or outputs of the first group as the second group, (3), identifying instructions that depend only on the input ports or the outputs of the first or second groups as the third group, and so on and so forth. In other words, the compiler (at the group-sort stage) identifies each successive group by identifying instructions that depend only on input ports of the instruction cloud or outputs of instructions already identified as belonging to previously identified group(s). In the example of FIG. 6, the group sort start from instructions A, C, J, O, P, as these are the instructions that depend on only the input ports of the instruction cloud 600, while other instructions have at least one input that depend on other instructions of the instruction cloud 600.

Figure 7:
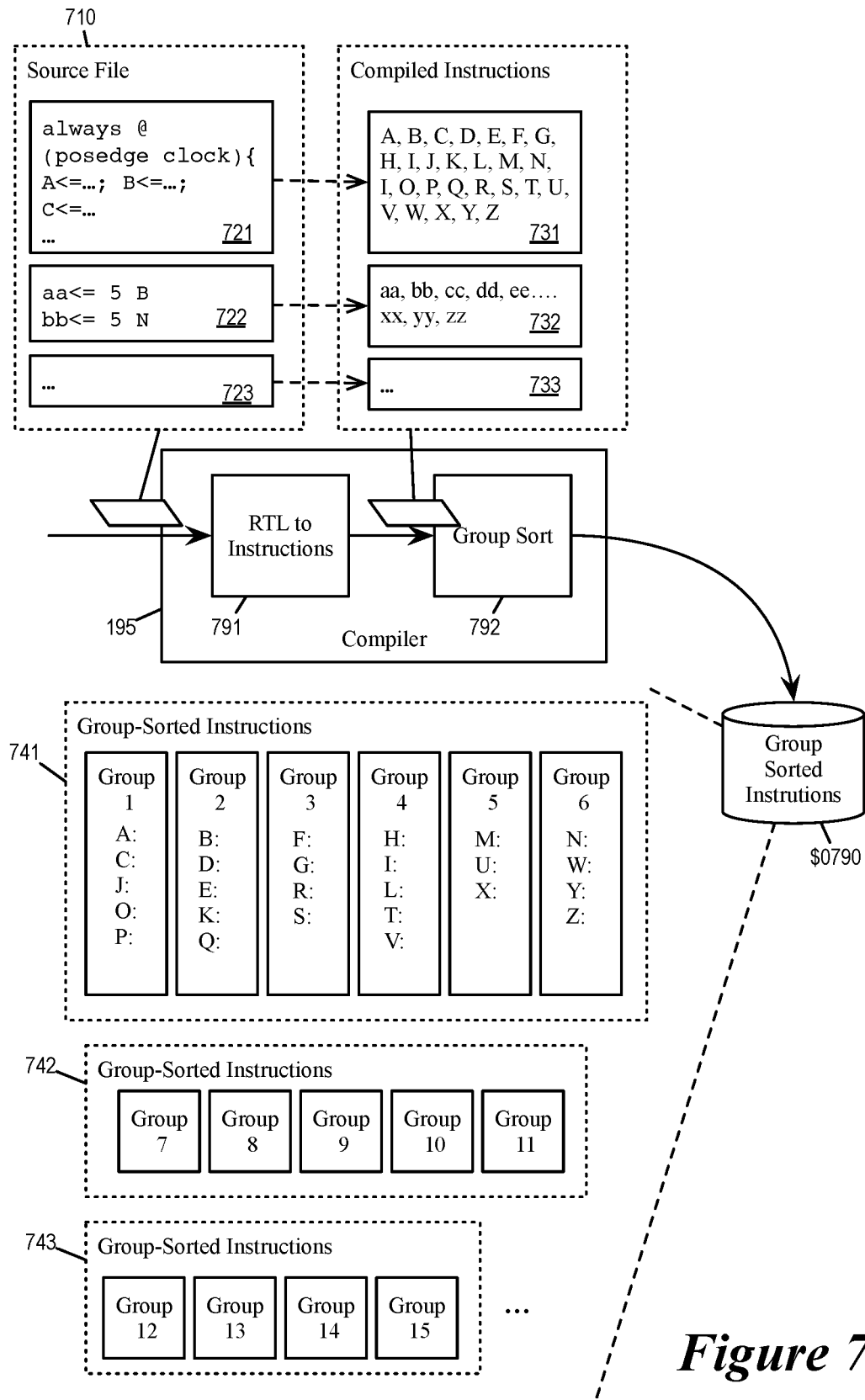
FIG. 7 conceptually illustrates the compiling of RTLs into sorted groups of instructions.

FIG. 7 conceptually illustrates the compiling of RTLs into sorted groups of instructions 790. The figure illustrates the compiler 195 compiling a source file 710 containing a testbench to be simulated. The source file 700 contains RTLs. The RTLs include different modules that may be active at different time steps, including RTL modules 721, 722, and 723. RTL modules 721, 722, and 723 correspond to different sets of computational elements (or combinational clouds) that are temporally separated by timing elements such as delays, memories, registers, latches, or clocks.

As illustrated, the compiler 195 includes two stages: an RTL-to-instructions stage 791 and a group sort stage 792. The RTL-to-instructions stage 791 is for compiling the RTLs from their original hardware description language coding (e.g., Verilog) into instructions that are executable by the simulation accelerator 110, with computational elements of combination clouds (and some testbench models) compiled into instructions of instruction clouds. In some embodiments, the RTL-to-instruction stage 791 performs Boolean optimization when converting RTL code into simulation accelerator instructions. The group sort stage 792 is for sorting the compiled instructions of each instruction cloud into groups, where instructions in each group are logically independent of each other as described above by reference to FIG. 6.

The RTL-to-instruction stage 791 compiles the RTL module 721 into a set of instructions 731, the RTL module 722 into a set of instructions 732, and the RTL module 723 into a set of instructions 733. The set of instructions 731 has the same instructions as the instruction cloud 600 of FIG. 6 (i.e., instructions A through Z). The group sort stage 792 performs group sort on the instruction sets 731, 732, and 733 separately as they belong to different instruction clouds that may be active in different time steps, i.e., instructions belonging to different instruction clouds are sorted into groups belonging to different instruction clouds. The instructions in the set 731 are sorted into groups of instructions 741 that include the groups 1, 2, 3, 4, 5, and 6 as illustrated in FIG. 6. The instructions in the set 732 are sorted into groups of instructions 742 that include groups 7, 8, 9, 10, and 11. The instructions in the set 732 are sorted into groups of instructions 743 that include groups 12, 13, 14, and 15. The sorted instructions 741, 742, and 743 are exported as the group-sorted instructions 790 of the source file 710.

Figure 8:
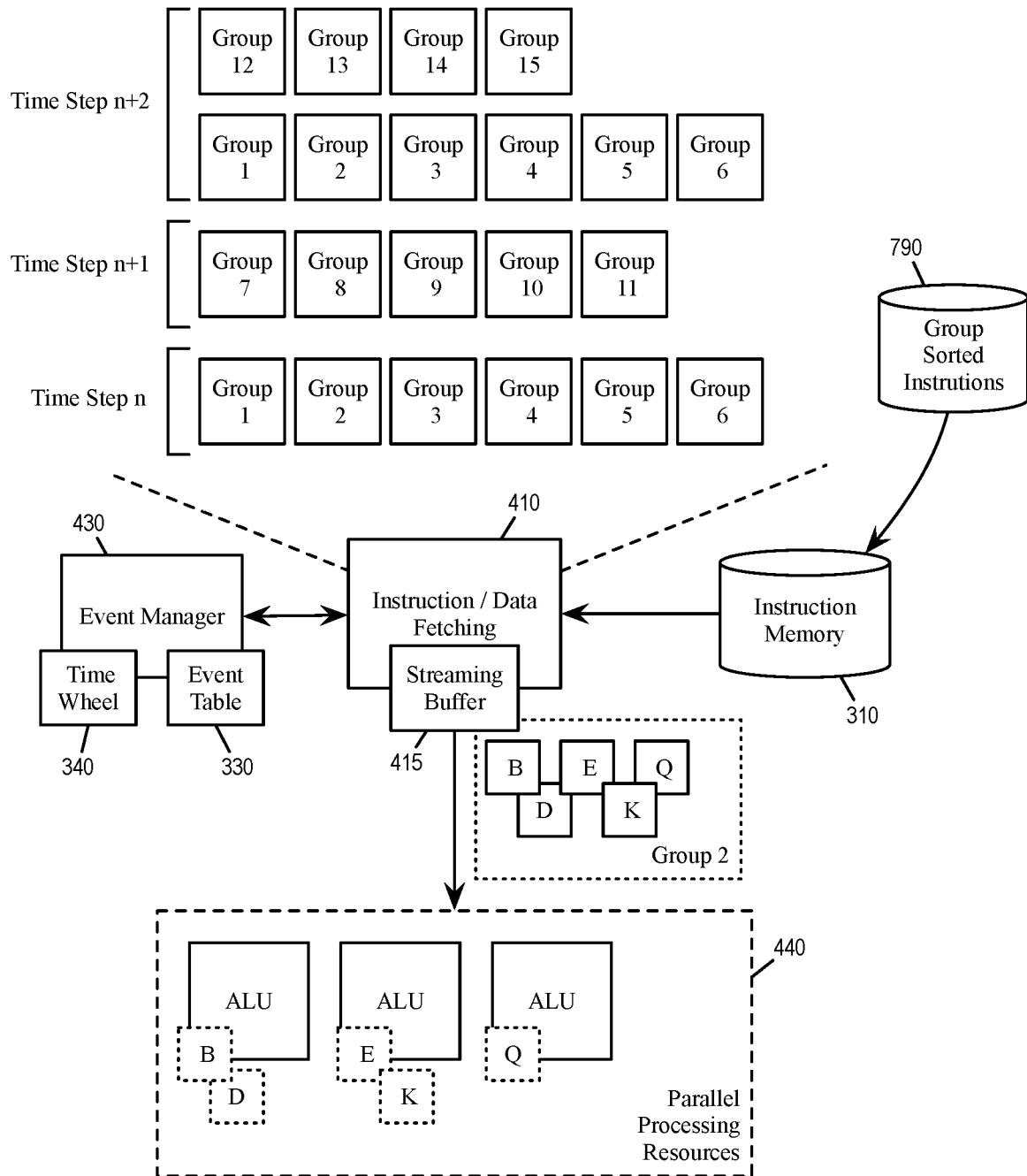
FIG. 8 conceptually illustrates simulation accelerator executing instructions that have been group-sorted.

FIG. 8 conceptually illustrates simulation accelerator executing instructions that have been group-sorted. Specifically, the figure illustrates how group-sorted instructions enables parallel processing when performing the RTL simulation at the simulation accelerator 110.

The figure illustrates the ALUs 440 of the simulation accelerator 110 receiving and executing instructions that have been group-sorted. The instruction fetching mechanism of the accelerator 110 (i.e., the instruction/data fetching unit 410 and the streaming buffer 415) retrieves data from the instruction memory 310, which stores the group-sorted instructions 790 produced by the compiler 195. For each time step, the instruction/data fetching unit fetches the groups that have pending events in that time step for execution. As illustrated, for the time step n, the instruction/data fetching unit 410 fetches groups 1 through 6 because they have pending events at time step n. For the time step n+1, the instruction/data fetching unit 410 fetches groups 7 through 11 because they have pending events at time step n+1. For time step n+2, the instruction/data fetching unit 410 fetches groups 1-6 as well as groups 12-15. Groups 12-15 belong to a different instruction cloud as groups 1-6, but they all have pending events at time step n+2.

The ALUs 440 executes the fetched instructions group by group. As an example, the figure illustrates the ALUs 440 executing instructions of group 2 of the instruction cloud 600. Group 2 includes five instructions B, D, E, K, and Q. Since these instructions belong to the same group and are logically independent of each other, they can be executed in any order by any of the ALUs 440. The ALUs execute the instructions in parallel, and each of the ALUs in the array 440 executes a different subset of the instructions in the group. As illustrated, the ALU 441 executes instructions B and D, the ALU 442 executes instructions E and K, and the ALU 443 executes the instruction Q.

Different embodiments employ different methods of assigning instructions to ALUs. In some embodiment, each ALU executes an instruction from the streaming buffer as soon as it is free to execute a next instruction. In some embodiments, a load balancing mechanism distributes the instructions to the ALUs in the array 440 to balance workload between the different ALUs. Such load balancing can be random, based on a hash, round robin, or other types of mechanisms. In some embodiments, the ALU assignment of the instructions is determined by the compiler 195, and that the streaming buffer sends each instruction to its corresponding ALU based on the predetermined assignment. In some of these embodiments, the assignment of instructions to ALUs is based on the complexity of instructions or expected execution time of instructions. Each ALU is assigned a different mix of instructions such that the different ALUs are expected to finish their assigned instructions around the same time.

In some embodiments, in order to save cost and increase memory data density, the simulation accelerator 110 employs dynamic random access memories (DRAMs) as the instruction memory 310 and the data memory 320. DRAMs are organized into pages. In some embodiments, the DRAMs are physical devices external to the IC that implements the simulation accelerator 110.

To read a data bit stored in particular DRAM page requires accessing of that page, which takes time and subjected to significant memory access latency. However, once the DRAM page is accessed, each subsequent access for data in that page requires far less time and subject to far less memory access latency. In order to minimize memory access latency for retrieving instruction or data, the simulation accelerator in some embodiments stores instructions belonging to a same group in a same page of a DRAM.

Figure 9:
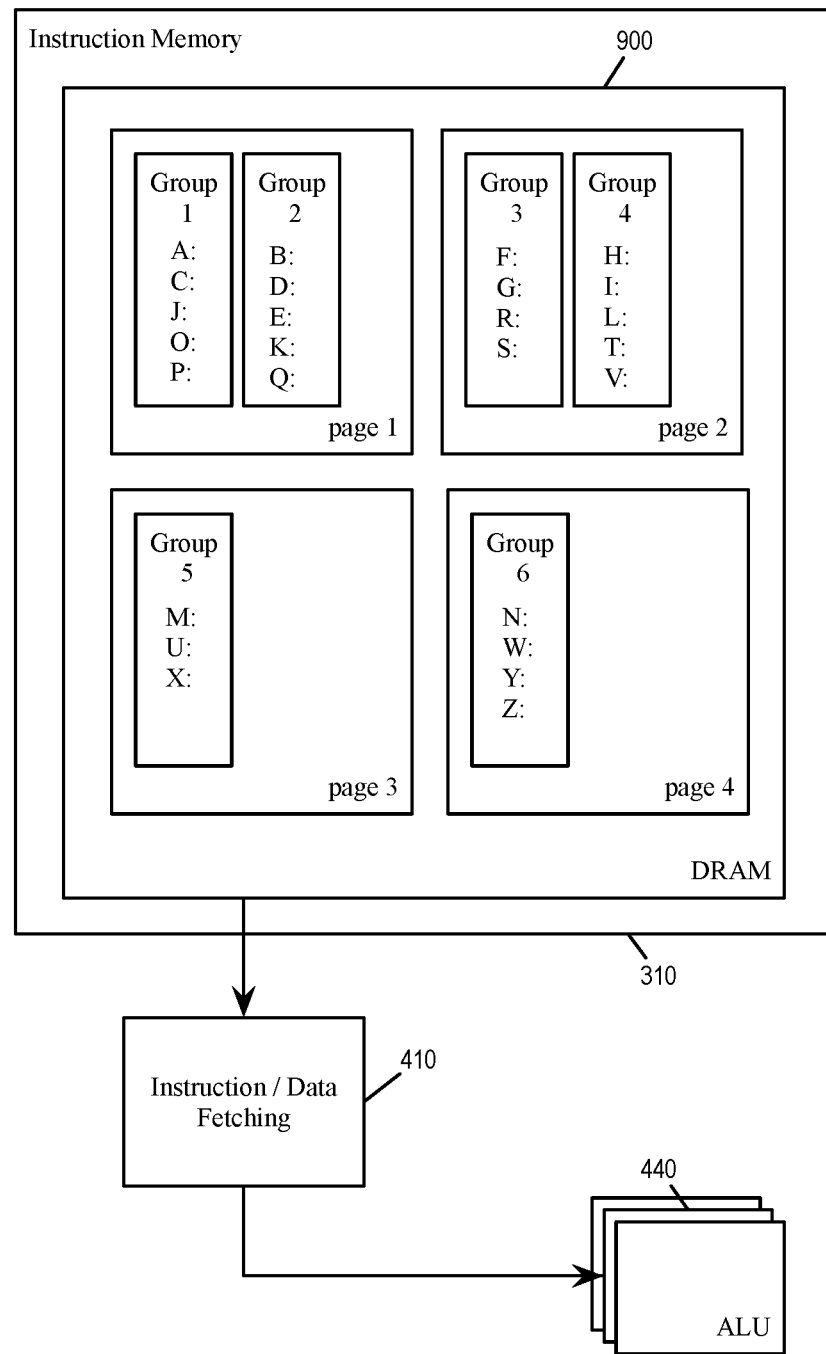
FIG. 9 illustrates storing group-sorted instructions in a DRAM in which instructions belonging to the same group are stored in a same page in order to reduce memory access latency.

FIG. 9 illustrates storing group-sorted instructions in a DRAM in which instructions belonging to the same group are stored in a same page in order to reduce memory access latency. The figure illustrates the instruction memory 310 implemented in a DRAM 900. The DRAM has at least four pages 911-914. The groups 1-6 of the instruction cloud 600 are stored in the four pages 911-914. The instructions of each group are confined to one page, though a page may store instructions belonging to multiple different groups. As illustrated, all instructions of group 1 (A, C, J, O, and P) are in page 1. All instructions of group 2 (B, D, E, K, Q) are also in page 1. All instructions of group 3 (F, G, R, and S) are in page 2. All instructions of group 4 (H, I, L, T, V) are in page 2. All instructions of group 5 (M, U, and X) are in page 3. All instructions of group 6 (N, W, Y, and Z) are in page 4. Thus, when the instruction/data fetching unit 410 fetches instructions of a group for execution at the ALUs 440, the retrieval of the instructions can stay in the same page. This minimizes memory access latency.

Figure 10:
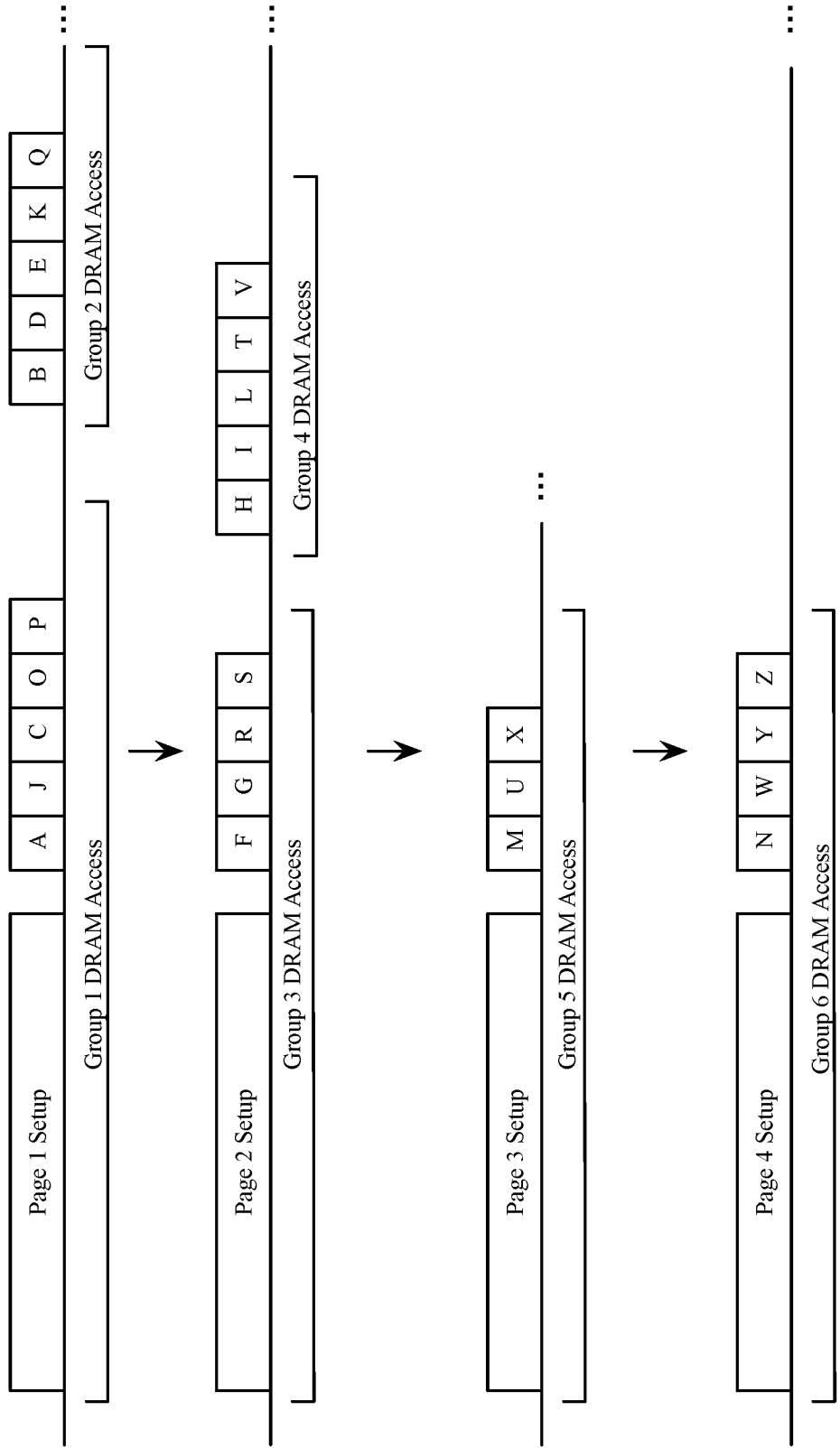
FIG. 10 illustrates the fetching of group-sorted instructions from a DRAM that stores instructions belonging to each group in one DRAM page.

FIG. 10 illustrates the fetching of group-sorted instructions from a DRAM that stores instructions belonging to each group in one DRAM page. The figure illustrates the fetching of the group-sorted instructions of the instruction cloud 600. The figure shows a time line for fetching instructions belonging to groups 1, 2, 3, 4, 5, and 6.

The instruction/data fetching unit starts by fetching instructions of group 1. Since the instructions of group 1 are all in page 1, the instruction/data fetching unit can retrieve all instructions of group 1 (A, J, C, O, P) by performing setup for accessing page 1 once (e.g., by pre-charging page 1 and setting row address). The instruction/data fetching unit then retrieve the instructions of group 2 (B, D, E, K, Q). Since the instructions of group 2 are also stored at page 1, the instruction/data fetching unit retrieves the instructions of group 2 without performing page setup.

The instruction/data fetching unit then fetches the instructions of group 3 (F, G, R, S). Since instructions of group 3 are not in page 1 but on page 2, the instruction/data fetching unit has to wait for page 2 to be setup/accessed before proceeding to retrieve the instructions of group 3. The instruction/data fetching unit then retrieve the instructions of group 4 (H, I, L, T, V) without performing page setup since group 4 instructions also reside in page 2.

The instruction/data fetching unit then fetches the instructions of group 5 (M, U, X). Since the instructions of group 5 are not in page 2 but on page 3, the instruction/data fetching unit has to wait for page 3 to be setup/accessed before proceeding to retrieve the instructions of group 5. The instruction/data fetching unit then fetches the instructions of group 6 (N, W, Y, Z). Since the instructions of group 6 are not in page 3 but on page 4, the instruction/data fetching unit has to wait for page 4 to be setup/accessed before proceeding to retrieve the instructions of group 6.

The instruction memory 310 is illustrated in FIG. 9 as being accessible to all ALUs in the array 440 so that any instruction stored in the instruction memory can be executed by any of the ALUs. However, when there is sufficiently large number of ALUs in the parallel processing array, it can be difficult to physically route data from the instruction memory to the ALUs. In some embodiments, the instruction memory 310 is divided into multiple channels, each channel serving one ALU in the array of ALUs 440. Since instructions belonging to the same group are logically independent of each other, instructions assigned to different channels of memories and ALUs can be safely executed in parallel.

In some embodiments in which the instruction memories are implemented by DRAMs, the data memories are also implemented by DRAMs, and that the input to each instruction is stored in a DRAM page of the data memory that corresponds to a DRAM page in the instruction memory that stores the instruction. In some embodiments in which the instructions are stored at instruction memories of different physical channels, the inputs to the instructions are correspondingly stored at data memories of different physical channels.

Figure 11:
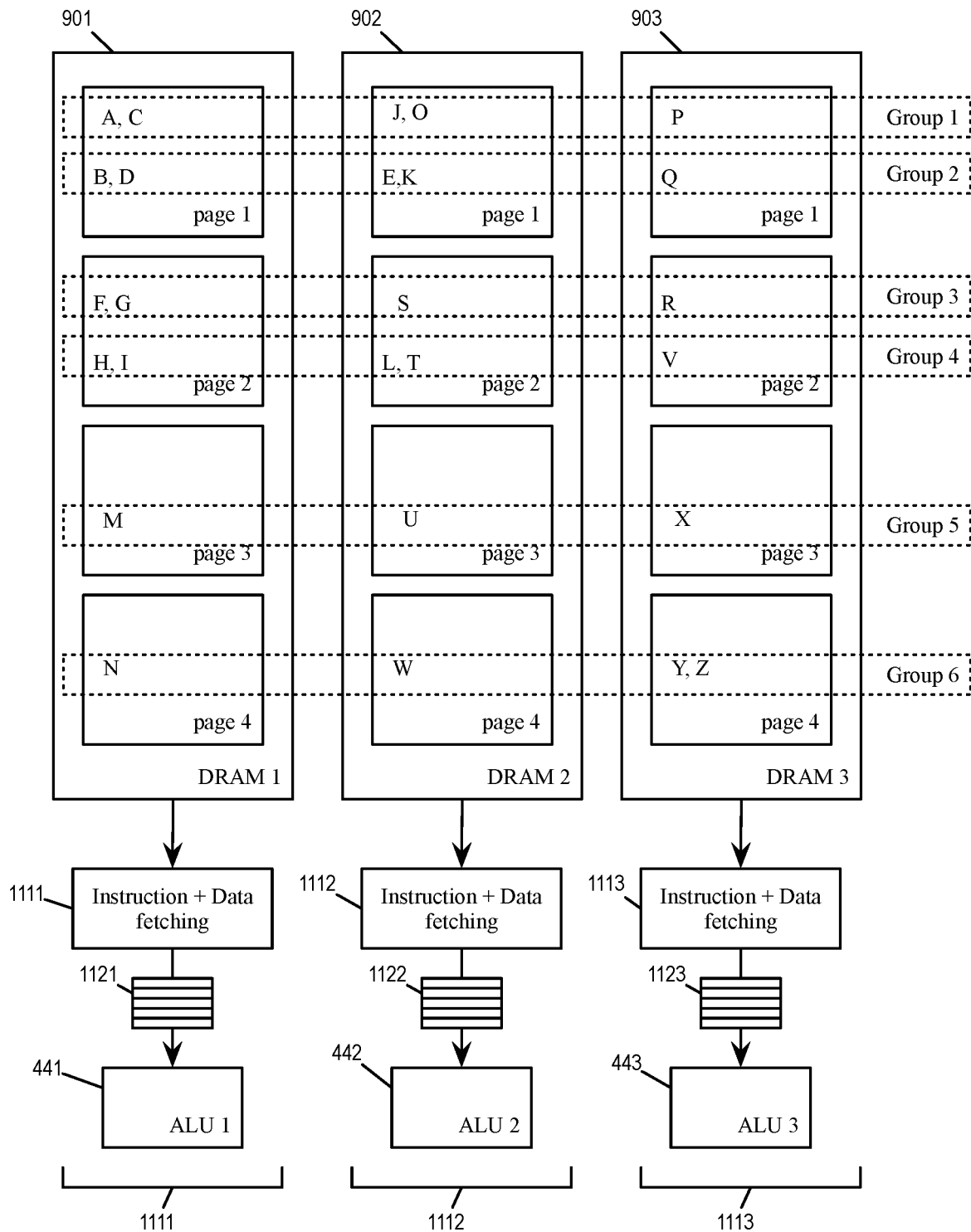
FIG. 11 illustrates the division of group-sorted instructions into multiple channels of memories and ALUs.

FIG. 11 illustrates the division of group-sorted instructions into multiple channels of memories and ALUs. The figure illustrates the instructions of the instruction cloud 600 being assigned to three channels 1111-1113. Each channel includes an instruction memory, an instruction/data fetching unit, a streaming buffer, and an ALU. Specifically, the channel 1111 includes a memory structure 901, an instruction/data fetching unit 1111, a streaming buffer 1121, and an ALU 441; the channel 1112 includes a memory structure 902, an instruction/data fetching unit 1112, a streaming buffer 1122, and an ALU 442; and the channel 1113 includes a memory structure 903, an instruction/data fetching unit 1113, a streaming buffer 1123, and an ALU 443. The ALUs 441-443 are part of the array of ALUs 440.

As illustrated, the instructions of each group are divided among the instruction memories of different channels. For example, for group 1, instructions A and C are stored in the memory 901 of channel 1111, instructions J and O are stored in the memory 902 of channel 1112, and instruction P is stored in the memory 903 of channel 1113. The ALU 441 only executes instructions fetched by the instruction/data fetching unit 1111, which fetches only instructions from the memory structure 901. The ALU 442 only execute instructions fetched by the instruction/data fetching unit 1112, which fetches only instructions from the memory structure 902. The ALU 443 only execute instructions fetched by the instruction/data fetching unit 1113, which fetches only instructions from the memory structure 903. This minimizes the routing between the ALUs and the instruction memory.

As mentioned, the instruction memory 310 can be implemented by using DRAMs, and the instructions belonging to a same group are stored in a same DRAM page. In the scenario of having the instruction memory divided into different channels, the DRAM of each channel stores instructions belonging to the same group at a same page, albeit DRAMs of different channels store different subsets of instructions from the same group. As illustrated, the DRAM 901, 902, and 903 all store instructions belonging to groups 1, 2, 3, 4, 5, and 6. All three DRAMs store their groups 1 and 2 instructions in page 1, groups 3 and 4 instructions in page 2, group 5 instructions in page 3, and group 6 instructions in page 4.

As mentioned, since the instructions belonging to the same group are logically independent of each other, they can be executed in any order by any ALUs in the array. For example, an ALU may execute the instructions of group 1 in the order of:

A, C, J, O, P

The same ALU may also execute the instructions of group 1 in the order of:

C, O, A, P, J.

In some embodiments, an ALU may execute an instruction in multiple phases, and the ALU may execute a later phase of the multi-phase instruction after an arbitrary number of other instructions. For example, say the instruction 'C' is a multi-phase instruction that is executed as phase "C1" and "C2", then the ALU may execute the instructions of group 1 in the order of:

A, C1, C2, J, O, P.

But the ALU may also execute the instructions of group 1 in the order of:

C1, O, A, P, J, C2 or:

J, C1, P, 0, C2, A.

In other words, as long as the different phases of the multi-phase instruction are executed in order relative to each other, the ALU may execute each phase of the multi-phase instruction in any order relative to other instructions.

An example of an instruction that is executed as a multi-phase instruction is an indexed memory load instruction. The ALU executes a first phase to fetch the index and then a second phase to use the fetched index to fetch the memory content. The ALU in some embodiments handles the first phase of the load instruction in a separate pipeline while executing other instructions. The ALU would return to execute the second phase after the separate pipeline of the first phase has completed, which is also after some of the other instructions in the group has completed. This is permissible because the instructions belong to the same group are logically independent of each other and can be executed in any order.

C. Event Scheduling

In some embodiments, the accelerator would execute an instruction when the instruction has a pending input event. The accelerator uses the event table to keep track of pending input events and to identify instructions that need to be executed.

As instructions in each group are executed, the destinations of their outputs (also referred to as their fan-outs) may have new pending input event. Some of these destinations are instructions in other groups of the current time step. Some of these destinations are instructions to be executed at a future time step. For destination instructions that are in the same current time step as the executed instruction, the simulation accelerator uses the event table to keep track of new pending input events. For destination instructions that are in a future time step, the simulation accelerator stores the new pending input events in a storage (referred to as a "time wheel") until the future time step arrives. Once that future time step arrives, the simulation accelerator uses the content of the time wheel storage to populate the event table for the instructions of that time step.

In some embodiments, the simulation system advances the simulation time by using the content of the time wheel storage to identify the next time step. Specifically, by examining the time wheel storage to identify the time step of the nearest (i.e., the earliest) future pending event.

An event can be a scheduled event that is scheduled to occur at a specific simulation time step. Such an event is stored in the time wheel and is used to populate the event table 330 to start the event-driven simulation for the time step. An event can also be a propagated event that is propagated from a source instruction to a set of destination instructions within the time step. Such an event appears at and disappears from the event table during the same time step and is not recorded in the event time wheel. Examples of scheduled events are rising and falling edges of clock signals and reset signals, as well as any signal assignment following a specified delay (such as Verilog fragments 212 and 213 of FIG. 2). The event-driven simulation of a time step typically starts with a scheduled rising clock edge event. The scheduled event triggers the execution of instructions of a first group, which in turn generates propagated events to trigger other instructions in other groups.

Figure 12:
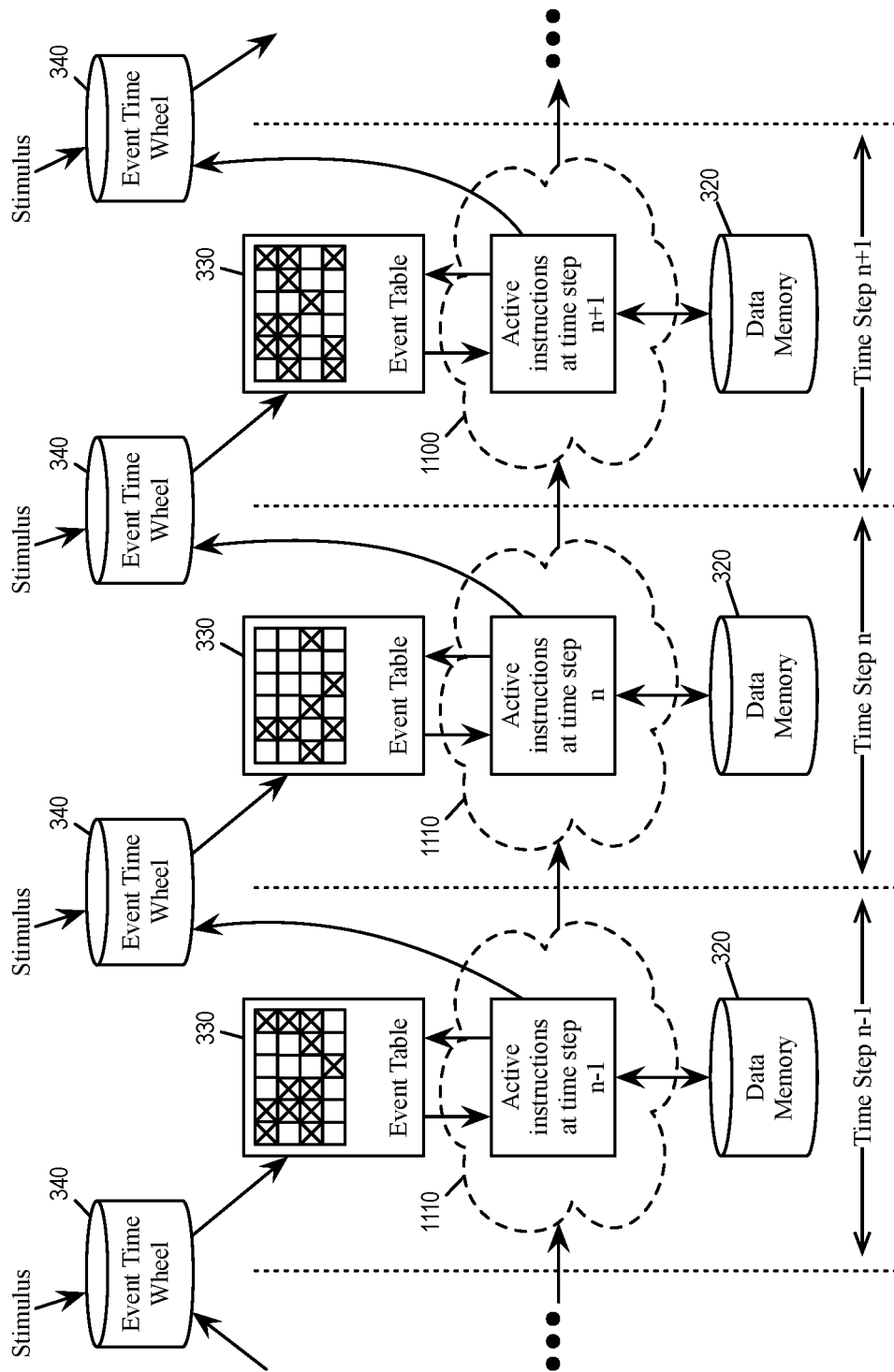
FIG. 12 conceptually illustrates the usage of the event table and the event time wheel storage.

FIG. 12 conceptually illustrates the usage of the event table and the event time wheel storage. The figure illustrates the relationship between the event table 330, the event time wheel storage 340, the data memory 320, and a compiled RTL 1210 across different time steps. The compiled RTL includes instructions that are to be executed at different time steps.

As illustrated, when the simulation time arrives at time step n, the simulation accelerator initializes the event table with the content of event time wheel 340. The event time wheel is filled with pending events generated by instructions executed at time step n−1 or before. The event time wheel is also filled with stimulus supplied by the testbench (e.g., generated by the simulation processor 120 or the simulation accelerator 110). The stimulus specifies what data is to be applied and at what simulation time steps. As the simulation accelerator 110 executes the instructions of the time step n based on input data stored in the data memory 320 and generates pending events for destination instructions, it updates the event table 330 and the event time wheel 340. It also writes output data into the data memory 320 as input data to destination instructions. For destination instructions that are in time step n, the simulation accelerator updates the event table 330. For destination instructions that are in time step n+1 or after, the simulation accelerator stores the new pending input events in the event time wheel storage 340.

Figure 13A:
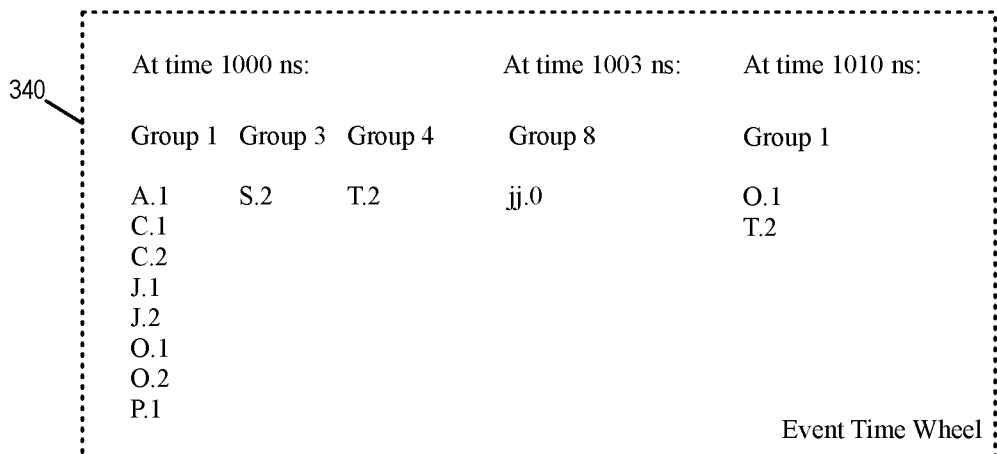

FIGS. 13*a-b* conceptually illustrate the content of the event time wheel storage 340, the event table 330, and the data memory 320 in different time steps.

FIG. 13*a* illustrates the content of the event time wheel 340 and the content of the event table 330 at a time step 1000*ns*. At the time step 1000*ns*, the instructions of the instruction cloud 600 (i.e., instructions A-Z) are scheduled to execute. The event time wheel 340 records pending input event for this time step (1000*ns*) and other future time steps (1003*ns* and 1010*ns*) based on testbench stimulus and/or based on execution of previous time steps. As illustrated, the content of the event time wheel 340 indicates that there are pending input event at instructions A, C, J, O, P, S, T for the time step 1000*ns*, as well as pending input event at instruction "jj" at 1003*ns*, and instructions O and T at time step 1010*ns*.

The data memory 320 stores the input data of every instruction in the compiled RTL, including those scheduled to be executed in this time step (i.e., instructions A-Z). The input data of some of the instructions are newly updated because of new pending input events (illustrated in bold, such as input data for instructions A, C, J, O, P, S, T).

The event table 330 keeps track of pending input events for instructions. In some embodiments, the event table maintains only pending input events for the instructions that are scheduled to execute for the current time step. When the simulation time initially arrives at a particular time step, the accelerator populates the event table 330 based on the pending input events for the current time step stored in the event time wheel 340. (The events from previous time steps would have already been cleared).

In some embodiments, the event table 330 is maintained as a collection or a scoreboard of bits, each bit indicating absence or presence of pending event at an input of an instruction. The event table 330 is therefore also referred to as a pending events table. Each instruction has a corresponding bit in the event table 330 for indicating whether there is a pending input event for the instruction. In some embodiments, each input of each instruction has a corresponding bit for indicating whether there is a pending event at that input. As illustrated in FIG. 13*a*, bits in the event table 330 that correspond to instructions A, C, J, O, P, S, and T are set to indicate pending event at these instructions, while bits correspond to other instructions are cleared to indicate that there are no pending events at those other instructions. In some other embodiments (not illustrated), the event table only keeps track of whether an instruction has any pending input event at all (i.e., whether the instruction has least one input with input event), rather than keeping track of pending events for each input of each instruction.

In the example illustrated in FIG. 13*a*, the event table 330 keeps track of pending events for instructions in groups 1-6, as these are the instructions that are scheduled to execute in the current time step. The event table 330 is populated with input events at A, C, J, O, P, S, and T based on the content of the event time wheel 340 for the time step 1000*ns*.

In some embodiments, the bits of the event table 330 are bundled into wide words for the simulation accelerator 110 (at e.g., event manager 430) to quickly access. Each bit in this wide word corresponds to an instruction for indicating whether the instruction has a pending event at its input(s). Bits that correspond to instructions of a same group are located in the same word of the pending events table. In some embodiments, all bits that correspond to instructions of a same instruction cloud are stored at a same word for quick access by the event manager 430. This allows the simulation accelerator to examine the pending input event status of many instructions at the same time, such as when determining which group of instructions have pending events. This also minimizes memory access latency when retrieving and updating pending input events in the event table 330.

For some embodiments, the event time wheel storage 340 can be considered as a collection of initial content for the event table at different time steps. When the simulation accelerator arrives at the current time step, the simulation accelerator 110 (at the event manager 430) retrieves from the event time wheel storage 340 the initial content of the event table for the current time step. The storage in the event time wheel 340 allocated to storing the initial content the event table of the current time step is then freed so the event time wheel 340 may store the initial content of the event table of a future time step.

FIG. 13*b* illustrates the content of the event time wheel 340 and the initial content of the event table 330 at a time step 1003*ns*. At the time step 1003*ns*, the simulation accelerator has completed executing the instructions of the time step 1000*ns* (groups 1-6) and is set to execute the instructions of the time step 1003*ns* (groups 7-11). The execution of the instructions of the time step 1000*ns* has updated the content of time wheel 340. According to the updated time wheel 340, there are pending events at inputs of instructions aa, bb, cc, dd, gg, and jj. These are initial content of the event table 330 for the time step 1003*ns*. When the simulation time reaches the time step 1003*ns*, the simulation accelerator populates the event table 330 with its initial content for the time step 1003*ns* stored in the event time wheel 340, specifically setting pending input events for instructions aa, bb, cc, dd, gg, and jj based on the content of the event time wheel 340. The event table 330 is now ready to maintain pending input events of groups 7-11.

In some embodiments, the testbench specifies a set of initial conditions or initial stimulus as scheduled event. These scheduled events are initial pending events that are scheduled to occur at the earliest simulation time step (time step 0) and/or at some specified time steps. When compiling the source files 180 of the testbench (including codes for both the DUT 170 and the models 172), the compiler 195 extracts the initial stimulus from the testbench, and the simulation system 100 installs the initial stimulus into the event time wheel 340 as scheduled events.

Figure 14:
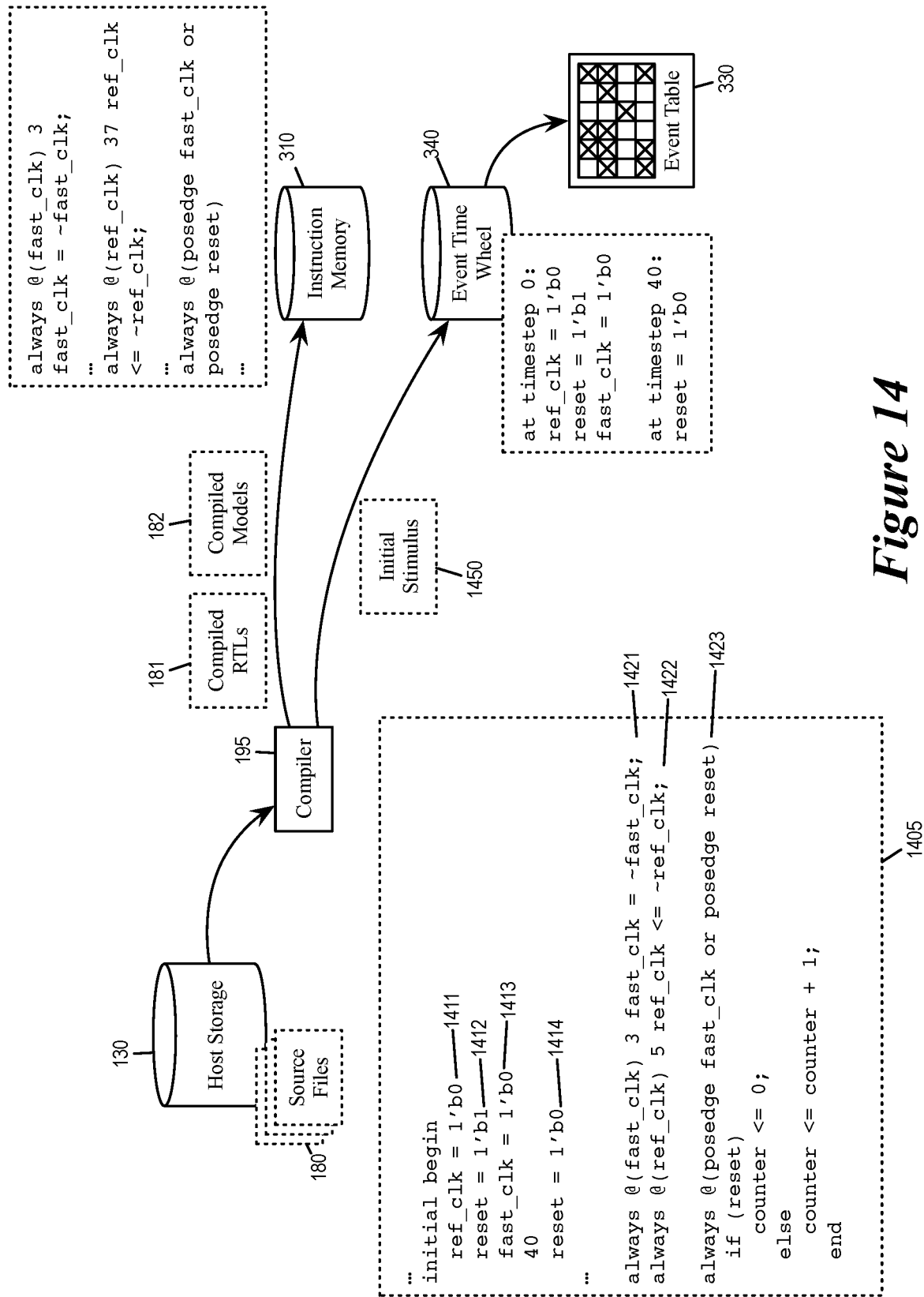
FIG. 14 illustrates the generation of initial stimulus as scheduled events at the start of event-driven simulation.
Figure 15A:
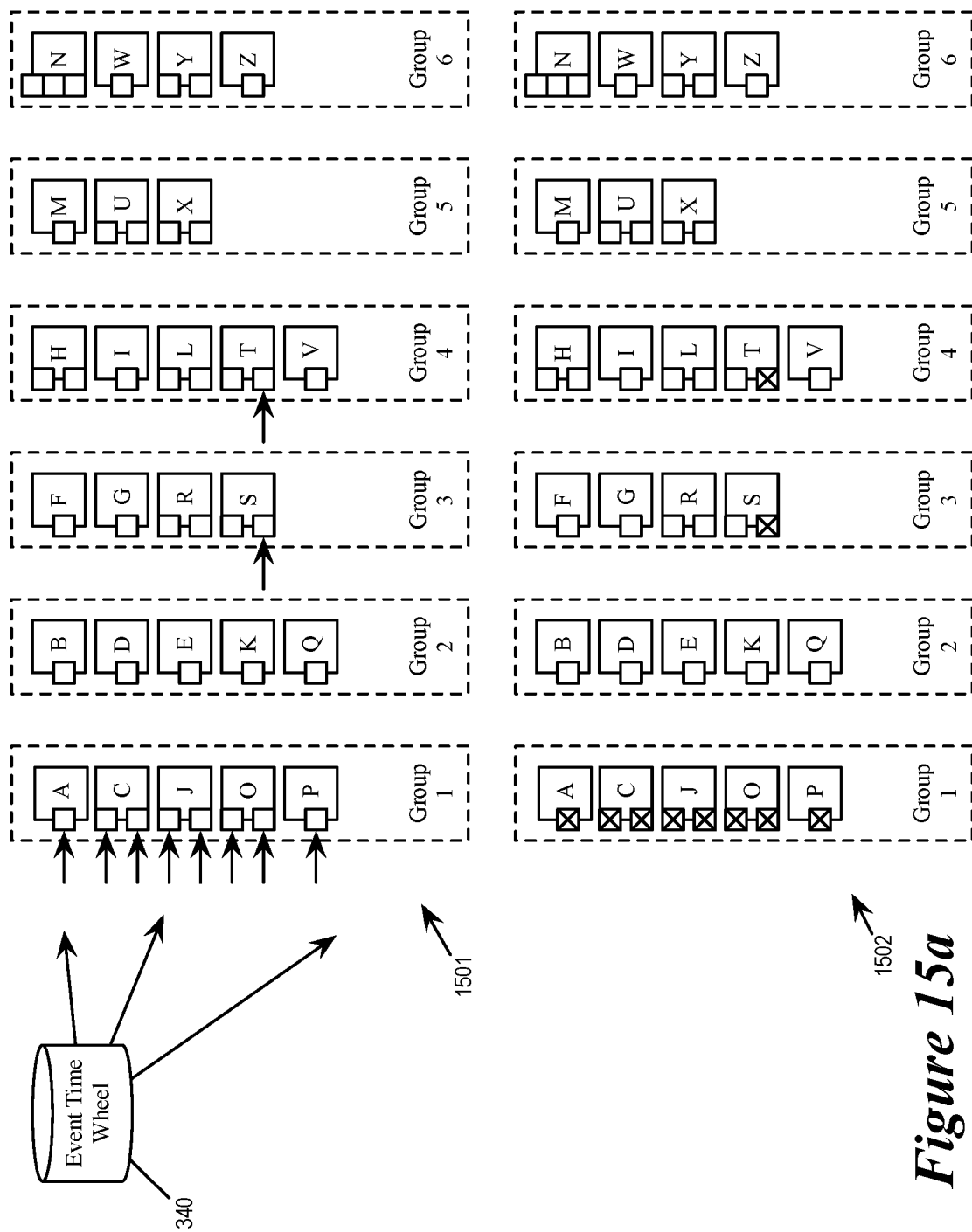
FIGS. 15a-d illustrate the use of event table and event time wheel during execution of group-sorted instructions of a time step.
Figure 15B:
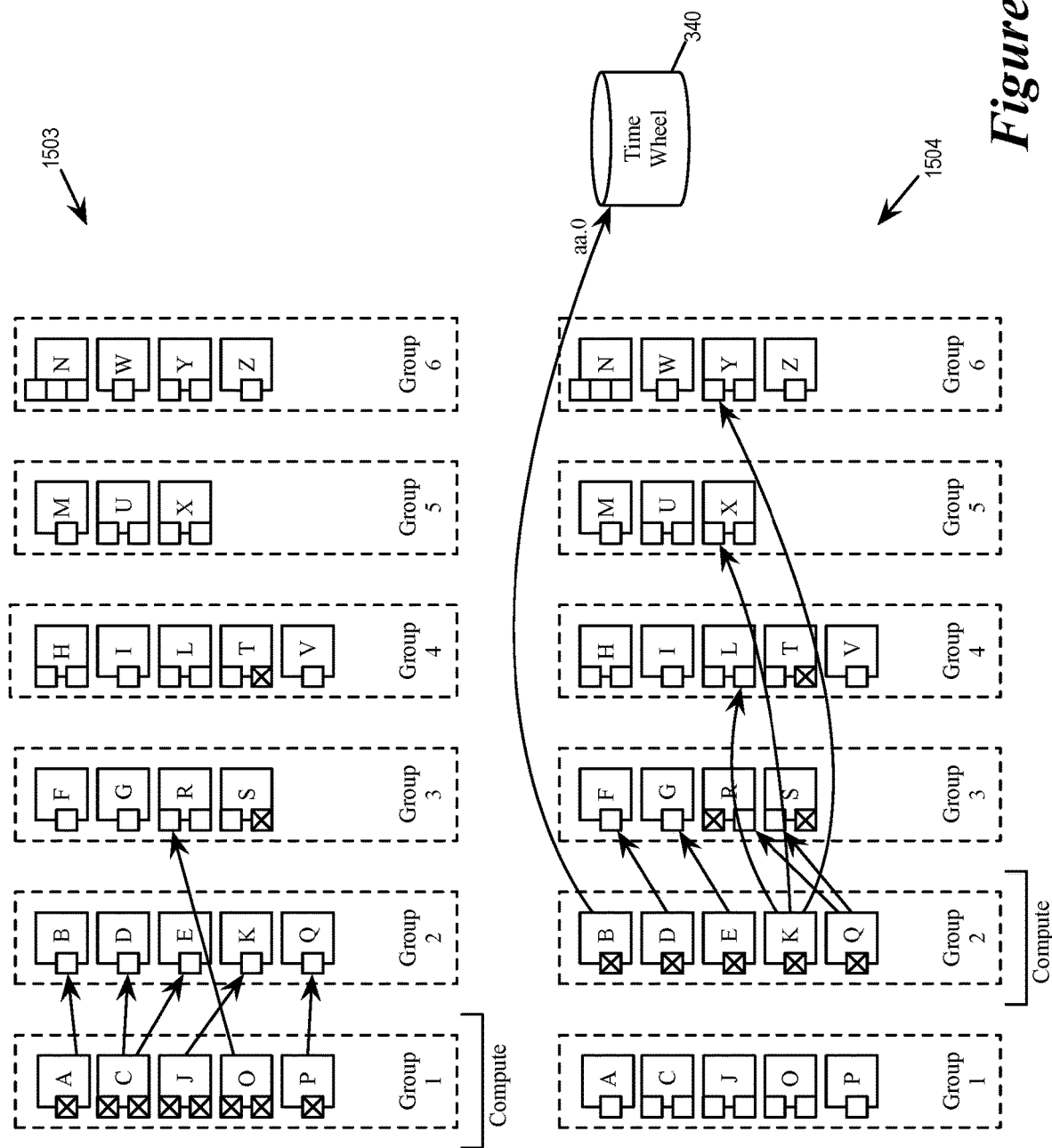
Figure 15C:
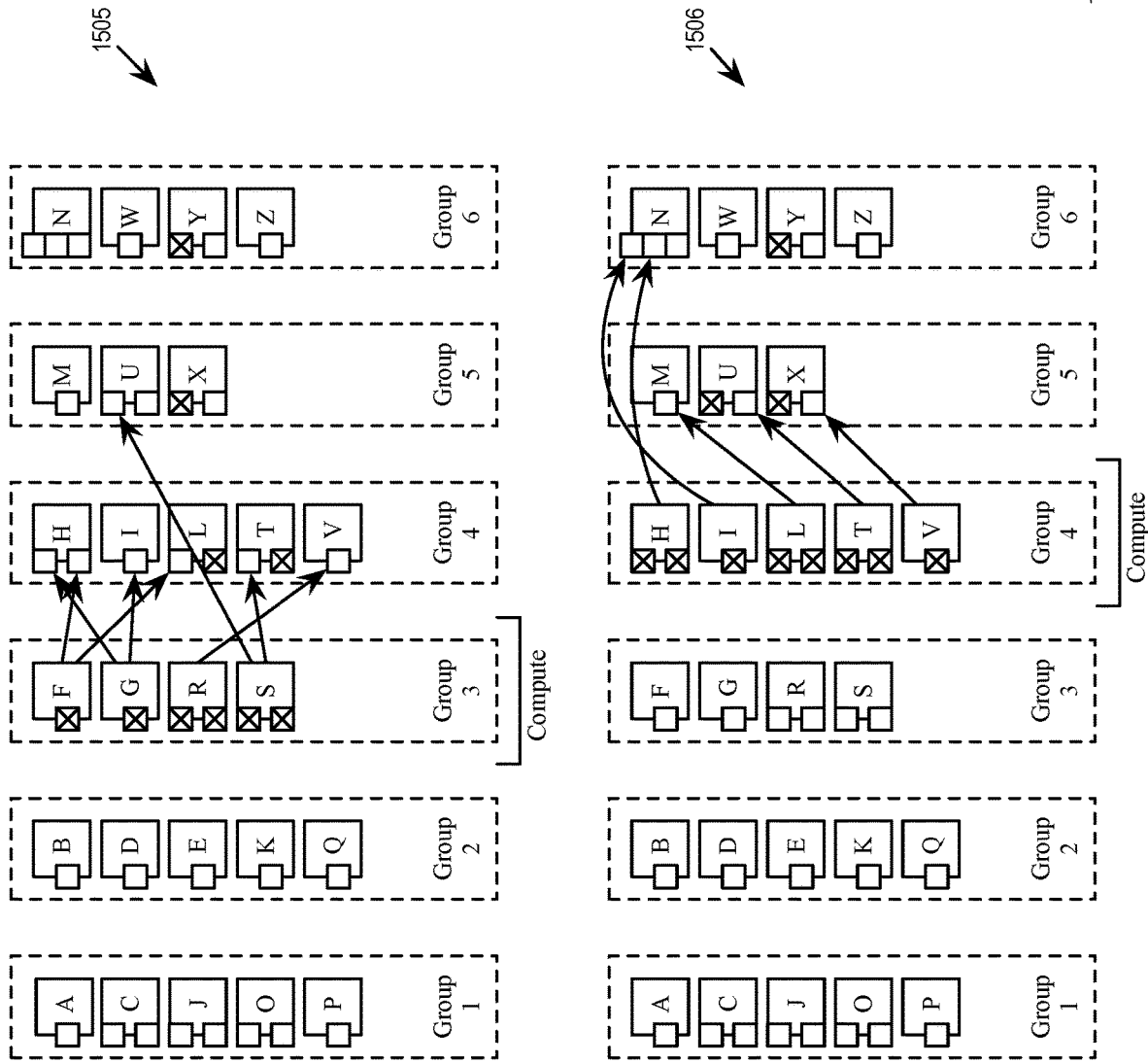
Figure 15D:
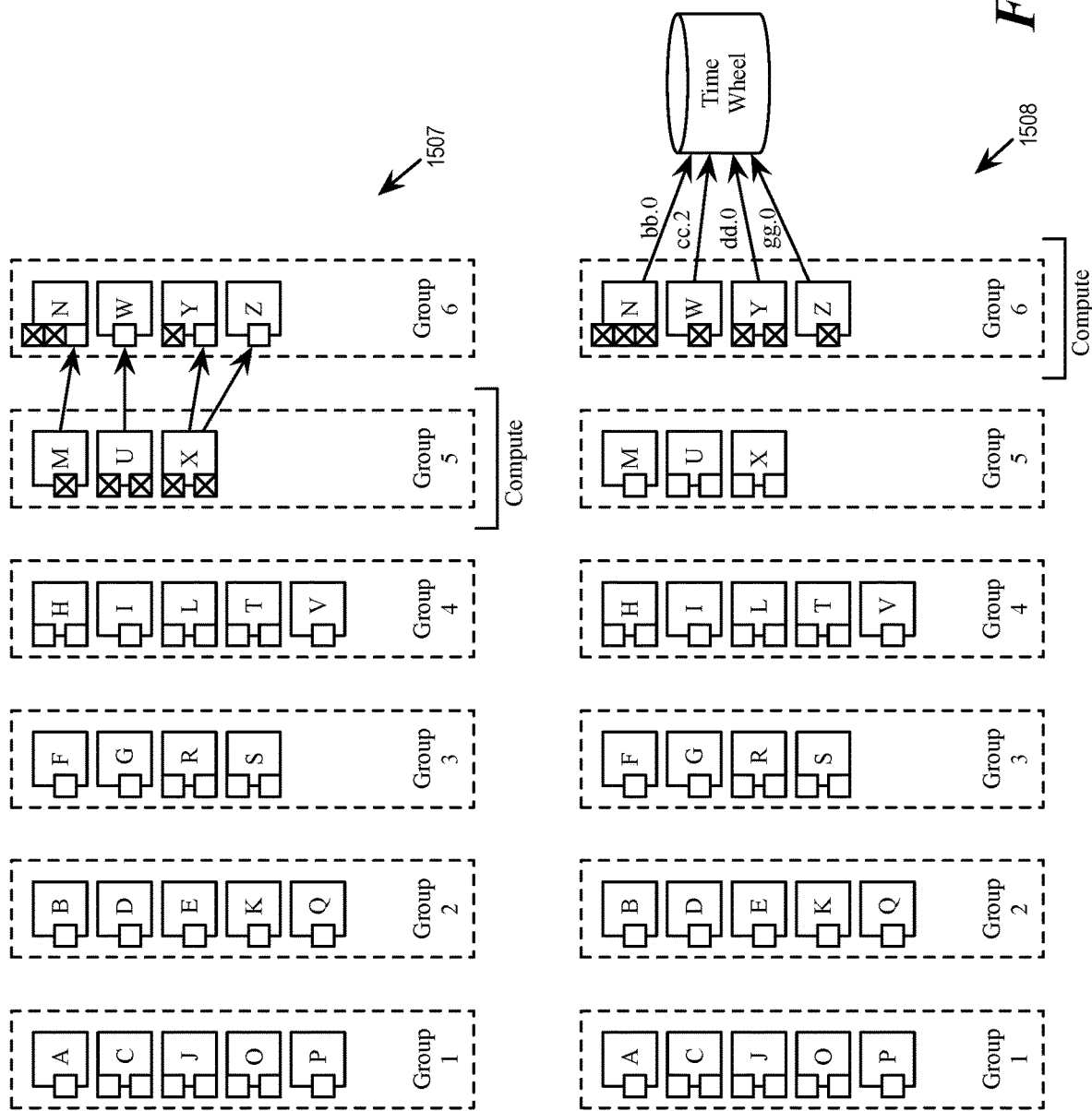

FIG. 14 illustrates the generation of initial stimulus as scheduled events at the start of event-driven simulation. As illustrated, the compiler 195 compiles source files 180 into compiled RTLs 181 and compiled models 182 for execution at the simulation accelerator 110. The compiler 195 also compiles initial value assignment statements in the source files 180 into initial stimulus 1450.

As illustrated, the source files 180 includes a code segment 1405. The code segment 1405 includes one-time value assignment statements that assigns values to signals at specified time steps. Statements 1411-1413 are example Verilog "initial" statements that assign signals "ref_clk", "reset", and "fast_clk" respectively to values 1'b0, 1'b1, and 1'b0 at time step 0, while statement 1414 assigns the signal "reset" to 1'b0 at time step 40. The compiler turns these initial value assignment statements into scheduled events at the event time wheel storage 340. These scheduled events will be used to populate the event table 330 for time steps 0 and 40.

The code segment 1405 also includes event-driven statements that executes whenever a particular event is present. Statements 1421-1423 are example Verilog "always" statements. The statement 1421 executes whenever there is an event at the signal "fast_clk". The statement 1422 executes whenever there is an event at the signal "ref_clk". The statement 1423 executes whenever there is a rising edge event at the signal "fast_clk" or a rising edge event at the signal "reset". Some of these event-driven statements continuously and periodically schedule further pending events. Specifcially, the statement 1421 schedules a pending event for the signal of "fast_clk" once every 3 timing units, and the statement 1422 schedules a pending event for the signal "ref_clk" once every 5 timing units. The compiler 195 compiles these statements into instructions and the simulation system 100 stores the compiled instructions into the instruction memory 310 for execution by the simulation accelerator 110.

The statements 1421 and 1422 are statements for generating clocks. When executing the instructions that correspond to the statements 1421 and 1422, the accelerator would schedule pending rising and falling edge events for itself at a future time step. The simulation accelerator consequently periodically stores rising and falling edge events into the time wheel 340 for the signals "fast_clk" and "ref_clk".

D. Event Propagation

FIGS. 15a-d illustrate the use of event table and event time wheel during execution of group-sorted instructions of a time step. As illustrated, the event table 330 has bits that correspond to inputs of instructions A through Z sorted into groups 1-6 (of the instruction cloud 600). The figures illustrate the execution of the instruction groups 1-6 at the time step 1000ns in eight stages 1501-1508.

The first stage 1501 shows the simulation accelerator 110 (or the event manager 430) with the event table 330 cleared of any pending events for the current time step. The simulation accelerator then populates the bits of the event table 330 according to the content of the event time wheel 340, which stores the initial content of the event table for time step 1000ns.

The second stage 1502 shows the event table populated with pending input events based on the content of the event time wheel (based on the example shown in FIG. 13a at time step 1000ns). As illustrated, bits corresponding to inputs of the instructions A, C, J, O, P, S, and T are set to indicate pending input events, while other bits are not set to indicate that there are no pending input events at those inputs.

The third stage 1503 shows the selection of group 1 for execution. The accelerator in some embodiments selects a group of instructions by examining the bits of the event table, i.e., to select a group having pending input events. Since there are multiple groups with pending input events (groups 1, 3, and 4), the accelerator selects a group with pending input events that does not depend on any group within the time step. In some embodiments, this group is identifiable as the group having the lowest group number in the time step. In this case, group 1 is selected for execution because its instructions do not depend on other groups for input.

The stage 1503 also shows the fan-out of each instruction in the executed group 1. In this example, the output of A fans out to B, the output of C fans out to D and E, the output of J fans out to K, the output of O fans out to R, and the output of P fans out to Q. The corresponding bits of these destination instructions (B, D, E, K, R, and Q) will be set to indicate that there are pending input events.

At the fourth stage 1504, the bits that correspond to the inputs of group 1 instructions have been cleared. The stage 1504 also shows the selection of group 2 for execution. This is because group 2 has pending input events at its instructions (B, D, E, K, Q). This is also because the instructions of group 2 depend on only instructions in groups that have already executed (i.e., group 1). The stage 1504 also shows the output of B fans out to "aa", the output of D fans out to F, the output of E fans out to G, the output of K fans out to L, X, and Y, the output of Q fans out to R and S. The corresponding bits of these destination instructions (F, G, L, X, Y, R, S) will be set to indicate that there are pending input events. The instruction "aa" is in a future time step 1003ns, so the accelerator records the pending input event in the event time wheel 340 for the future time step.

At the fifth stage 1505, the bits that correspond to the inputs to group 2 instructions have been cleared. The stage 1505 also shows the selection of group 3 for execution. This is because group 3 has pending input events at its instructions (F, G, R, S). This is also because the instructions of group 3 depend on only instructions in groups that have already executed (i.e., groups 1 and 2). The stage 1505 also shows the output of F fans out to H and L, the output of G fans out to I, the output of R fans out to V, the output of S fans out to T and U. The corresponding bits of these destination instructions (H, I, L, T, V, U) will be set to indicate that there are pending input events.

At the sixth stage 1506, the bits that correspond to the inputs to group 3 instructions have been cleared. The stage also shows the selection of group 4 for execution. This is because group 4 has pending input events at its instructions (H, I, L, T, V). This is also because the instructions of group 4 depend on only instructions in groups that have already executed (i.e., groups 1, 2, and 3). The stage 1506 also shows the output of H fans out to N, the output of I fans out to N, the output of L fans out to M, the output of T fans out to U, and the output of V fans out to X. The corresponding bits of these destination instructions (N, M, U, X) will be set to indicate that there are pending input events.

The seventh stage 1507 shows bits that correspond to the inputs to group 4 instructions have been cleared. The stage also shows the selection of group 5 for execution. This is because group 5 has pending input events at its instructions (M, U, X). This is also because the instructions of group 5 depend on only instructions in groups that have already executed (i.e., groups 1, 2, 3, and 4). The stage 1507 also shows the output of M fans out to N, the output of U fans out to W, and the output of X fans out to Y and Z. The corresponding bits of these destination instructions (N, W, Y, Z) will be set to indicate that there are pending input events.

The eighth stage 1508 shows bits that correspond to the inputs to group 5 instructions have been cleared. The stage also shows the selection of group 6 for execution. This is because group 6 has pending input events at its instructions (N, W, Y, Z). This is also because the instructions of group 6 depend on only instructions in groups that have already executed (i.e., groups 1, 2, 3, 4, and 5). The stage 1508 also shows the output of N fans out to "bb", the output of W fans out to "cc", the output of Y fans out to "dd", and the output of Z fans out to "gg". The instructions "bb", "cc", "dd", and "gg" are all in a future time step 1003$ns$, so accelerator records the pending input event in the event time wheel 340 for the future time step.

Figure 13A:
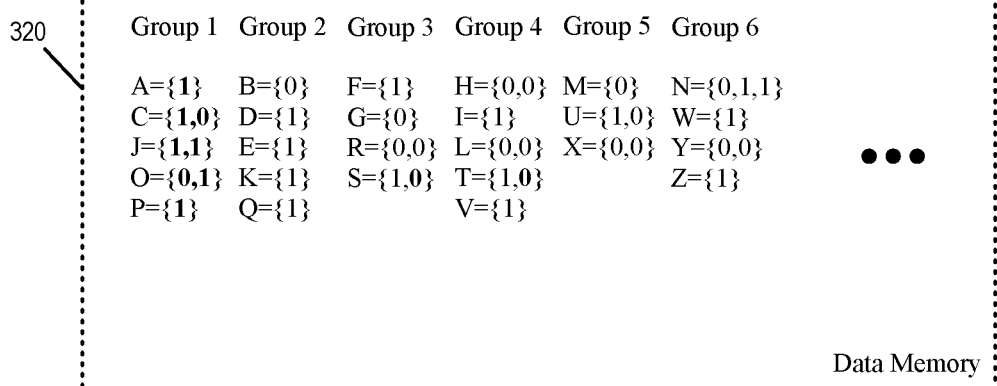
Figure 13A:
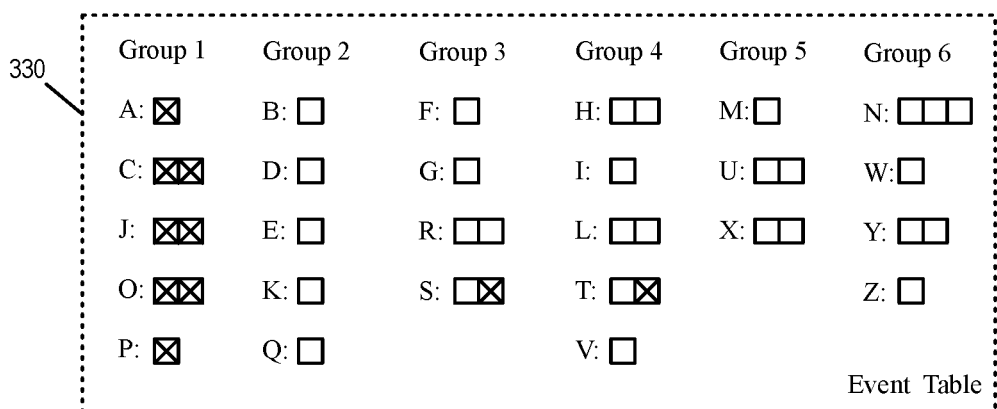

After the stage 1508, the bits that correspond to the inputs to group 5 instructions have also been cleared. This would leave the event table empty for the 1000$ns$ time step. The simulation accelerator (at the event manager 430) would therefore know that there is no more pending event for the current time step 1000$ns$, and the simulation may proceed to the next time step 1003$ns$. The event time wheel 340 and the event table 330 at start of the time step 1003$ns$ are provided by FIG. 13$b$ above.

In the example illustrated in FIGS. 15$a$-$d$, the output of every instruction executed generates pending event that fans out. However, not all executions of an instruction result in changes at the instruction's output. (For example, changes at one input of a NAND gate when the other input is held at 0 would not result in a change in NAND gate's output). If the output of an instruction does not change following the instruction's execution, the simulation accelerator in some embodiments would not follow the fan-out of the instruction to update the event table, the event time wheel, or the data memory.

As mentioned, the event time wheel 340 is filled with scheduled events generated by execution of instructions as well as by stimulus supplied by the testbench. In some embodiments, the simulation processor 120 supplies the stimulus by executing testbench programs and data 142 based on the compiled model 182. In some embodiments, at least some of the testbench programs and data 142 are compiled as accelerator instructions 141 that are executed by the simulation accelerator 110. The execution of the testbench programs and data 142 by simulation accelerator 110 in turn generates the stimulus to be stored in the event time wheel 340 as scheduled events.

E. Instruction Execution

In some embodiments, the input data to an instruction is (are) stored at a same address location as the instruction itself. In other words, when the simulation accelerator 110 (at its instruction/data fetching unit 410) fetches an instruction for execution, the same address that is used to fetch the instruction is also used to fetch the input data to the instruction. In some embodiments, each instruction is stored at a same memory word as its inputs. This ensures that the simulation accelerator does not incur any additional memory access latency when fetching input data for an instruction.

Figure 16:
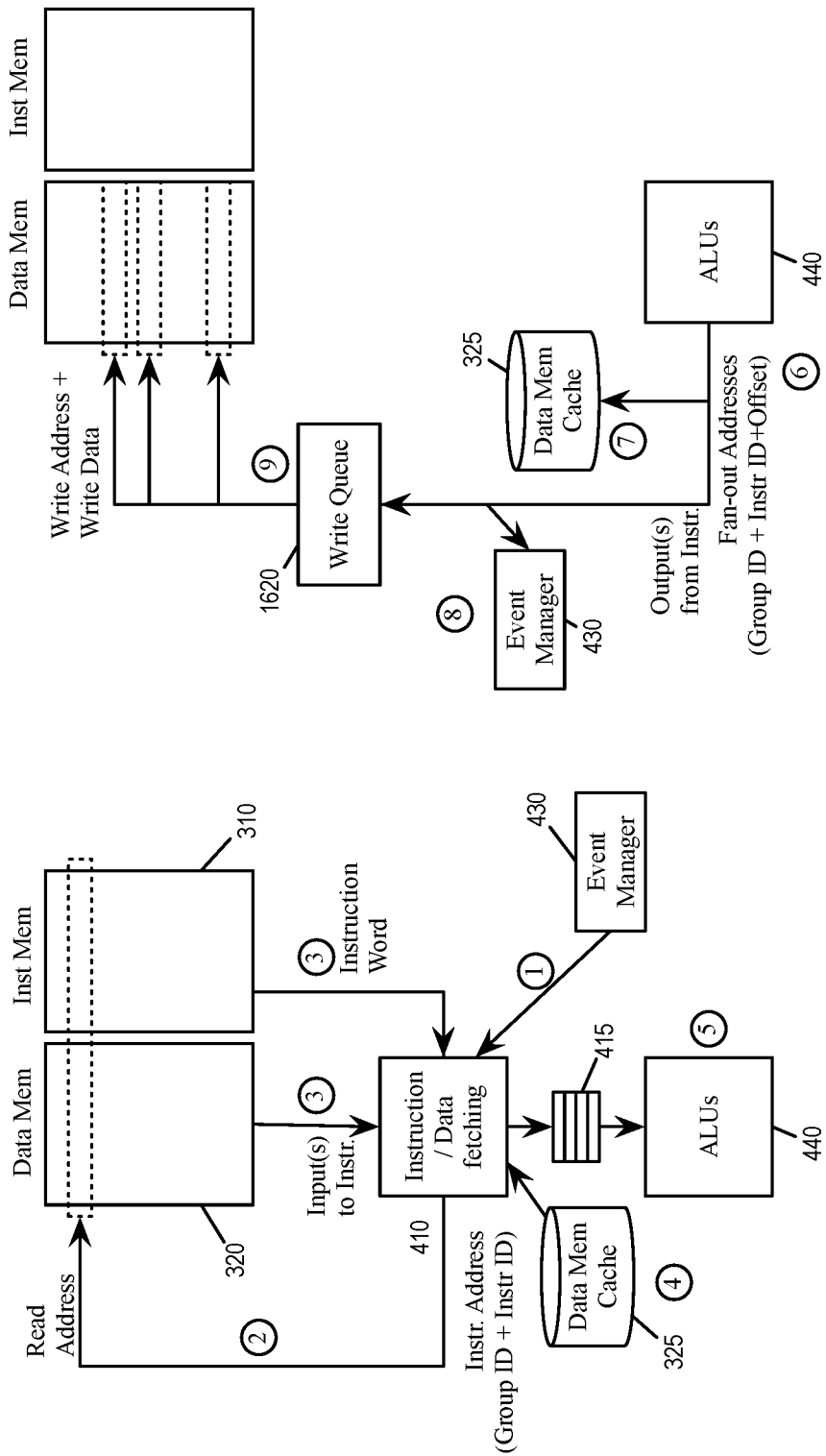
FIG. 16 illustrates the data flow during the execution of an instruction at the simulation accelerator.

FIG. 16 illustrates the data flow during the execution of an instruction at the simulation accelerator. The figure illustrates the instruction/data fetching unit 410 fetching the instruction and its corresponding input data from the instruction memory 310 and data memory 320. The ALUs 440 executes the fetched instruction based on fetched input data. The output of the instruction execution is written back to the data memory 320 as input for other instructions. The figure illustrates the execution of the instruction in nine operations labeled '1' through '9'.

At the operation labeled '1', the instruction/data fetching unit 410 determines which instruction to fetch and execute based on the content of the event table (as managed by the event manager 430). Event-based instruction fetching will be described in Section III.G below.

At the operation labeled '2', the instruction/data fetching unit 410 issues an address for fetching an instruction and its corresponding input data. As mentioned, the instruction and its corresponding input data are stored at address locations that are accessible by the same address value.

At the operation labeled '3', the instruction/data fetching unit 410 retrieves the content of the addressed memory locations from both the instruction memory and the data memory. The fetched instruction and input data are forwarded to the ALU 440. In some embodiments, the fetched instruction and input data are buffered at the streaming buffer 415, which is a memory structure capable of storing multiple instructions and their corresponding inputs.

At the operation labeled '4', the instruction/data fetching unit retrieves input data from a data memory cache 325 if there is a cache hit. The data memory cache 325 is a cache that intercepts and stores outputs of recently executed instructions. In some embodiments, the input data required by the instruction can be the output of a recently executed instruction that may not have already been written back into the data memory (but is instead waiting in a write queue 1620). The output of the recently executed instruction is available in the data memory cache 325. When there is a cache hit, the input data fetched from the data memory cache 325 replaces the input data fetched from the data memory 320 since the input data fetched from the data memory 320 may not be up to date.

The data memory cache 325 is a low latency memory structure (e.g., static RAM) for temporarily storing output data produced by the ALUs. Outputs of each instruction is temporarily held in the data memory cache 325 such that subsequent instructions can retrieve their inputs quickly from the data memory cache 325 instead of from the data memory 320. The data memory cache 325 as a temporary storage holds only output data from instructions that are recently executed. A cache hit indicates that the requisite input is available in the data memory cache because the input is the output of a recently executed instruction. A cache miss on the other hand indicates that the requisite input is not available in the data memory cache because the input is the output of an instruction not so recently executed. In that case the updated input data is assumed to already be in the data memory 320.

For example, in FIG. 15$a$, the output data produced by instructions of group 1 are stored in the data memory cache 325 and are available as input data for instructions of group 2, and the output data produced by the instructions of group 2 are stored in the data memory cache 325 and are available as input data for instructions of group 3, etc. A larger data memory cache 325 would be able to hold data longer such that the output data produced by a particular group of instructions can be available as input data for more subsequent groups of instructions.

At the operation labeled '5', the ALU 440 executes the fetched instruction based on its corresponding fetched input data.

At the operation labeled '6', the ALU 440 writes the output of the executed instruction to its destination(s). An instruction that produces an output also specifies the fan-out destination instruction(s) that is (are) to receive the output. For each fan-out destination that is to receive a copy of the instruction' output data, the instruction specifies an address tuple that includes the destination's group identifier, instruction address, and input offset. The address tuple is used to specify the location in the data memory that is to store the output data. The address tuple and the output data are stored in the write queue 1620 to wait for opportunity to be written into the data memory.

Since the instructions are executed on a group-by-group basis and the outputs of the instructions in a current group are always destined for instructions in subsequent groups, the outputs of the instructions of the current group can be kept in the write queue 1620 until after the current group has completed execution. This minimizes memory access latency by not interfering with page read operations. In some embodiments, the data access unit 420 manages the queuing of write operations at the write queue 1620. In some embodiments, a destination location that is in the same DRAM page as the current group is written as soon as the execution of the current group of instructions is complete, while a destination location that falls outside of the current DRAM page is written later to minimize DRAM page access setup cost.

At the operation labeled '7', the output data produced by the ALU 440 is written into the data memory cache 325 so the data will be available as input data for instructions to be executed at the near future (e.g., instructions in the next group).

At the operation labeled '8', the data access unit 420 updates the event table 330 and/or the event time wheel 340 through the event manager 430. The event manager 430 clears the pending input events for instructions that were just executed and sets pending input events for destination instructions.

At the operation labeled '9', the data access unit 420 moves the output data from the write queue 1620 to the data memory 320. Each output data has one or more fan-out destinations that informs the data access unit 420 where to write the output data. Each fan-out destination is a location in the data memory 320 that corresponds to the input area of a destination instruction. That destination instruction will use the output data written in that destination location as input for execution. Writing instruction's output data to the data memory will be further described by reference to FIGS. 20, 21, and 22 below.

Figure 17:
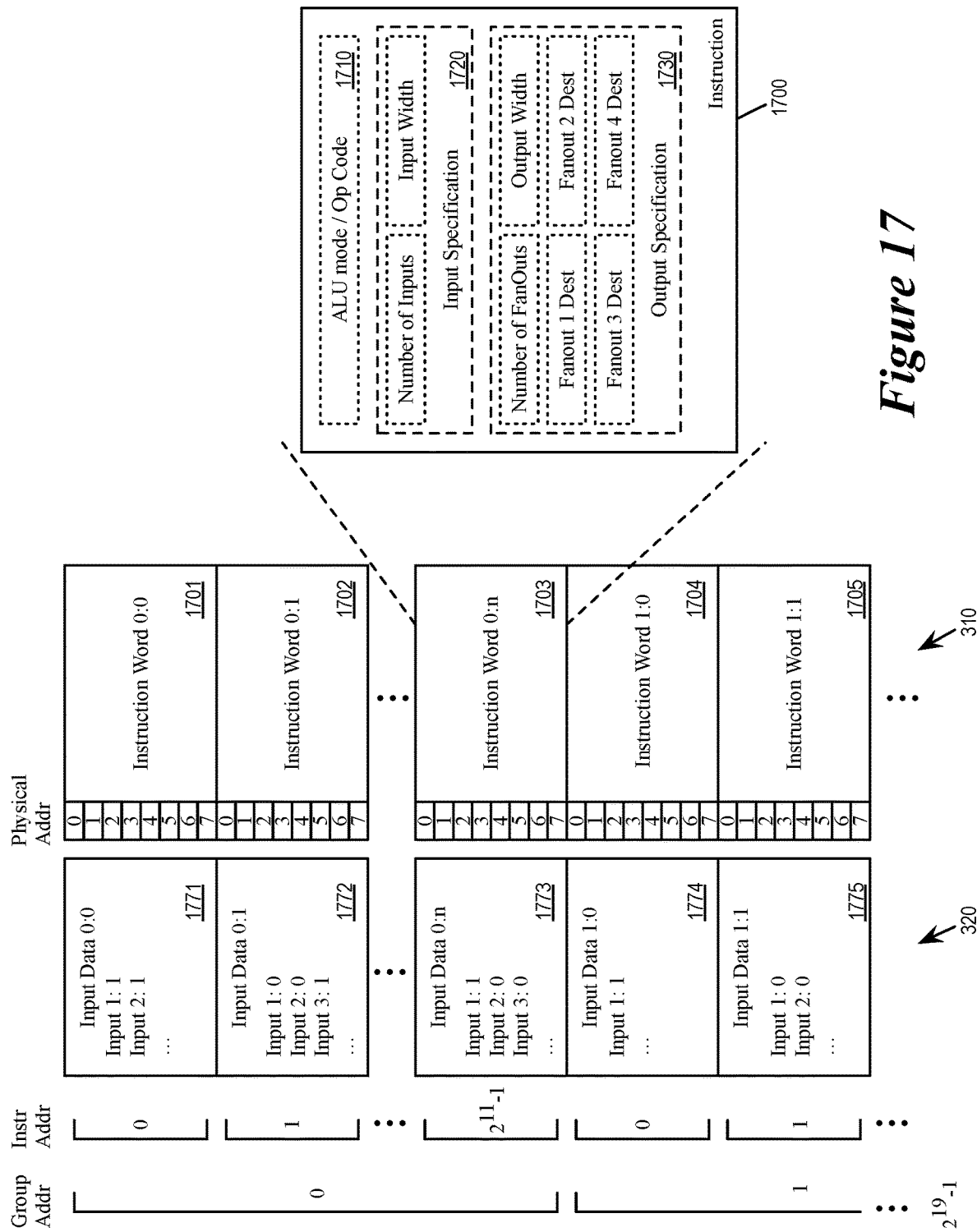
FIG. 17 illustrates the format of the content in the instruction memory and in the data memory.

FIG. 17 illustrates the format of the content in the instruction memory and in the data memory. As mentioned, the instructions of the simulation accelerator are group-sorted. The storage of instructions at the instruction memory and the storage of inputs at the data memory are correspondingly group-sorted. As illustrated, each group of instructions has a unique identifier, and the group identifier is used as the most significant part of the address for accessing instructions and data. Thus, the instructions and their input data are organized into groups by virtue of having different group identifier. Within each group, each instruction has an instruction address that is unique within the group. In some embodiments, this instruction address serves as the next significant part of the address (after group identifier) for accessing instructions and data. In some embodiments, each group may have up to 2048 instructions (11 address bits). The same group identifier, instruction address, and physical word address are used to fetch the instruction from the instruction memory 310 and to fetch the input data from the data memory 320.

For some embodiments, each instruction may include one or more instruction words, each instruction word including several physical words in the physical memory. As illustrated in FIG. 17, in some embodiments, each instruction word includes 8 physical words covering 8 physical address locations. Each instruction word has a unique instruction address location. An instruction that includes multiple instruction word therefore starts at an instruction address location and may extend to occupy multiple instruction address locations.

An instruction includes various components. The figure shows the format of the content of an example instruction 1700, which includes an ALU opcode 1710, input specification 1720, and output specification 1730. The ALU opcode 1710 specifies the operations that an ALU (in the ALU array 440) will perform when executing the instruction. The input specification 1720 specifies the format of the input data at the data memory 320 for the instruction, e.g., the number of inputs and the width of the inputs. The example instruction 1700 occupies one instruction word 1703, and the various components 1700 are contained within the instruction word 1703. However, an instruction may also occupy multiple instruction words in some embodiments. In these instances, some of the components of the instruction, e.g., the output specification 1730, may span multiple instruction words (e.g., extend into the instruction word 1704).

The output specification 1730 specifies the fan-out of the instruction, i.e., where should the simulation accelerator store the output of the instruction execution. As illustrated, the output specification 1730 specifies the number of destinations (i.e., the number of fan-outs), and the location of each destination. Each destination location specifies an input of a destination instruction by specifying the group identifier of the destination instruction, the instruction address of the destination instruction, and an input offset targeting a specific input of the destination instruction.

The figure also shows the format of the data memory 320. The data memory stores the corresponding input data for instructions in the instruction memory. For example, the instruction word 1701 has corresponding input area 1771 in the data memory, the instruction word 1702 has corresponding input area 1772 in the data memory, etc. For each instruction, the data memory stores its input data according to the format specified by the instruction (i.e., the input specification 1720), which specifies the number of inputs and the width of each input. When an earlier executed instruction (or source instruction) specifies say, instruction 1700 as one of its destination instructions, the simulation accelerator would store the output of the earlier executed instruction into the input area 1773 of the instruction word 1703 (at the input offset specified by the source instruction targeting one of the inputs in the input area 1773). Though not illustrated, an instruction occupying multiple instruction words would have the corresponding input areas of the multiple instruction words in the data memory for storing input data.

As mentioned, in some embodiments, the simulation accelerator would not write the output of an instruction to its fan-out destinations if the execution of the instruction does not change its output. In some embodiments, the simulation accelerator stores a copy of the output of the instruction at the instruction's input area. This allows the simulation accelerator to determine whether the execution of the instruction has changed its output by comparing the new output of the instruction with its previous output stored at the data memory.

Figure 18:
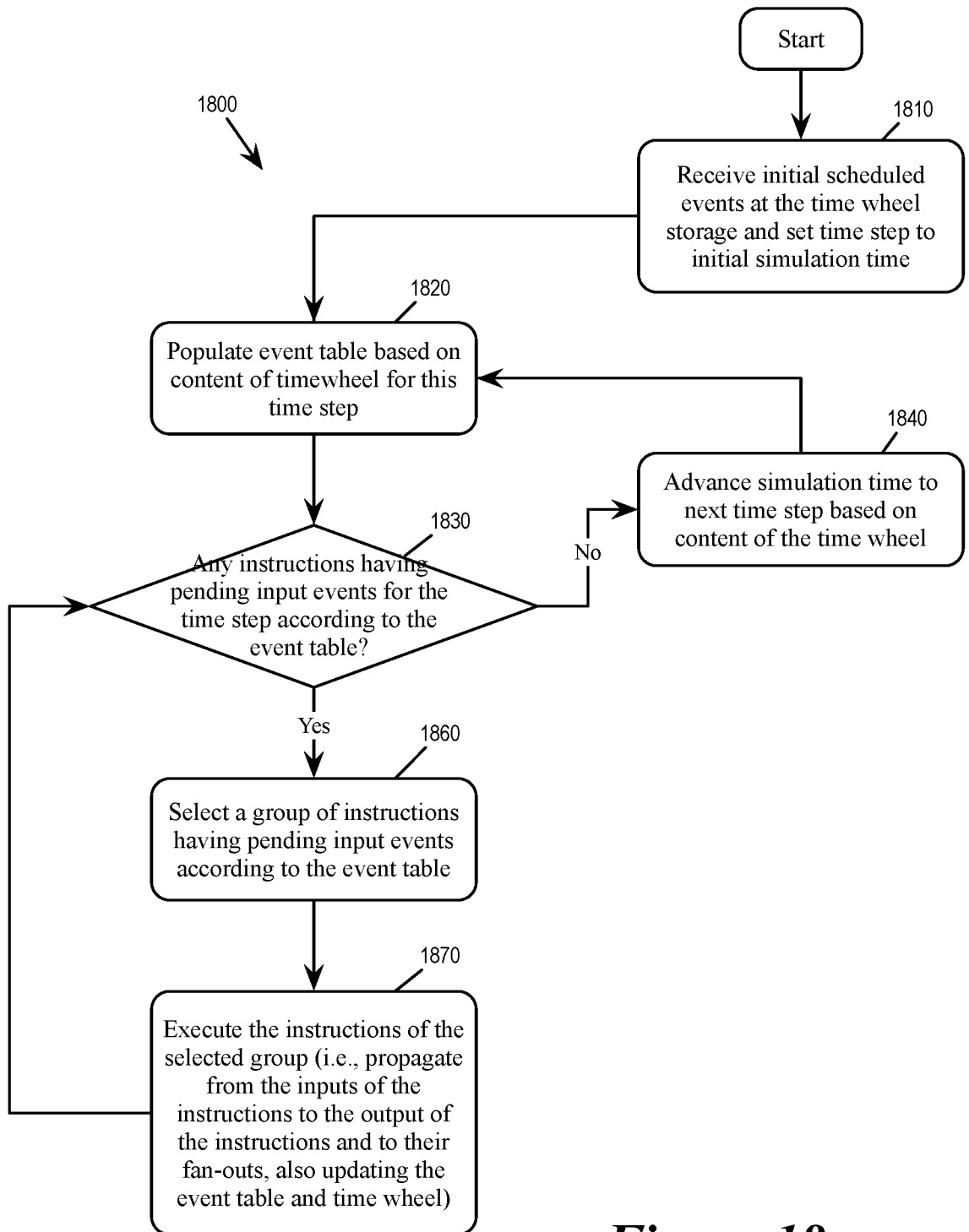
FIG. 18 conceptually illustrates a process for performing RTL simulations by using a simulation accelerator.

FIG. 18 conceptually illustrates a process 1800 for performing RTL simulations by using a simulation accelerator. The simulation system 100 performs the process 1800 when the simulation accelerator 110 executes group-sorted instructions. Before the start of the process 1800, the simulation accelerator 110 has already received compiled RTLs in the form of group-sorted instructions from the compiler 195. The group-sorted instructions are stored in the instruction memory 310 of the simulation accelerator 110.

The process 1800 starts when the simulation accelerator receives (at 1810) a set of initial scheduled events at the time wheel storage. The process also sets the time step to an initial simulation time specified by the user through the host computer (usually 0).

The process populates (at 1820) the event table for the current time step based on the content of the event time wheel. The event table records the pending input event status for the instructions that are active for the current time step.

Next, the process 1800 determines (at 1830) whether any instruction of the testbench has pending input events according to the event table. If the event table is cleared of any pending input event for the current time step (i.e., none of the instructions have pending events for the current time step), the process proceeds to 1840. If the event table indicates that there are still pending input event for the current time step, the process proceeds to 1860.

At 1840, the process 1800 advances the simulation time to the next time step. In some embodiments, the process identifies the next time step based on the content of the time wheel, e.g., the process would advance to the earliest simulation time step with a scheduled event stored in the time wheel. The process then returns to 1820 to populate the event table with the scheduled event of the next time step. In some embodiments, the process bypasses events that are classified as bypass-events and advances to the earliest simulation time step with a perform-event.

At 1860, the process 1800 selects a group of instructions having pending events at their inputs as the current group according to the event table. In some embodiments, when there are multiple groups of instructions having pending input events, the process selects a group whose group identifier is the lowest, or a group that does not depend on any group within with pending input events. The process then proceeds to 1870.

At 1870, the process 1800 executes the instructions of the selected group. In some embodiments, the process fetches the instructions and their corresponding input data into a streaming buffer by using burst mode. The process executes the instructions in the streaming buffer and updates the event table and/or the time wheel with events being propagated or scheduled by the executed instructions. The process also writes output data to the data memory according to the executed instruction, i.e., to input data area of the fan-out destinations of the instruction. In some embodiments, the process performs the operation 1870 by performing the process 1900 of FIG. 19. The process then returns to 1830 to execute another group of instructions in the same simulation time step or in the next simulation time step.

In some embodiments, the process also receives stimulus from the testbench and updates event time wheel for the current simulation time step. In some embodiments, the testbench includes models for providing stimulus to test the DUT RTL. Some of these models are programs compiled to run on the simulation processor 120, and the simulation processor 120 provides the stimulus to the simulation accelerator 110 to drive the RTLs. The received stimulus is stored in the event time wheel as scheduled events that are used to populate event table at the corresponding time steps.

In some embodiments, when updating the event table and/or the time wheel, the process 1800 applies an event filter to determine whether each event being propagated or scheduled is a bypass-event or a non-skip event. In some embodiments, events that are classified as bypass-events are not allowed to enter the event table and/or the time wheel. The compiler configures the event filter to bypass the simulation of certain types of events and minimizes overhead associated with simulating a time step. In some other embodiments, the events generated by the execution of the instructions are not filtered, but the instructions themselves are compiled to bypass events that are classified as bypass-events. The bypassing of simulation events are described in Section III.H below.

Figure 19:
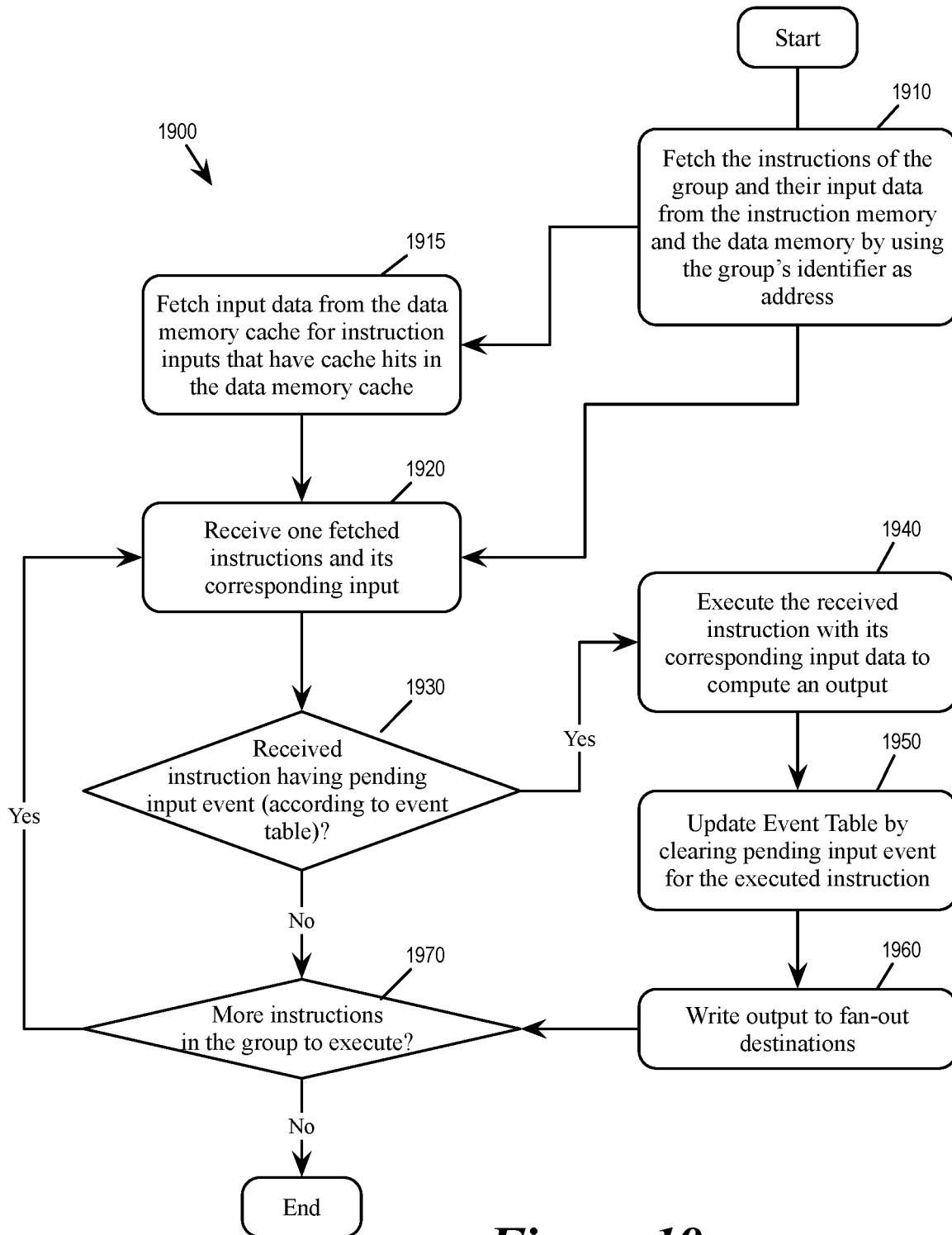
FIG. 19 conceptually illustrates a process for executing a group of instructions.

FIG. 19 conceptually illustrates a process 1900 for executing a group of instructions. In some embodiments, the simulation accelerator performs the process 1900 when it performs the operation 1870.

The process 1900 starts by fetching (at 1910) the instructions of the group and their corresponding input data by using the identifier of the group as address to the instruction memory and data memory. In some embodiments, only instructions that are identified as having pending input by the event table are fetched. The fetched instructions and data are stored into a streaming buffer. For some embodiments in which the simulation accelerator uses a data memory cache to store output data from recently executed instructions, the process also fetches (at 1915) input data from the data memory cache for instruction inputs that have valid corresponding entries in the cache (i.e., cache hit).

Next, the process 1900 receives (at 1920) one fetched instruction and its corresponding input data (from the streaming buffer). The process then determines (at 1930) whether the received instruction has pending input event by examining the event table. If so, the process proceeds to 1940. If the received instruction has no pending input event, the process proceeds to 1970.

At 1940, the process 1900 executes the received instruction with its corresponding input data to compute an output. The process then updates (at 1950) the event table by clearing the pending input event for the executed instruction. The process 1900 then proceeds to 1960.

At 1960, the process 1900 writes the output of the executed instruction to its fan-out destination locations in the data memory. The process then proceeds to 1970. In some embodiments, the simulation accelerator stores the output data write operation in a write queue (e.g., the write queue 1620) while the process 1900 proceeds to execute other instructions.

At 1970, the process 1900 determines whether there are more instructions in the group that have yet to be executed. The process in some embodiments makes this determination by examining whether there are more instructions in the streaming buffer that have yet to be executed. If there is at least one more instruction yet to be executed, the process returns to 1920 to receive and execute another instruction. Otherwise, the process 1900 ends.

Figure 20:
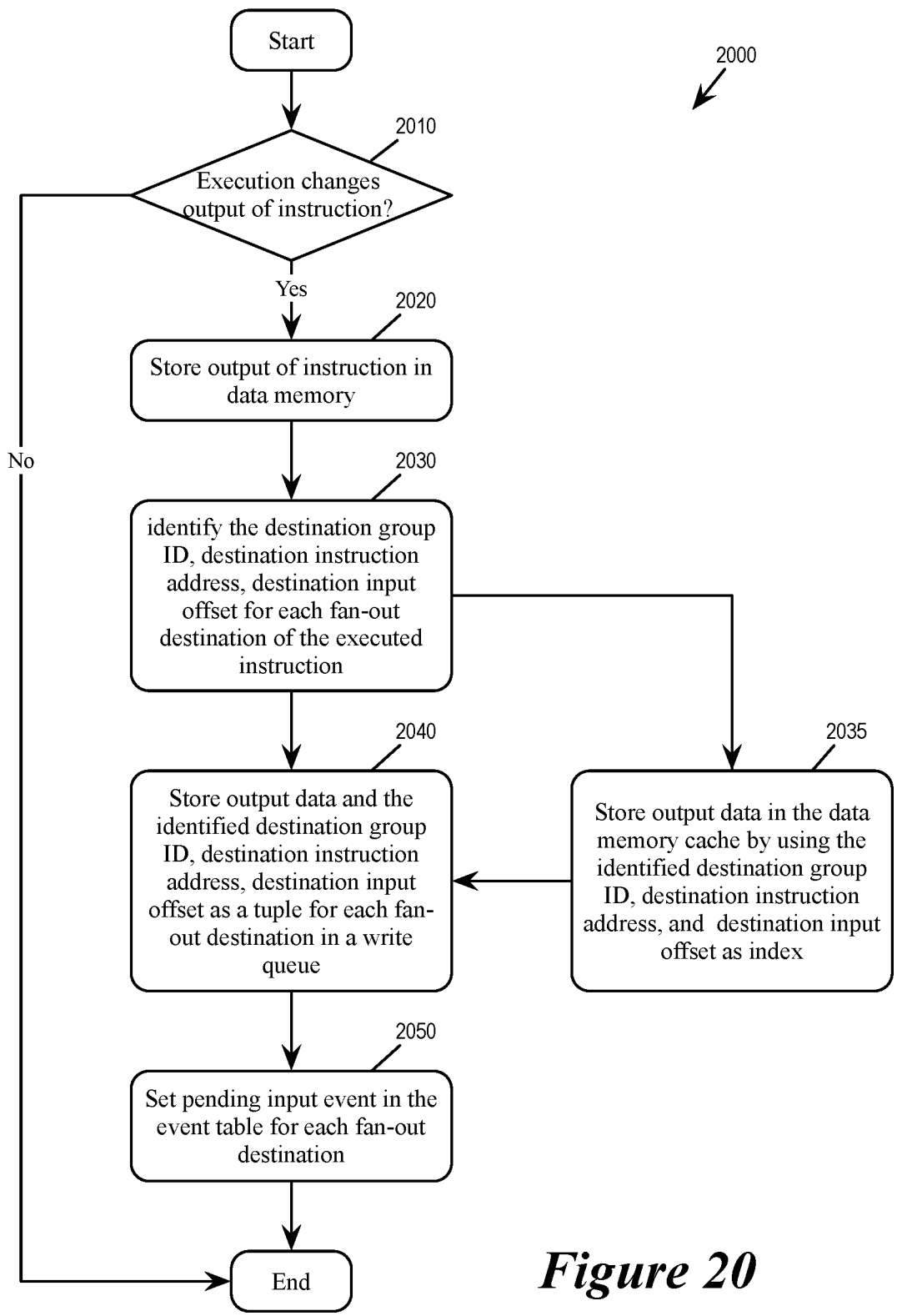
FIG. 20 conceptually illustrates a process for writing output data of an executed instruction to its fan-out locations.

FIG. 20 conceptually illustrates a process 2000 for writing output data of an executed instruction to its fan-out locations. In some embodiments, the simulation accelerator performs the process 2000 as part of the operation 1960 to write the output of the executed instruction to its fan-out destination locations.

The process 2000 starts when the simulation accelerator 110 has completed execution of an instruction and produced an output. The process determines (at 2010) whether the execution of the instruction changes the output of the instruction. In order to eliminate unnecessary write operations, the simulation accelerator in some embodiments propagates the output data of an executed instruction only when the output data has changed from previous execution of the instruction. If the output has changed, the process proceeds to 2020. If the output has not changed, the process 2000 ends without writing to the data memory.

At 2020, the process stores the output of the instruction in the data memory so the simulation accelerator may determine whether a future execution of the instruction has changed the output of the instruction.

The process 2000 identifies (at 2030) the group ID, the instruction address, and the input offset for each fan-out destination of the instruction. These information are available in the instruction memory 310 as part of the output specification 1730 portion of the instruction, which also specifies how many fan-out destinations that the instruction has.

The process 2000 stores (at 2040), for each fan-out destination, the identified group ID, the instruction address, and the input offset as a tuple with the output data into the write queue (e.g., 1620). The content of the write queue will be moved into the data memory later. For some embodiments in which the simulation accelerator uses a data memory cache to store output data from recently executed instructions, the process also stores output data into the data memory cache by using the identified group ID, instruction address, and input offset as index.

Next, the process 2000 sets (at 2050) pending input event in the event table for each fan-out destination. The process 2000 then ends.

As mentioned, in some embodiments, the instruction memory 310 and the data memory 320 are implemented by using DRAMs in order to increase data density and to lower cost. Since DRAMs are divided into pages, the simulation accelerator queues data write operations so the actual writes to the data memory can take place later with smaller page-change penalties. In some other embodiments, the instruction memory 310 and the data memory 320 are implemented by using static RAMs that do not have pages. The simulation accelerator in some of these embodiments do not queue data write operations before writing the output data into the data memory 320.

Figure 21:
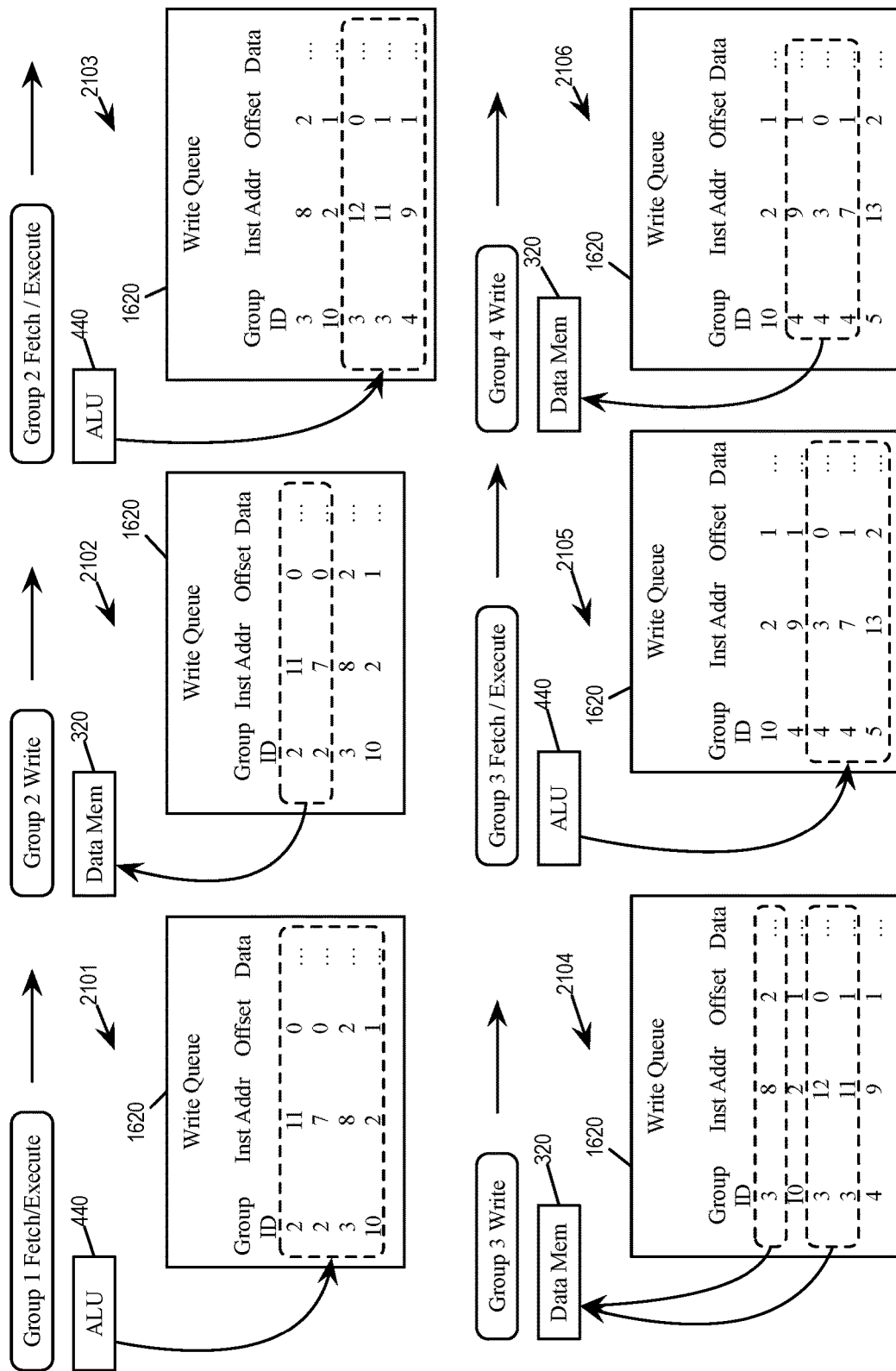
FIG. 21 conceptually illustrates the queuing of output data write operations that are generated by execution of instructions.

FIG. 21 conceptually illustrates the queuing of output data write operations that are generated by execution of instructions. In six stages 2101-2106, the figure illustrates the generation of write operations, the storing of write operations at the write queue 1620, and the moving of the output data from the write queue 1620 to the data memory 320. Though not illustrated, in some embodiments, each output data is also written into the data memory cache 325 so it will be immediately ready for retrieval by upcoming groups.

The first stage 2101 shows the ALU 440 executing fetched instructions for group 1. The execution of each instruction generates output data destined for one or more fan-out destinations. For each fan-out destination, the simulation accelerator generates an n-tuple that includes group ID, instruction address, input offset, and output data. The n-tuple is stored in the write queue 1620. The n-tuple is also stored in the data memory cache 325 so it can be retrieved quickly for the upcoming groups. As illustrated, the execution of the instructions of group 1 has generated write operations for at least four fan-out destinations. These fan-out destinations include instructions in groups 2, 3, and 10.

The second stage 2102 shows the moving of the output data from the write queue 1620 to the data memory 320. For each queued n-tuple of an output data write operation, the simulation accelerator uses the group ID, instruction address, and input offset as write address to write to the data memory 320.

The simulation accelerator may have a limited window for moving the queued write operations into the data memory. In some embodiments, the simulation accelerator would therefore move output data needed by the next group of instructions first. In this example, the simulation accelerator has identified group 2 as the next group of instructions to be executed. The accelerator hence moves the output data destined for group 2 from the write queue 1620 into the data memory 320 (since these are the output data that will be needed for execution). Some embodiments move other queued output data into the data memory as well if doing so would not affect the performance of the simulation accelerator.

The third stage 2103 shows the fetching and execution of the instructions of group 2. For some embodiments in which output data of each instruction is stored in the data memory cache 1620, the inputs of the upcoming group of instructions are already available in the cache so the fetching and execution of instructions can proceed without waiting for the updated input data to be moved into the data memory 320 from the write queue 1620.

For some embodiments in which there is no data memory cache, the fetching and execution of instructions has to wait for updated input data to be stored into the data memory 320 from the write queue 1620. Once the updated input data for group 2 instructions have all been moved into the data memory from the write queue, the instructions of group 2 can safely execute. The execution of the instructions of group 2 produces several more write operations, including at least three fan-out destinations in groups 3 and 4. These outputs are written into the write queue 1620 and/or the data memory cache 325.

The fourth stage 2104 shows the writing of the output data from the write queue 1620 to the data memory 320. Since the simulation accelerator has identified group 3 as the next group of instructions to be executed, the accelerator moves the output data destined for group 3 from the write queue 1620 into the data memory 320.

The fifth stage 2105 shows the fetching and execution of the instruction of group 3. Since the output data of destinations in group 3 have either all been moved into the data memory in stage 2104 from the write queue 1620 or is available in the data memory cache 325, the instructions in group 3 would execute with up-to-date input data. The execution produces several more write operations, including at least three fan-out destinations in groups 4 and 5. These outputs are written into the write queue 1620 and/or the data memory cache 325.

The sixth stage 2106 shows the writing of the output data from the write queue 1620 to the data memory 320. Since the simulation accelerator has identified group 4 as the next group of instructions to be executed, it moves the output data destined for group 4 from the write queue 1620 into the data memory 320.

Figure 22:
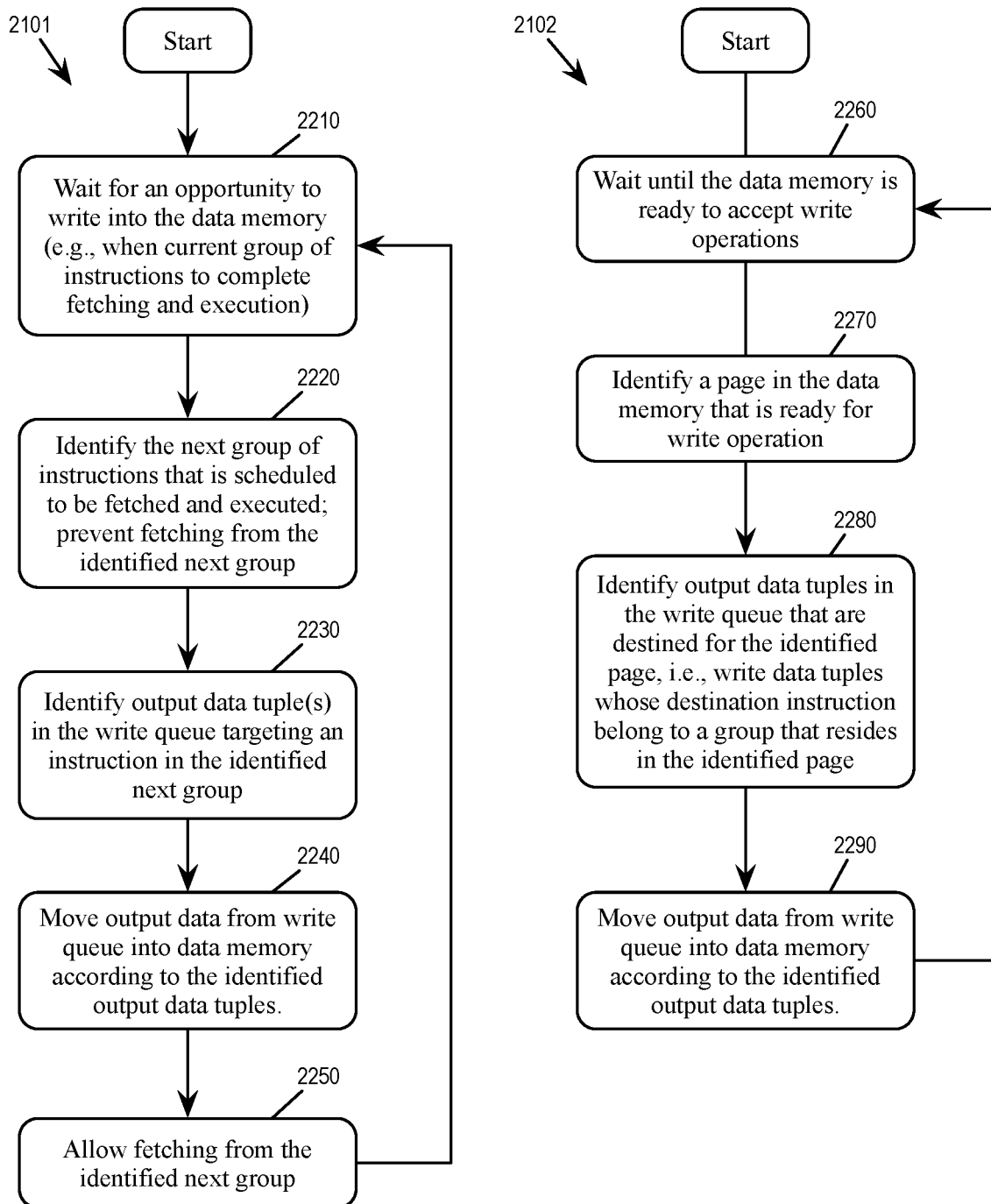
FIG. 22 conceptually illustrates processes for moving output data from the write queue to the data memory.

FIG. 22 conceptually illustrates two processes 2201 and 2202 for moving output data from the write queue to the data memory. In some embodiments, the simulation accelerator performs the processes 2201 and 2202 at the data access unit 420. For some embodiments in which the simulation accelerator does not employ a data memory cache, the simulation accelerator performs the process 2201 for moving output data from the write queue 1620 into the data memory 320 in order to ensure that the input data needed by the next group of instructions will be ready. For some embodiments in which the outputs of instruction execution are also stored in a data memory cache (as discussed above by reference to FIG. 16), the simulation accelerator 110 does not perform the process 2201 but instead perform the process 2202 to move output data from the write queue 1620 into the data memory 320 whenever the data memory is ready to accept write operations into a particular page.

The process 2201 starts whenever there are output data n-tuples waiting in the write queue to be written into the data memory. The process starts by waiting (at 2210) for an opportunity to write into the data memory. For some embodiments in which the data memory is implemented by DRAM, the process would wait for a current burst of read access to complete before moving data from the write queue to the data memory.

Next, the process 2201 identifies (at 2220) the next group of instructions scheduled to be executed. The next group of instructions will need input data at the data memory in order to execute. In some embodiments, the process also sets the necessary control to prevent the fetching of the next group of instructions until the data access unit has completed transporting output data from the write queue to the input area of the instructions of the next group.

The process 2201 next identifies (at 2230) output data tuple(s) in the write queue that are destined for the identified next group. Each output data tuple represents a fan-out write operation to an input of a destination instruction. Each output data tuple is an n-tuple that includes the group ID, the instruction address, and the input offset of the destination, along with the output data.

The process 2201 then moves (at 2240) output data from the write queue into the data memory according to identified output data n-tuples. Specifically, for each identified output data tuple, the process writes the output data of the n-tuple at a location addressed by the group ID, the instruction address, and the input offset of the n-tuple. This would write all output data destined for the identified next group of instructions into the data memory and ready for execution. The process then allows (at 2250) fetching of instructions for the identified next group since the inputs to those instructions are ready. The process 2201 then returns to 2210.

In some embodiments, the process 2201 would continue to move output data destined for other groups from the write queue into the data memory in the background if it does not interfere with other memory access operations.

The process 2202 starts by waiting (at 2260) until the data memory is ready to accept write operations. In some embodiments, the data memory has only one port and can only perform either read operation or write operation but not at the same time. The process 2202 in some of these embodiments wait until the data memory is not performing read operations. The process 2202 then identifies (at 2270) a page in the data memory that is ready for write operations. This is usually the current page that the instruction/data fetching unit is currently fetching instructions and input data from.

Next, the process 2202 identifies (at 2280) output data tuples in the write queue that are destined for the identified page, i.e., output data tuples whose destination instructions belong to a group that resides in the identified page in the DRAM. As mentioned above, each group of instructions is confined to a page in the DRAM.

The process 2202 then moves (at 2290) the identified output data tuples from the write queue to the data memory. Specifically, for each identified output data tuple, the process writes the output data of the tuple at a location addressed by the group ID, the instruction address, and the input offset of the tuple. The process 2202 then returns to 2260.

F. Instrumentation

Instrumentation presents a challenge for traditional hardware emulators. For hardware emulators, changing the set of observed nodes often forces recompilation, because the instrumentation for trace capture may require configuration of routing resources that are already configured to emulate hardware components. This greatly hampers debugging process since the design engineer often has to wait for re-compilation and re-simulation merely to add observability into the testbench or the DUT RTL.

In some embodiments, the simulation accelerator provides the content of the data memory to the host machine to provide observability into the RTL being simulated. Since the content of the data memory records the input data to each instruction of the simulated RTL, these data are already available for observation without recompilation of the testbench. In some of these embodiments, the content of the data memory is periodically dumped out to a mass storage (e.g., the simulation storage 135 or the host storage 130) so they can be available for observation or viewing at the host computer system 190.

Figure 23:
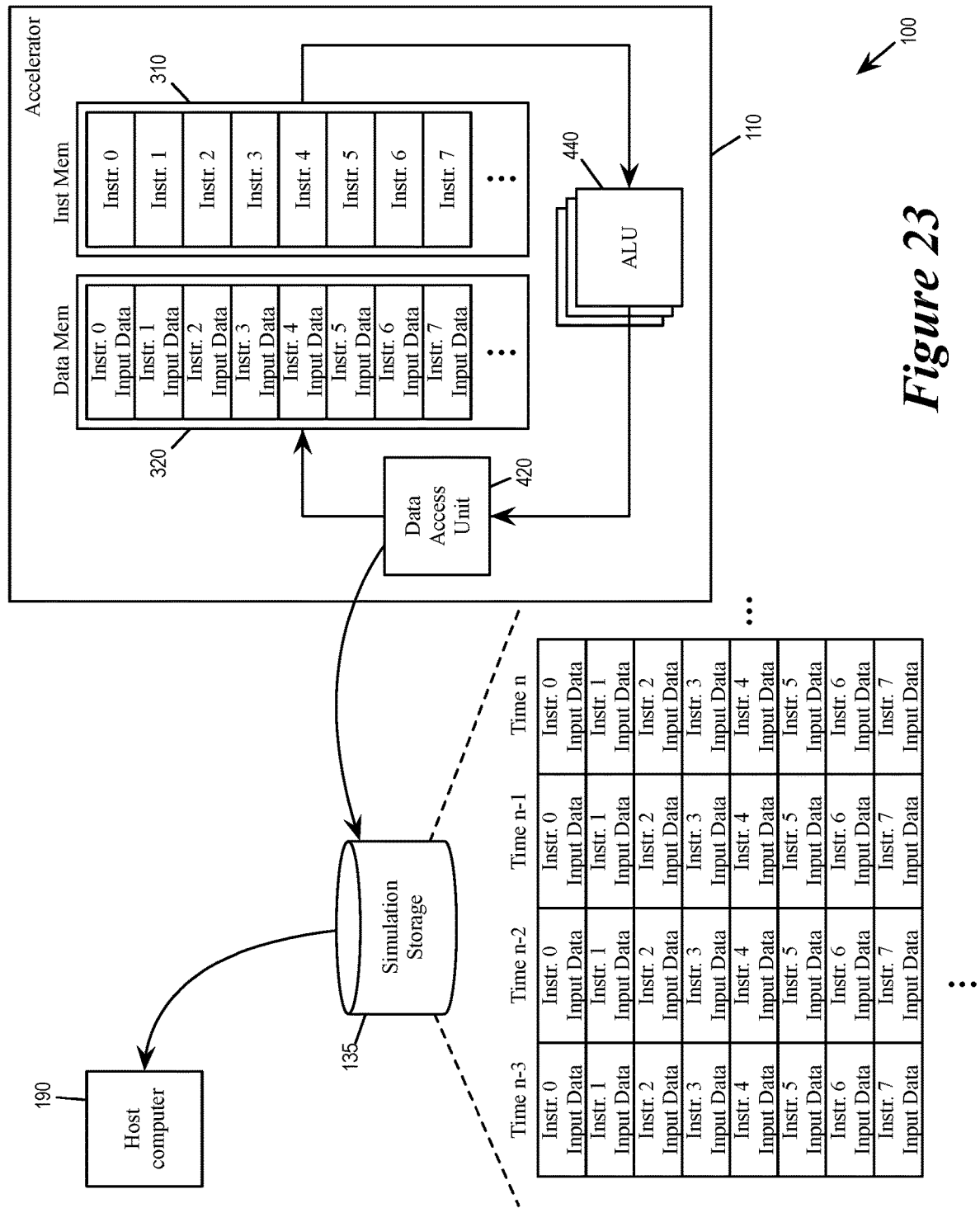
FIG. 23 illustrates instrumentation by the simulation system.

FIG. 23 illustrates instrumentation by the simulation system 100. As illustrated, the simulation accelerator 110 of the simulation system 100 is performing a simulation to test a DUT RTL. The simulation is based on instructions stored in the instruction memory 310 and input data stored in data memory 320. The ALUs 440 executes the instructions and store the outputs of the instructions back to the data memory as inputs for other instructions. The data access unit 420 manages the writing of output data into the data memory 320 and also the dumping out of instrumentation data to the simulation storage 135. In some embodiments, the data access unit 420 periodically dumps out the content of the data memory 320 as instrumentation data into the simulation storage 135, such as whenever the simulation accelerator has completed executing a group of instructions. In some embodiments, the data access unit 420 intercepts the outputs of instructions being written to the data memory 320 and dumps them as instrumentation data to the simulation storage 135. The dump out stored in the simulation storage 135 includes inputs to different instructions at different simulation time steps.

In some embodiments, the instrumentation data is transported to the host computer as simulation result (185) so the host computer 190 can present the instrumentation data to the user for design verification.

G. Event-Based Instruction Fetching

In some embodiments, the simulation accelerator determines which instructions to fetch and execute based on which instructions have pending events in the current time step. When instructions are group-sorted into groups of logically independent instructions, the simulation accelerator determines which group of instructions to fetch and execute based on which groups of instructions have pending events. As mentioned, the event manager 430 maintains the event table 330 keeps track of which instructions have pending events. The content of the event table 330 is used by the simulation accelerator to decide which instruction of which group to fetch and execute.

Figure 24:
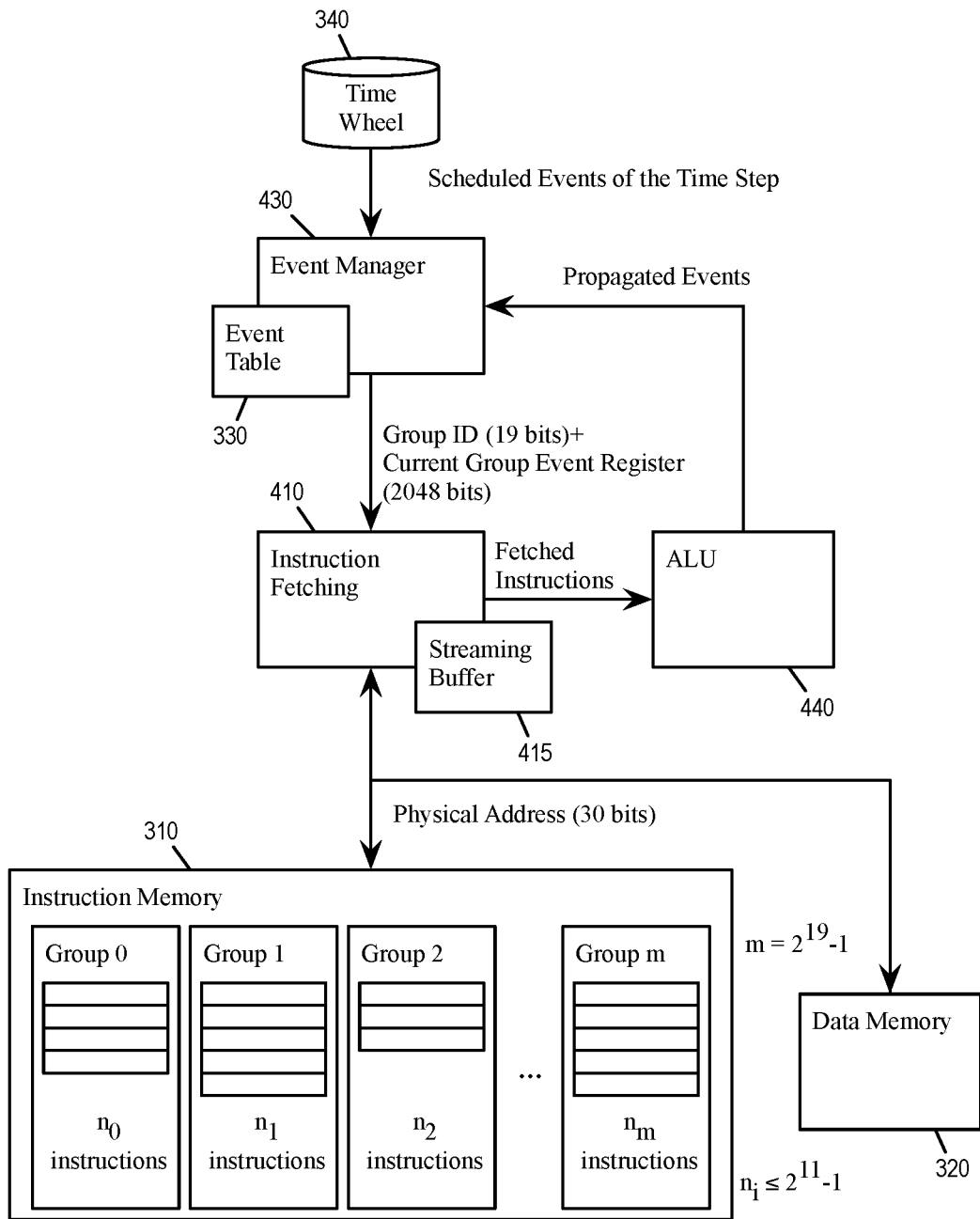
FIG. 24 illustrates the event manager maintaining the event table for instruction fetching.

FIG. 24 illustrates the event manager maintaining the event table for instruction fetching. The figure illustrates the event manager 430 keeping track of pending events by using event table 330. The event manager 430 updates the content of the event table 330 based on the scheduled event supplied by the time wheel as well as propagated event generated by the ALU 440 during the execution of instructions. The content of the event table 330 is used by the instruction fetching unit 410 to generate the physical address for retrieving instructions from the instruction memory 310 as well as for retrieving corresponding input data from the data memory 320. The retrieved instructions and input data are provided to the ALUs 440 for execution through the streaming buffer 415.

The instruction memory 310 stores instructions belonging to different groups. Based on the content of the event table 330, the event manager 430 provides signals to the instruction fetching unit 410 that identifies the group and the instructions within the group to fetch and execute.

Figure 25A:
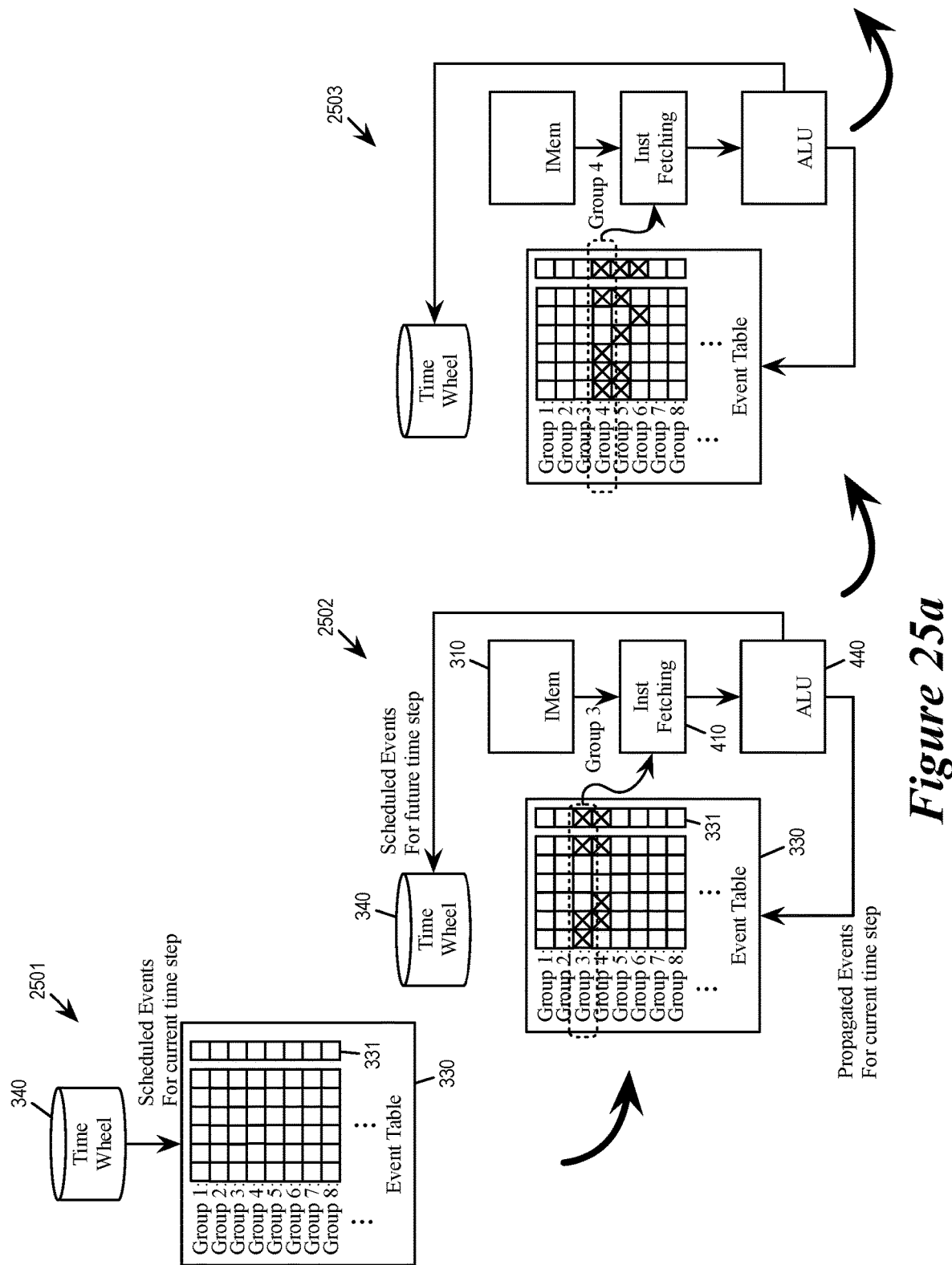
FIGS. 25a-b illustrates using the content of the event table to identify groups and instructions with pending events for execution.
Figure 25B:
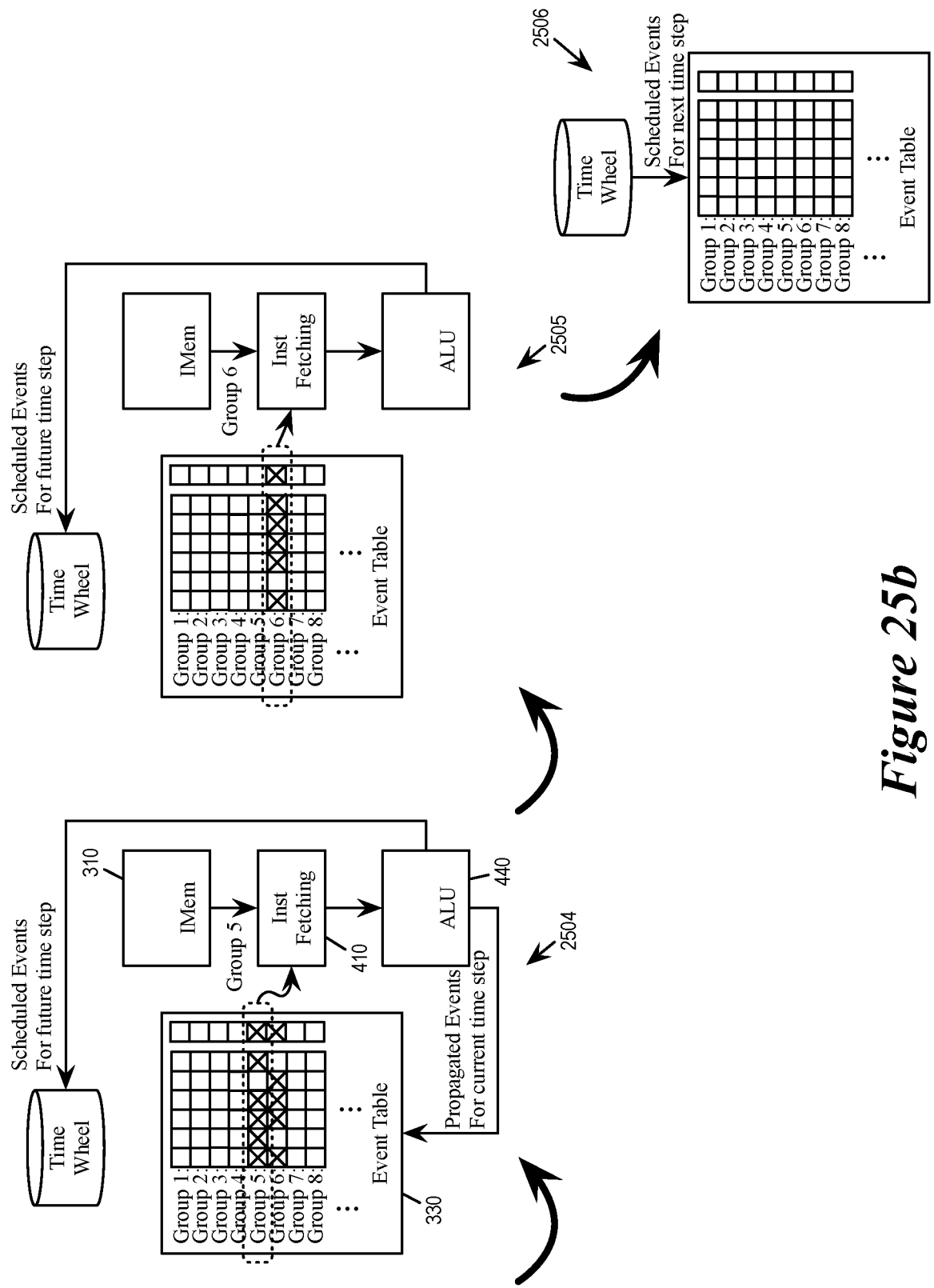

FIGS. 25a-b illustrates using the content of the event table to identify groups and instructions with pending events for execution. The figure illustrates the content of the event table during the simulation of a time step in six stages 2501-2506. The event table 310 is illustrated with a column of squares (also referred to as group event table 311) that correspond to pending event status of the groups as well as rows of squares that correspond to pending event status of the instructions in the different groups. An "X" in a square indicates that the corresponding instruction or group has at least one pending event.

The first stage 2501 shows the event table 330 at the start of the simulation time step. The event table 330 at this time is cleared of any pending event, otherwise the simulation of the previous time step would have continued. The time wheel 340 is storing the scheduled events of the current time step. These scheduled events are retrieved from the time wheel 340 to populate the event table 330.

The second stage 2502 shows the event table being populated with pending events that are based on the scheduled events from the time wheel. As indicated by the squares in the event table 330 and the group event table 331, instructions in groups 3 and 4 have pending events while all other groups have no pending events. Based on this information, the instruction fetching unit 410 fetches instructions in group 3 with pending events from the instruction memory 310 for execution at the ALU 440. The execution of instructions generates some scheduled events for future time steps as well as some propagated events for the current time step. The scheduled events for future times steps are stored in the time wheel 340, while the propagated events are recorded in the event table 330.

At the third stage 2503, the event table is updated with additional pending events for instructions in groups 4, 5, and 6 based on propagated events generated by the ALU 440. The instruction fetching unit 410 in turn fetches instructions with pending events in group 4 from the instruction memory 310 for execution at the ALU 440.

At the fourth stage 2504, the event is updated with additional pending events for instructions in groups 5 and 6 based on propagated events generated by the ALU 440. Pending events for group 4 have been cleared following the execution of group 4 instructions. The instruction fetching unit 410 in turn fetches instructions with pending events in group 5 from the instruction memory 310 for execution at the ALU 440.

At the fifth stage 2505, the event is updated with additional pending events for instructions in group 6 based on propagated events generated by the ALU 440. Pending events for group 5 have been cleared following the execution of group 5 instructions. The instruction fetching unit 410 in turn fetches instructions with pending events in group 6 from the instruction memory 310 for execution at the ALU 440. The execution of instructions generates some scheduled events for future time steps but no propagated events for the current time step.

At the sixth stage 2506, the event table 330 is empty as there are no more pending events in any of the groups. Consequently, the current simulation time step ends and the scheduled event for the next time step will be retrieved from the time wheel 340 to populate the event table.

Although not illustrated in the example of FIGS. 25a-25b, it is worth noting that sometimes events can trigger other events in earlier groups. For example, if a group 6 has an instruction that branches back to a group 3 instruction (e.g., a for-loop), the execution of group 6 instructions may generate events for group 3. The event table 330 (including the group event table 331) would again be updated with bits that correspond to the new pending group 3 events. This would trigger further fetching and execution by the instruction fetching unit 410 and the ALU 440 until the event table 330 becomes empty and the simulation proceeds to the next time step.

The instruction memory can be very large. As illustrated in FIG. 24 above, In some embodiments, the instruction memory may store up to $2^{19}$ groups of instructions, each group having up to $2^{11}$ instructions, hence $2^{30}$ instructions in the instruction memory. Having dedicated pending event status for each group in the event table allows the simulation accelerator to quickly identify a group for execution rather than having to comb through the pending event status of every instruction of every group.

For some embodiments, the event table has several component tables, including an instruction event table and a group event table. Each group has one respective corresponding bit in the group event table for indicating whether the group has at least one pending event in the current time step. Each instruction of each group has a corresponding bit in the instruction event table for indicating whether the instruction has at least one pending event in the current time step. In some embodiments, each instruction has one bit for indicating whether the instruction has a pending event at any of its inputs (so each instruction would have one corresponding bit in the event table regardless of how many inputs the instruction has). In some other embodiments, each instruction has a corresponding bit for each input of the instruction (so an instruction having multiple inputs would have multiple corresponding bits in the event table). The simulation accelerator uses the group event table to identify a group that has at least one pending event. The simulation accelerator also uses the instruction event table to identify instructions having at least one pending event in the identified group. The simulation accelerator sets the identified group as the current group.

In some embodiments, the pending events indicators of the current group are retrieved from the instruction event table to a current group event register. The current group event register records pending events for instructions in the current group The content of the current group event register is used to identify the instructions having pending events in the current group. The simulation accelerator executes the instructions identified by the current group event register as having pending events.

Figure 26:
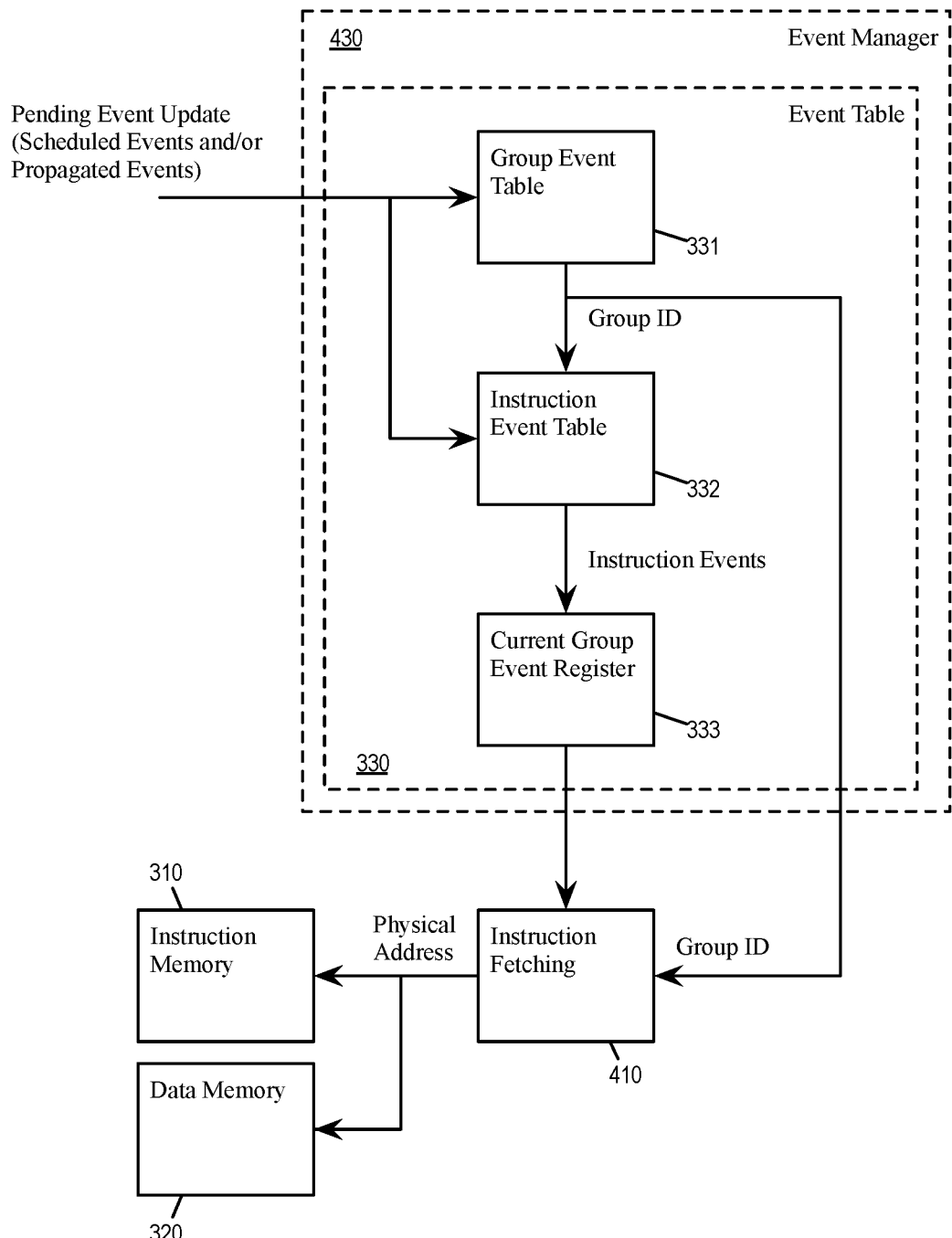
FIG. 26 illustrates the component tables of the event table.

FIG. 26 illustrates the component tables of the event table. The event table 330 is controlled by the event manager 430. The content of the event table is used by the instruction fetching unit 410 to generate physical address for retrieving instructions from the instruction memory 310 and input data from the data memory 320.

The event table 330 includes a group event table 331, an instruction event table 332, and a current group event register 333. The event manager 430 updates the group event table 331 and the instruction event table 332 with new pending events based on propagated events and/or scheduled events. The event manager 430 uses the content of the group event table 331 to identify a current group by generating a group ID. The group ID is in turn used to retrieve the pending event status of the instructions in the current group from the instruction event table 332 to the current group event register 333. The content of the current group event register 333 is in turn used by the instruction fetching unit 410, together with the group ID, to generate the physical address for accessing the instruction memory 310 and the data memory 320.

As mentioned above by reference to FIG. 11, in some embodiments, instructions of a group are split among different channels. Each channel has its own instruction memory and its own event table, and hence its own group event table, instruction event table, and current group event register.

Figure 27:
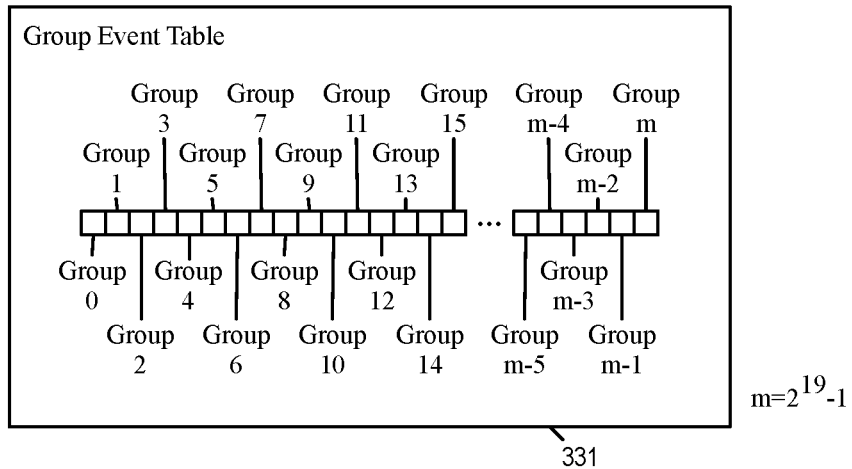
FIG. 27 illustrates example implementations of the group event table, the instruction event table, and the current group event register.
Figure 27:
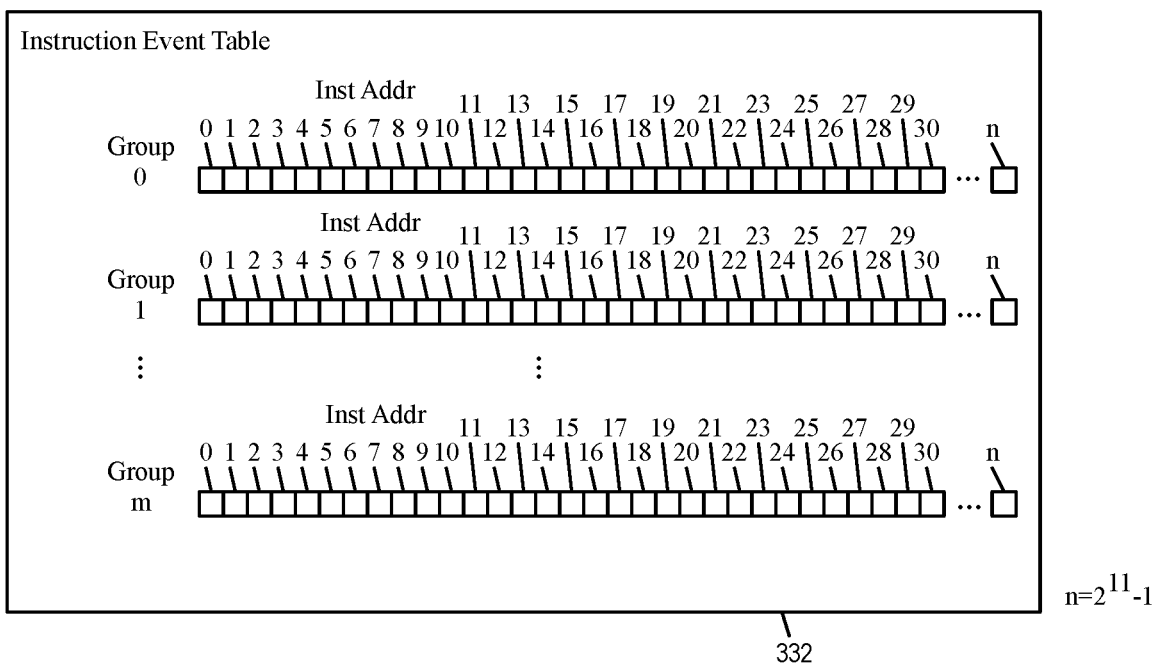
Figure 27:
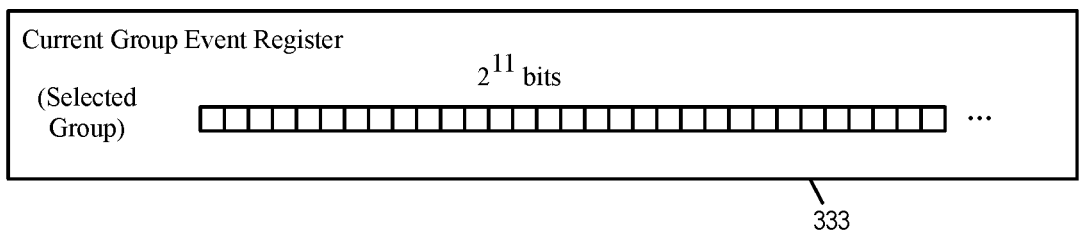

FIG. 27 illustrates example implementations of the group event table 331, the instruction event table 332, and the current group event register 333.

As illustrated, the group event table stores $2^{19}$ bits that correspond to up to $2^{19}$ groups in the testbench. Each bit corresponds to the pending event status of one group. In some embodiments, the bits of the group event table are organized into words and stored in different address locations of a RAM structure.

The instruction event table stores $2^{30}$ bits that corresponds up to the $2^{11}$ instructions in each of the $2^{19}$ groups. In some embodiments, the bits of the instruction event table are organized into words and stored in different address locations of a RAM structure.

The current group event register stores $2^{11}$ bits that corresponds up to $2^{11}$ instructions in one group of instructions. In some embodiments, the bits of the current group event register are not stored in addressed locations of a RAM structure but instead kept as registers that can be immediately accessed by logic circuits of the simulation accelerator.

In some embodiments, different types of memory devices implement the different component tables of the event table based on capacity requirement and latency requirement. For example, the instruction event table is required to store the pending event status of all instructions of all groups (e.g., $2^{30}$ bits for $2^{30}$ instructions) that may be active in the current time step, which can be the entire testbench. So a large capacity/low cost storage structure such as a DRAM is used to implement the instruction event table 331 in some embodiments. The group event table 331 is only required to store group-level pending event status (i.e., one pending event status per group), it therefore requires far less capacity (e.g., $2^{19}$ bits for $2^{19}$ groups) than the instruction event table 332 and can use a storage structure with capacity smaller than the instruction event table 332, such as a SRAM. The smaller capacity storage serving as the group event table 331 also has lower latency than the larger capacity storage serving as the instruction event table 332. In some embodiments, the group event table and the instruction event table are implemented in a same memory structure and the simulation accelerator accesses the group event table before accessing the instruction event table.

The current group event register is required to store only the pending event status of the instructions of the current group ($2^{11}$ bits). However, the content of the current group event register has to be retrieved quickly in order to determine which instructions have pending events and have to be retrieved from the instruction memory. It can be implemented by a storage structure having higher cost and lower capacity than the instruction event table 332 and the group event table 331, as long as the access latency is lower. In some embodiments, the current group event register 333 is implemented as a bank of flip-flops or latches so that every bit can be immediately accessed (e.g., by the instruction fetching unit 410).

In some embodiments, the storage structures used to implement the event table are distinct from the storage structures implementing the instruction memory and the data memory. This guarantees event management operations do not contend with instruction fetching operations for memory access.

Figure 28:
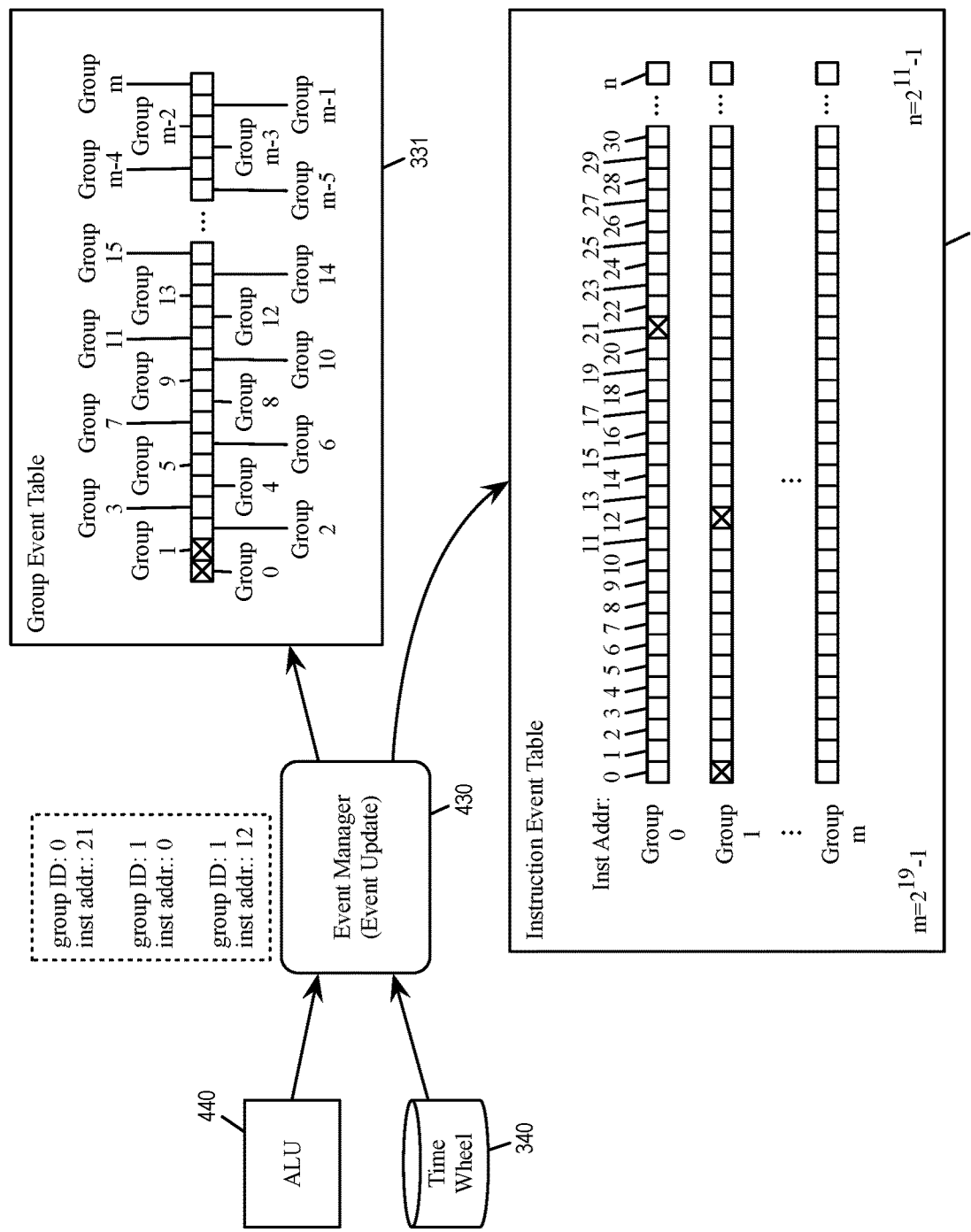
FIG. 28 illustrates an example update operation of the event table with regards to the group event table and the instruction event table.

FIG. 28 illustrates an example update operation of the event table with regards to the group event table 331 and the instruction event table 332. The figure illustrates the event manager 410 receiving pending event update from the ALU 440 and the time wheel 340. In the example, the event manager 430 receives three events: a pending event for an instruction starting at instruction address 21 of group 0, a pending event for an instruction starting at instruction address 0 of group 1, and a pending event for an instruction starting at instruction address 12 of group 1. Correspondingly, the event manager updates the instruction event table by setting the bits for group 0: instruction address 21; group 1: instruction address 0; and group 1: instruction address 12. In addition to setting bits in the instruction event table 332, the event manager also sets corresponding bits in the group event table 331, including a bit for group 0 and a bit for group 1. Though there are at least two instructions with pending events in group 1, only 1 bit is set for group 1 in the group event table 331 since the group event table records only pending events at the group level.

Figure 29A:
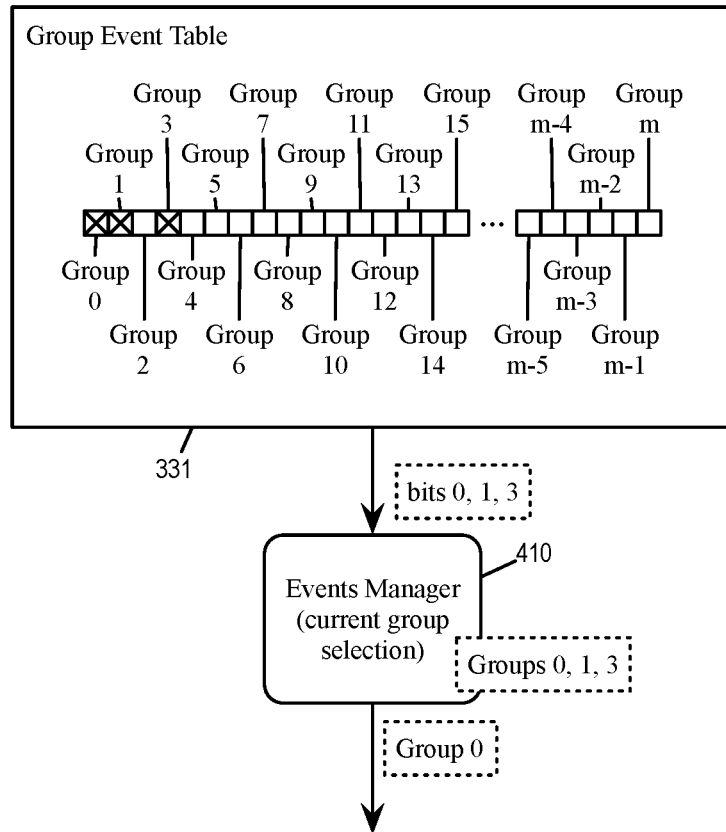
FIGS. 29a-b illustrates an example instruction fetching operation based on the content of the group event table and the instruction event table.
Figure 29B:
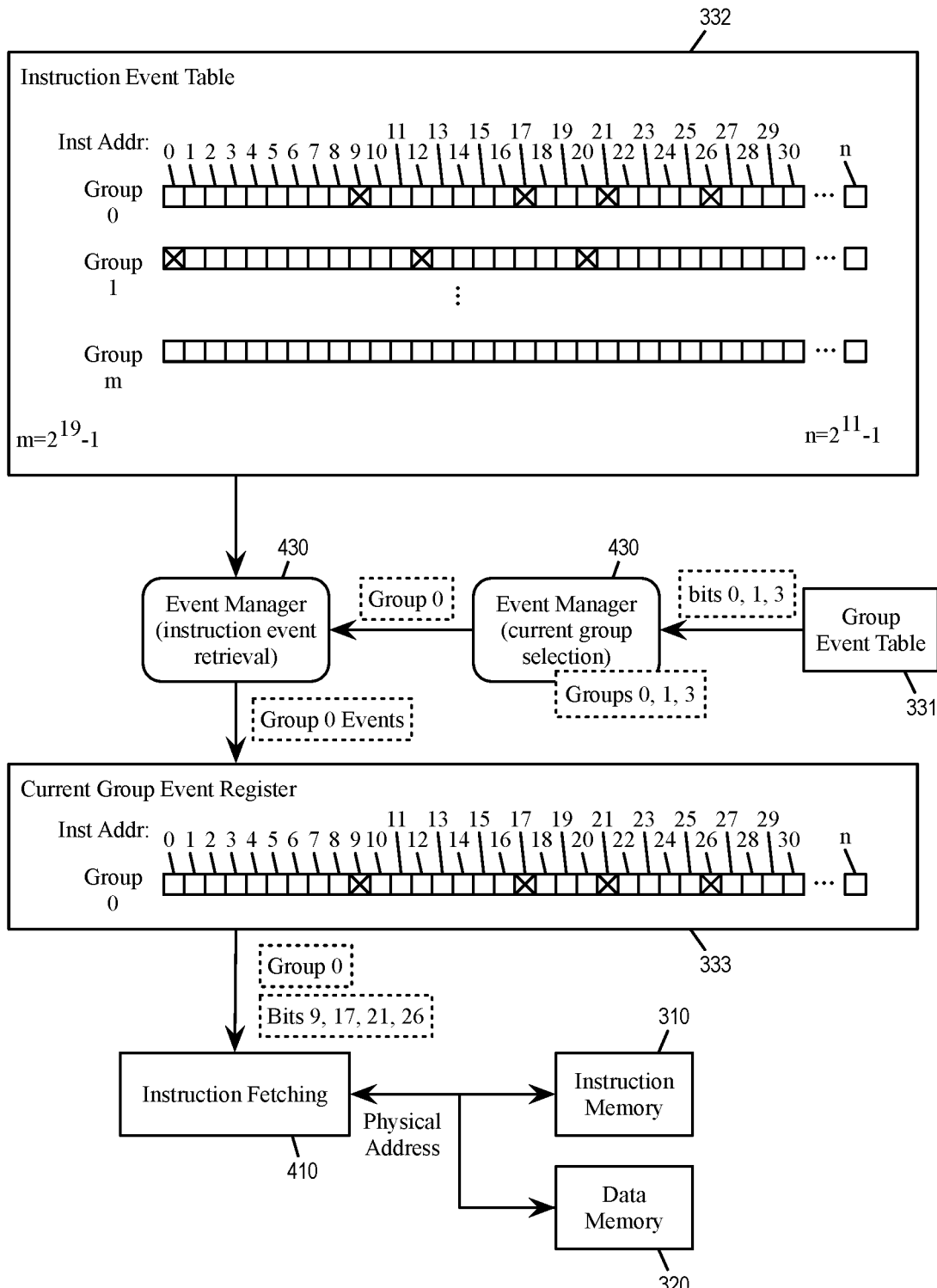

FIGS. 29a-b illustrates an example instruction fetching operation based on the content of the group event table 331 and the instruction event table 332. As illustrated in FIG. 29a, the group event table 331 has bits set for groups 0, 1, and 3. The event manager 430 retrieves the content of the group event table and determines that groups 0, 1, and 3 have instructions with pending events. The event manager 430 also selects group 0 as the current group. Based on the selection of group 0 as the current group, the event manager 430 retrieves the pending event status for the instructions of group 0 from the instruction event table 332.

As illustrated in FIG. 29b, the retrieved pending event status for the instructions of the current group are stored at the current group event register 333 and ready for access by the instruction fetching unit 410 as register bits. In the example, bits that correspond to instruction addresses 9, 17, 21, and 26 of the current group event register are set. The instruction fetching unit 410 in turn uses the identity of the current group (i.e., group 0) together with the content of the current group event register 333 to generate physical address for accessing the instruction memory 310 and data memory 320.

As mentioned earlier, an instruction may occupy one instruction word or multiple instruction words in the instruction memory 310, each instruction word corresponding to a unique instruction address within its group. Each bit in the current group event register (as well as in the instruction event table) corresponds to an instruction word rather than an instruction, i.e., an instruction may have multiple corresponding bits in the current group event register for the multiple instruction words that the instruction occupies. Different instructions may occupy different numbers of instruction words and correspondingly have different numbers of bits in the current group event register.

In some embodiments, the bit that corresponds to the first address location occupied by the instruction is used to indicate whether the instruction has a pending event in the current time step, and the bit position of each pending event in the current group event register is used by the instruction fetching module to identify the starting address location occupied by the instruction. In other words, each instruction word of the current group has a corresponding bit in the current group event register for indicating whether an instruction starting at the instruction word has at least one pending event in the current time step.

Figure 30:
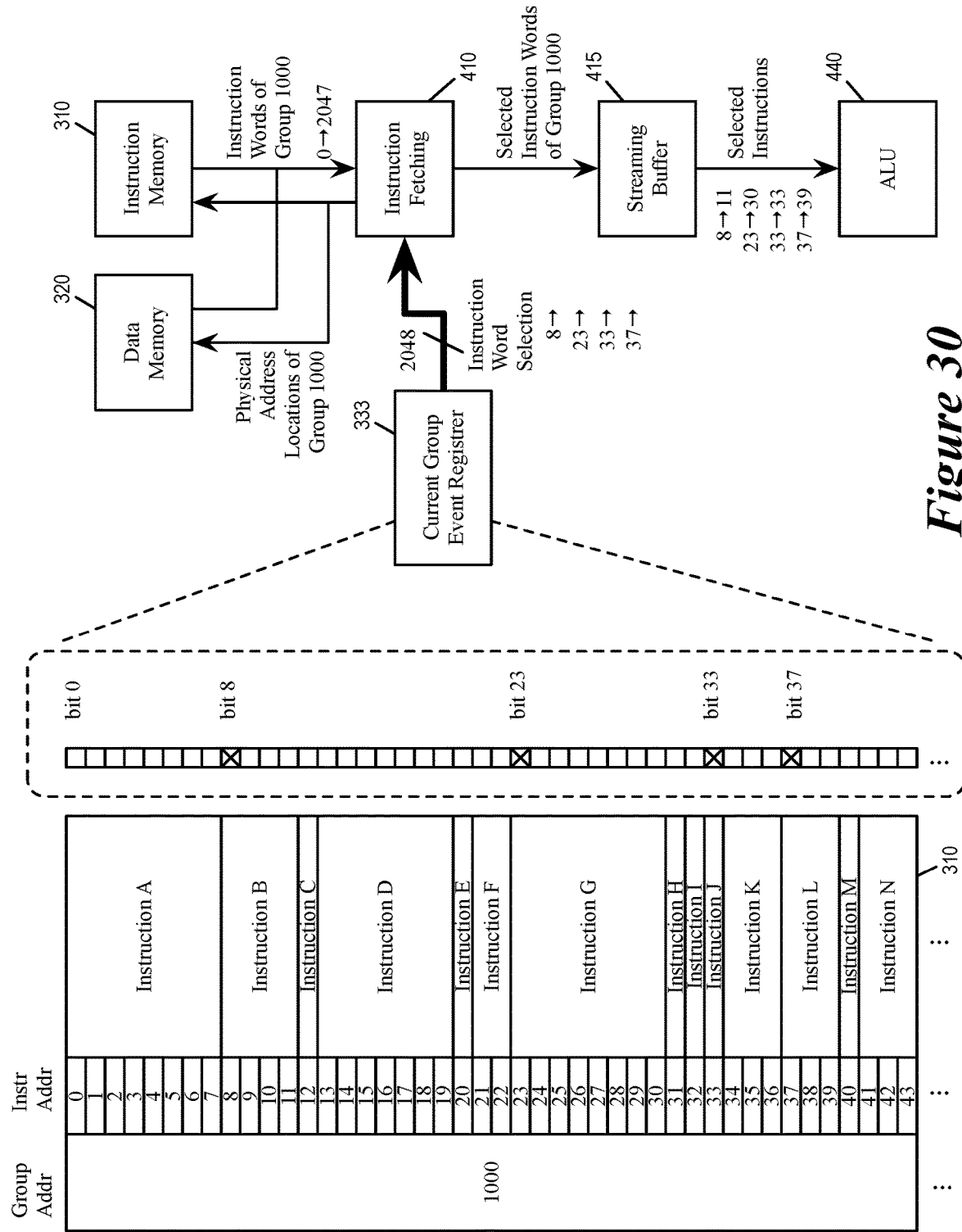
FIG. 30 shows the correspondence between the bit positions of the pending events in the current group event register and the instructions stored in the instruction memory.

FIG. 30 shows the correspondence between the bit positions of the pending events in the current group event register and the instructions stored in the instruction memory. The figure illustrates a snippet of the instruction memory containing instructions belonging to an example group (group ID 1000). The instructions of the example group come in different sizes, for example, instruction A occupies 8 instruction words, instruction B occupies 4 instruction words, while the instructions C, E, H, I, J, M occupy one instruction word each. Each instruction address corresponds to one instruction word, and an instruction may start at an instruction address location and then extend across multiple instruction address locations to occupy multiple instruction words. For example, instruction A starts from instruction address 0 and extends to instruction address 7, instruction B starts from instruction address 8 and extend to instruction address 11, while instruction C occupies only instruction address location 12.

When the group 1000 is selected to be the current group, the pending event status of the instructions of the group 1000 is retrieved from the instruction event table 332 to the current group event register 333. Each bit of the current group event register corresponds to one instruction address location, i.e., one instruction word. As mentioned, in some embodiments, a bit that corresponds to the first address location occupied by an instruction is used to indicate whether the instruction has a pending event in the current time step. In the example illustrated in FIG. 30, bits 8, 23, 33, and 37 are marked, indicating to the instruction fetching unit 410 that instruction address locations 8, 23, 33, and 37 are starting address locations of instructions that have pending events. These instructions address locations are the starting locations of instructions B, G, J, and L, respectively.

FIG. 30 also illustrates using the pending event status of the instructions of the current group to fetch instruction from the instruction memory for execution by the ALU. As illustrated, the bit values of the current group event register 333 are provided to the instruction fetching unit 410. Based on the marked bit positions in the current group register 333, the instruction fetching unit 410 determines from which instruction address location to start fetching instructions for execution.

As mentioned, in some embodiments, the instruction memory 310 and the data memory 320 are implemented by DRAMs, where instructions belonging to the same group are stored in the same page and can be retrieved quickly in burst mode. In some of these embodiments, the instruction fetching unit 410 retrieves all instruction words of the current group from the instruction memory and then uses the content of the current group event register 333 to determine which instruction words to pass on to the ALU 440 (through the streaming buffer 415) and which instruction words to discard.

In some embodiments, each instruction cannot exceed certain maximum size (e.g., 8 instruction words). The instruction fetching unit 410 would deliver the maximum number of instruction words for each marked bits onto the ALU, starting from the address location that corresponds to the marked bit position in the current group event register 333. In the example illustrated, the instruction fetching unit 410 delivers 8 instruction words starting from each of instruction address locations 8, 23, 33, and 37. Specifically, the instruction fetching units 410 allows instruction words 8-15 (including instruction B), instruction words 23-30 (including instruction G), and instruction words 33-44 (including instructions J and L) to reach the ALU 440. Though not illustrated, each instruction word being fetched by the instruction fetching unit 410 is accompanied by its corresponding input data fetched from the data memory 320, since the instruction memory 310 and the data memory 320 share the same physical address.

The ALU may determine the end of each instruction word in a variety of different ways. In some embodiments, the length of each instruction is encoded in the instruction or the data, and the ALU decodes the fetched instruction or the data to determine the length of each instruction. In some embodiments, the lengths of the instructions are copied to the event table for the ALU to identify the end of each instruction.

Figure 31:
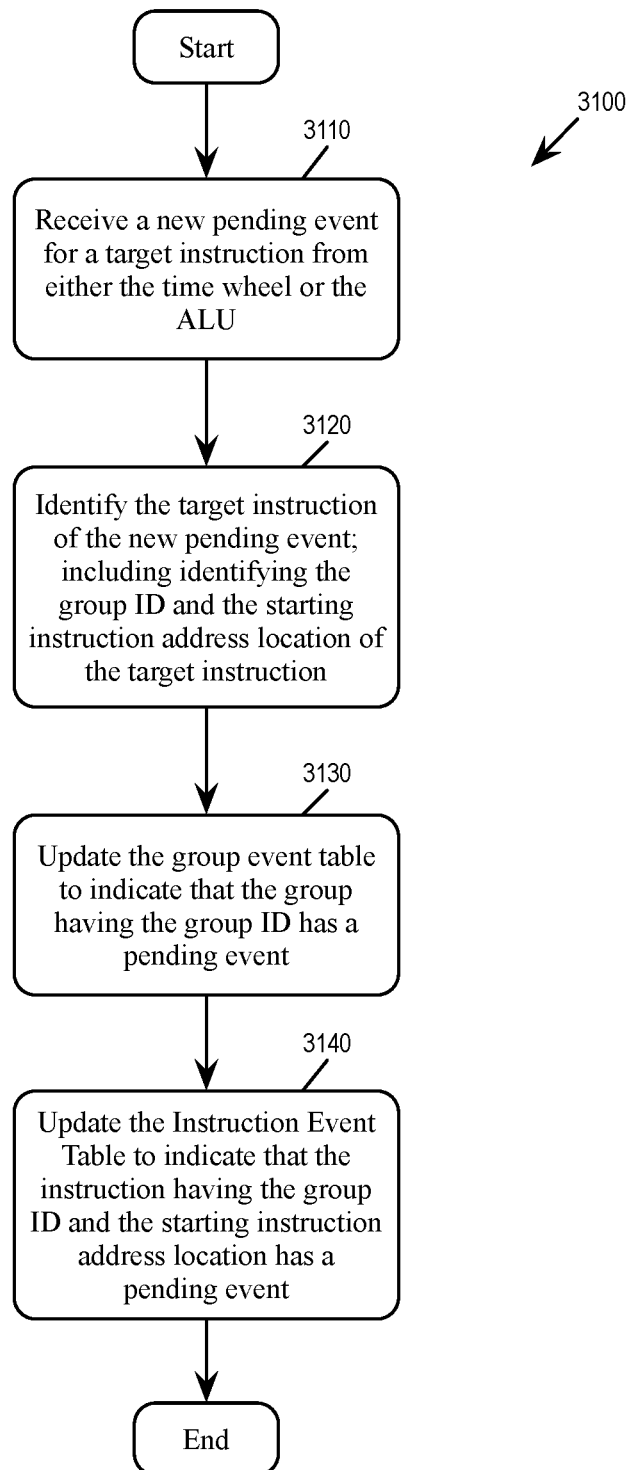
FIG. 31 conceptually illustrates a process for updating an event table with new pending events.

FIG. 31 conceptually illustrates a process 3100 for updating an event table with new pending events. The simulation system 100 performs the process 3100 when the simulation accelerator 110 executes group-sorted instructions. In some embodiments, the process 3100 is performed by the event manager 430 of the simulation accelerator 110. Before the start of the process 3100, the simulation accelerator 110 has already received compiled RTLs in the form of group-sorted instructions from the compiler 195. The group-sorted instructions are stored in the instruction memory of the simulation accelerator 110.

The process 3100 starts when the event manager 430 receives (at 3110) a new pending event for a target instruction of the current step from either the time wheel or the ALU. The pending event can be a scheduled event that is scheduled to execute at the start of the current time step or a propagated event generated during instruction execution of the current time step. The process also identifies (at 3120) the target instruction of the received pending event by identifying the group ID and the starting instruction address location.

The process updates (at 3130) the group event table 331 based on the group ID of the target instruction to indicate that the group of instructions having the group ID has at least one pending event. In some embodiments, the process marks a bit that corresponds to the group ID to indicate a pending event for the group of instructions. The process also updates (at 3140) the instruction event table 332 to indicate that an instruction having the starting instruction address location and the group ID has a pending event. In some embodiments, the process marks a bit in the instruction event table that corresponds to the starting instruction address location of the target instruction of the group. The updating of the group event table 331 and the instruction event table 332 are described by reference to FIG. 28 above.

Figure 32:
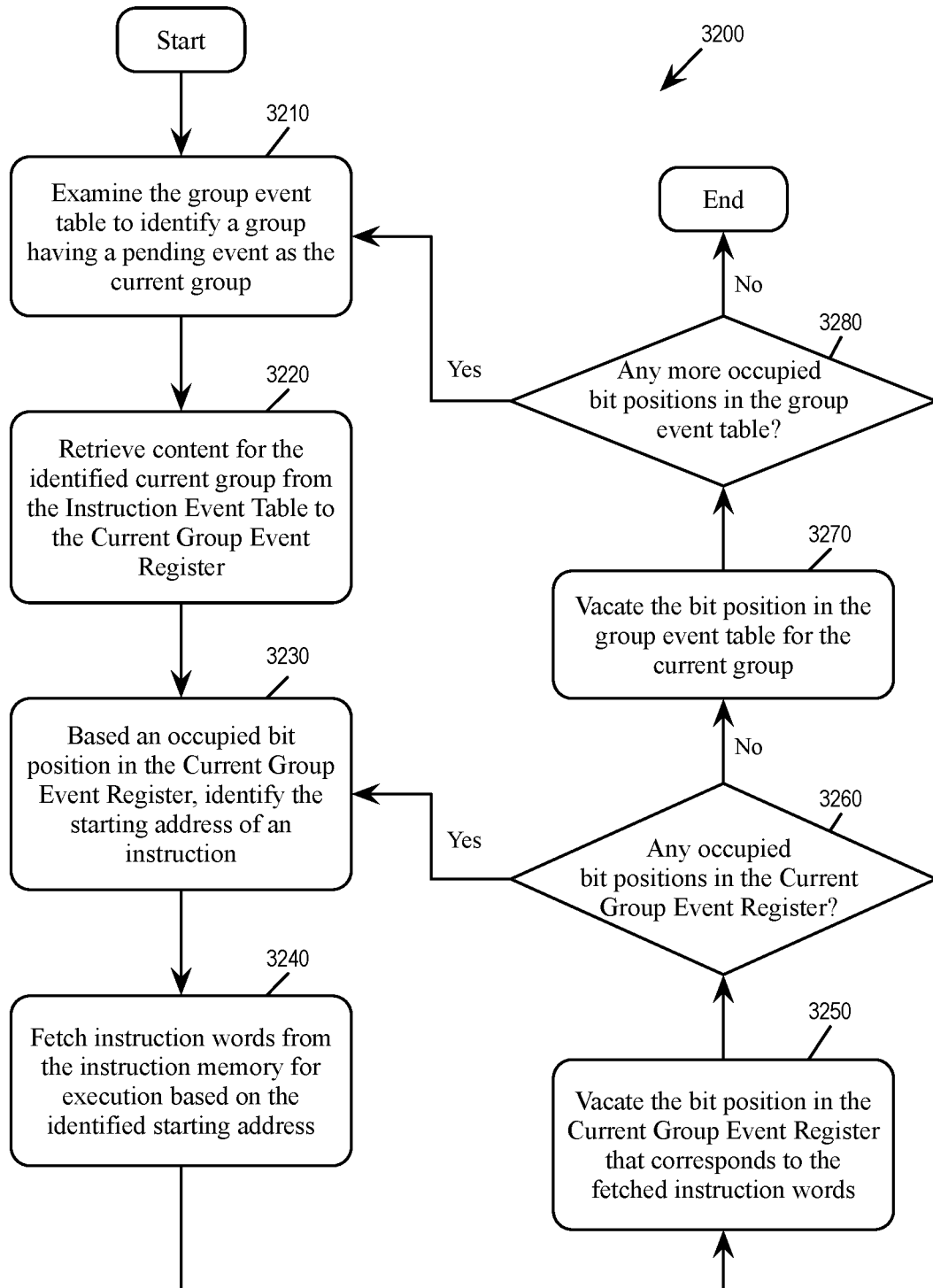
FIG. 32 conceptually illustrates a process for using the content of the event table to select instructions for execution.

FIG. 32 conceptually illustrates a process 3200 for using the content of the event table to select instructions for execution. The simulation system 100 performs the process 3200 when the simulation accelerator 110 executes group-sorted instructions. In some embodiments, the process 3200 is performed by the event manager 430 and the instruction fetching unit 410 of the simulation accelerator 110. Before the start of the process 3200, the simulation accelerator 110 has already received compiled RTLs in the form of group-sorted instructions from the compiler 195. The group-sorted instructions are stored in the instruction memory of the simulation accelerator 110. In some embodiments, the process 3100 and the process 3200 are concurrent processes taking place in the simulation accelerator.

The event manager 430 starts the process 3200 whenever the event table is populated with at least one pending event, e.g., after the simulation system has performed the process 3100 to update the event table. The process examines (at 3210) the group event table to identify a group having a pending event as the current group. There may be multiple groups having pending events, and among these, the event manager 430 selects a group that has the least logical dependence on other groups with pending events as the current group. (For some embodiments, this is the group with the earliest or smallest group ID number).

The process then retrieves (at 3220) the content for the identified current group from the instruction event table 332 to the current group event register 333. The instruction event table 332 contains pending event status for all instructions of all groups for the current time step, and the process retrieves the pending event status of the instructions of the current group to store in the current group event register 333. The identification of the current group and the retrieval of pending event status for the current group from the instruction event table 332 to the current group event register 333 is described by reference to FIG. 29*a-b* above.

Based on an occupied bit position in the current group event register, the process identifies (at 3230) the starting address of an instruction. This instruction is an instruction having a pending event and will be executed, as a bit that corresponds to the starting/first address location occupied by the instruction is used to indicate whether the instruction has a pending event in the current time step. The process then fetches (at 3240) instruction words from the instruction memory for execution starting from the identified starting address location. In some embodiments, the instruction fetching unit fetches a maximum number of instruction words for each identified starting address location and letting the ALU determine the start and end of each instruction. Fetching instructions based on content of the current group event register is described by reference to FIG. 30 above. The process also vacates (at 3250) the bit position(s) in the current group event register that correspond to the fetched instruction words.

Next, the process determines (at 3260) whether there are any more occupied bit positions in the current group event register, i.e., whether the current group event register is empty and all instructions in the current group with pending events have been fetched. If there are still occupied bits in the current group event register (i.e., there is still at least one instruction with a pending event that has not been fetched), the process returns to 3230 to fetch the corresponding instructions. If there is no occupied bit position in the current group event register, the process proceeds to 3270.

At 3270, the process vacates the bit position in the group event table 331 that corresponds to the current group. The process then determines (at 3280) whether there are additional occupied bit positions in the group event table, i.e., whether the group event table is empty and whether there are groups of instructions with pending event that have yet to be executed. If there are occupied bit positions in the group event table (e.g., because the process 3100 has updated the group event table or because there are multiple groups with pending events), the process returns to 3210 to select a group as the current group and execute the instructions in the selected the group. If there is no occupied bit positions in the group table, i.e., no group of instructions has pending events for this time step, the process 3200 ends, or at least until the group event table is populated with new pending events for the current time step or the next time step.

H. Event Skipping

An event is typically a transition occurring at a signal construct in the testbench. Such a signal construct can be a port of the DUT, a port of a module within the DUT, a wire in a testbench model, a wire in the DUT, a connection point, or another construct at which a signal can occur. In a testbench and/or DUT that has been compiled into accelerator instructions, an event-associated signal construct can also be an input of an instruction or an output of an instruction.

In a typical IC design, different types of scheduled events at a same signal construct may have vastly different number of fan-outs. In other words, one type of schedule events at the signal construct may trigger many instructions to execute, while another type of scheduled events may trigger very few or no instructions to execute. For example, it is common that only one type of clock edge events (usually the rising edges or the "posedge" events) leads to signal propagation and execution of instructions, while the other type of clock edge events (usually the falling edges or the "negedge" events) do not lead to execution of instructions other than to schedule the next clock edge event. This is because most logic designs use only rising edges to clock data over at flip-flops. For example, as illustrated in the code segment 1405 of FIG. 14, "posedge" events of the clock signal "fast_clk" are used by the statement 1423 to advance the value of the signal "counter", while "negedge" event of the clock signal "fast_clk" is not used other than to toggle the polarity of the clock.

For some embodiments, the simulation system incurs overhead computation cost whenever the simulation accelerator is used to perform event-driven simulations. Some of the overhead cost is incurred for every time step that the accelerator has to process pending events, regardless of whether the accelerator executes many instructions or no instruction at all. These overhead may include communications between the simulation processor 120 and the simulation accelerator 110.

In some embodiments, the simulation system classifies events into bypass-events and perform-events. The simulation system executes instructions based on the perform-events and skips simulation for the bypass-events. For example, in some embodiments, each clock transition event is classified as a bypass-event or a perform-event based whether the type of transition at the clock signal, i.e., whether the clock transition is a positive edge transition or a negative edge transition. The simulation system performs event-driven simulation for time steps with perform-events while bypassing event-driven simulation for time steps with only bypass-events.

In some embodiments, the simulation accelerator performs simulation by executing instructions that are triggered directly or indirectly (in a same time step) by the perform-events while not allowing the bypass-events to trigger the execution of any instructions. In some embodiments, the event table is populated with perform-events but not bypass-events. In some embodiments, the event time wheel storage stores only perform-events but not bypass-events. The simulation accelerator generates simulation result data for perform-events but not for bypass-events.

In some embodiments, the simulation system performs event-driven simulation of a testbench having a clock signal that (i) transitions from a first polarity to a second, opposite polarity at a first transition event, (ii) transitions from the second polarity back to the first polarity at a second transition event after the first transition event, and (iii) transitions from the first polarity to the second polarity at a third transition event after the second transition event. The simulation system performs event-driven simulation of the testbench at a first time step based on the first transition event. The simulation system advances simulation time from the first time step past a second time step of the second transition event to a third time step of the third transition event without performing event-driven simulation based on the second transition event. The simulation system then performs event-driven simulation of the testbench at the third time step based on the third transition event.

Figure 33:
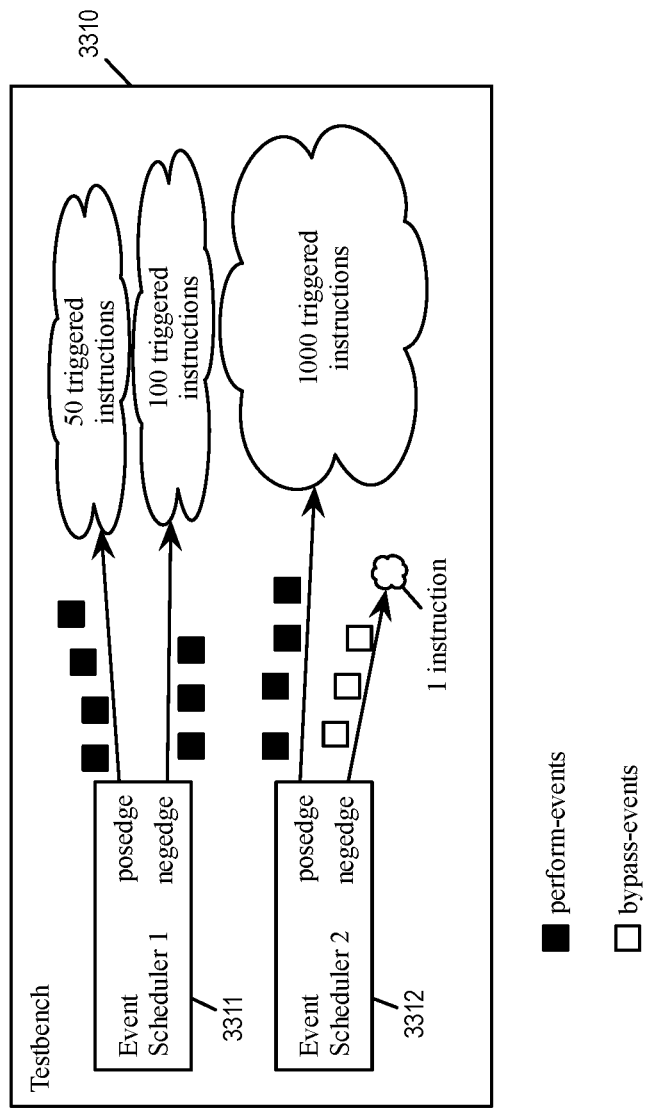
FIG. 33 conceptually illustrates a testbench whose scheduled events are classified into bypass-events and perform-events.

FIG. 33 conceptually illustrates a testbench 3300 whose scheduled events are classified into bypass-events and perform-events. As illustrated, the testbench 3300 includes "event schedulers" 3311 and 3312. For some embodiments, these "event schedulers" correspond to statements in a testbench or RTL that generates scheduled events, such as clock generation statements (e.g., statements 1421 and 1422) or delayed assignment statements (e.g., statement 1414). Both the event schedulers 3311 and 3312 generate two types of scheduled events: "negedge" and "posedge". For the event scheduler 3311, both "posedge" and "negedge" events trigger some instructions in the testbench 3300. For the event scheduler 3312, the posedge events trigger many instructions while the negedge events trigger only 1 instruction.

Rather than performing event-driven simulations for all events produced by the event schedulers in the testbench 3310, the scheduled events are classified into perform-events and bypass-events and the simulation system performs event-driven simulation for the perform-events but not the bypass-events. As illustrated, for the event scheduler 3311, both negedge events and posedge events are classified as perform-events (black squares). However, for the event scheduler 3312, the negedge events are classified as bypass-events (white squares) while the posedge events are classified as perform-events (black squares). The simulation system in turn performs event-driven simulation for time steps with perform-events while bypassing event-driven simulation for time steps with only bypass-events.

Figure 34:
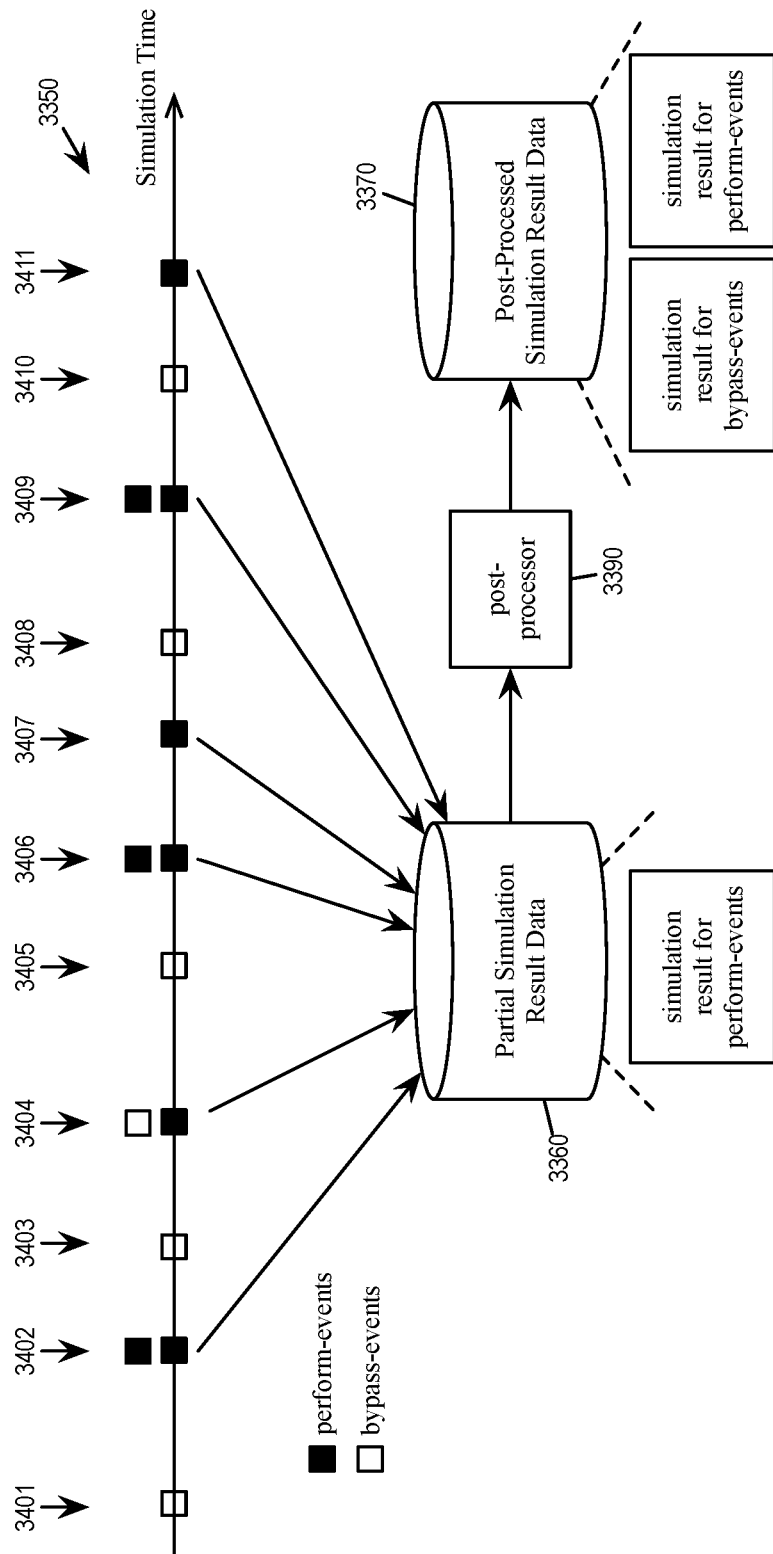
FIG. 34 conceptually illustrates an event-driven simulation that bypasses event-driven simulation for time steps with only bypass-events.

FIG. 34 conceptually illustrates an event-driven simulation that bypasses event-driven simulation for time steps with only bypass-events. The figure illustrates a simulation timeline 3350 that shows events that are scheduled to occur based on the testbench 3300. As illustrated, some time steps along the timeline 3350 have perform-events (e.g., time steps 3402, 3404, 3406, 3407, 3409, and 3411 with at least one black square), while some time steps along the timeline have only skipped-events (e.g., time steps 3401, 3403, 3405, 3408, and 3410 with only white squares). The simulation system performs simulation for perform-events at their corresponding time steps. But no simulation was performed for the bypass-events, and hence the simulation system does not perform simulation at all at time steps with only bypass-events. By skipping time steps with only bypass-events, the simulation system is able to minimize or eliminate the overhead cost associated with the skipped time steps.

The simulation produces partial simulation result data 3360. The partial simulation result data 3360 contains data generated by the execution of the instructions triggered by the perform-events but missing simulation result data for bypass-events. A post processor 3390 receives the partial simulation result data 3360, generates the simulation result data for the bypass-events, and produces a post-processed simulation data 3370 that includes simulation result data for both bypass-events and perform-events.

The classification of scheduled events into perform-events and bypass-events can be based on a variety of different criteria. The compiler that compiles testbench and design into instructions also uses one or more of these criteria to classify different types of scheduled events as being bypass-event or perform-event.

FIG. 33 illustrates an example in which scheduled events are classified based on number of fan-outs. Specifically, scheduled events having sufficiently high number of triggered instructions (e.g., posedge events triggering two or more instructions) are classified as perform-events while events that do not have sufficient number of triggered instructions (e.g., negedge events triggering none or only one instruction) are classified as bypass-events.

In some embodiments, scheduled events that trigger only stateless instructions (i.e., instructions that do not affect the state of the design or the testbench and do not affect the simulation result of subsequent time steps) are classified as bypass-events since bypassing their simulation do not affect the simulation result of other events.

In some embodiments, all events generated by a particular module are classified as bypass-events. In such instances, the simulation accelerator would not execute any instruction for the particular module. In some embodiments, the user may specify through a user interface that a particular type of scheduled events at a particular signal construct to be bypass-events. In some embodiments, the source codes of the testbench may directly specify a particular type of scheduled events at a particular signal construct to be bypass-events.

Different embodiments use different methods and/or apparatus to skip simulation of bypass-events. In some embodiments, the compiler does not generate any instructions that triggers on bypass-events. In some embodiments, an event scheduler that generates both bypass-events and perform-events is compiled into instructions that generate only perform-events. For example, in some embodiments, a clock generation statement that produces one posedge event and one negedge event every clock cycles is compiled into a set of instructions that produces one posedge event every clock cycle without any negedge event.

Figure 35:
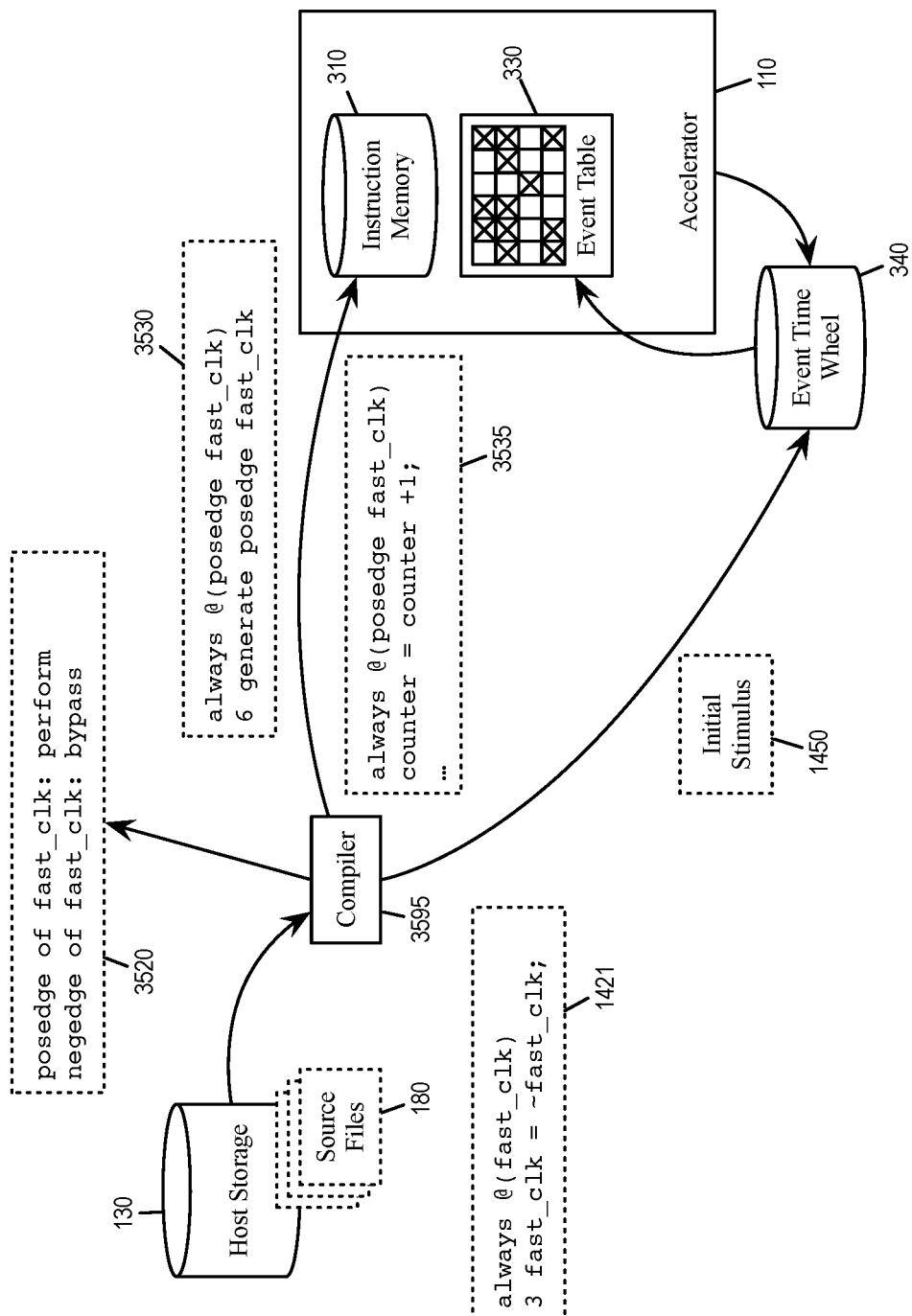
FIG. 35 illustrates a compiler that classifies scheduled events into bypass-events and perform-events and generates instructions to bypass simulation of the bypass-events.

FIG. 35 illustrates a compiler 3595 that classifies scheduled events into bypass-events and perform-events and generates instructions to bypass simulation of the bypass-events. The compiler 3595 performs similar operations as the compiler 195. Additionally, the compiler 3595 classifies the scheduled events generated by an event scheduler 1421 into bypass and perform-events and then compiles the event scheduler 1421 into instructions that generate only perform-events.

As illustrated, a compiler 3595 receives and compiles the source files 180, which includes the clock generation statement 1421 (as an event scheduler). The compiler 3595 identifies the clock generation statement 1421 and determines that it generates posedge events and negedge events at the signal construct "fast_clk". Based on its analysis of the source file 180, the compiler 3595 creates a classification 3520 that classifies the posedge events of "fast_clk" as perform-events and negedge events as bypass-events (e.g., by examining the number of instructions that triggers on posedge and negedge events of "fast_clk".)

Based on the classification 3520, the compiler 3595 generates instructions 3530 that generates only posedge events while skipping negedge events for the simulation accelerator 110. The original clock generation statement 1421 generates both posedge events and negedge events by inverting the polarity of the signal at "fast_clk" once every 3 time units. In contrast, the compiled instructions 3530 instruct the simulation accelerator to generate a posedge event once every 6 time units without generating any negedge event for "fast_clk". In addition, the simulation accelerator 110 receives from the compiler 3595 instructions that triggers on posedge of "fast_clk" for execution (e.g., instructions 3535 that operate in clock domain of "fast_clk") but no instruction that trigger on negedge of "fast_clk". This also ensures that the event time wheel 340 contains only perform-events but no bypass-events, and that the event table 330 is populated with pending events that are based on (e.g., propagated from) perform-events but not bypass-events. This also allows the simulation to bypass time steps with only bypass-events.

Figure 36:
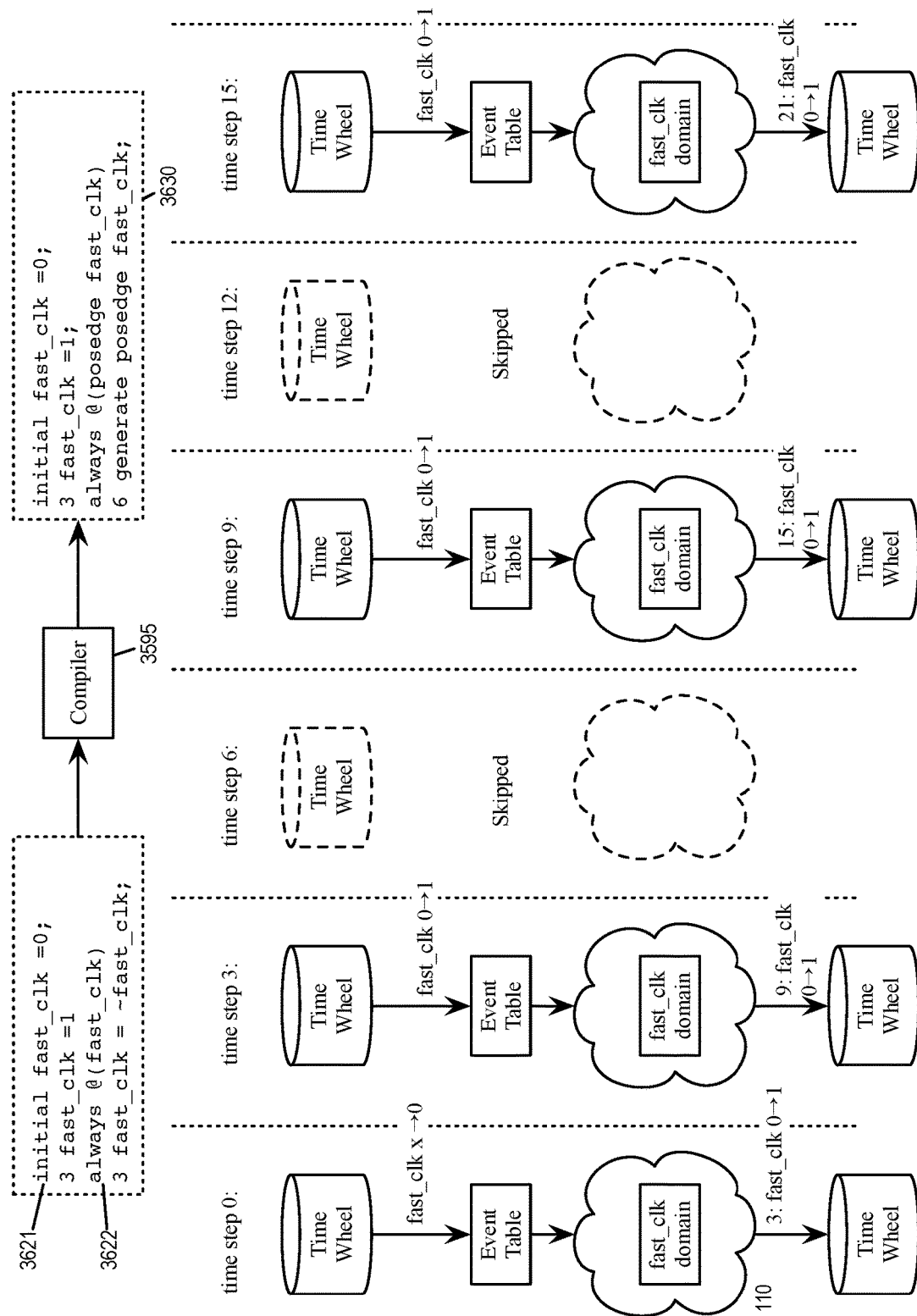
FIG. 36 illustrates the operations of the simulation system when the simulation accelerator is configured with instructions that bypass simulation of bypass-events.

FIG. 36 illustrates the operations of the simulation system when the simulation accelerator is configured with instructions that bypass simulation of bypass-events. The instructions is provided by the compiler 3595, which classifies scheduled events generated by event schedulers into skipped and perform-events and then compiles the event scheduler into instructions that generate only perform-events.

The simulation is based on a testbench having event schedulers 3621 and 3622. The event scheduler 3621 schedules initial events for "fast_clk" by setting the clock signal to logic 0 at time step 0 and then to logic 1 at time step 3 (hence generating an initial posedge event). The event scheduler 3622 schedules clock transition for "fast_clk" event once every 3 time units and alternates between posedge and negedge. The compiler 3595 classifies the negedge events of "fast_clk" as bypass-events and produces instructions 3630 that skip negedge events for "fast_clk". For "fast_clk", the generated instructions 3630 generate a posedge event once every 6 time units without ever generating a negedge event. The figure shows the operations of the simulation system when the simulation accelerator 110 is configured to execute the instructions 3630.

At time step 0, the time wheel is filled with an initially scheduled event that sets "fast_clk" to 0. The simulation accelerator 110 executes instructions by propagating the scheduled events through the instructions of clock domain of "fast_clk". The simulation accelerator 110 also generates scheduled events for future time steps for storage in the time wheel 340 based on the instructions 3630, specifically a posedge event for "fast_clk" at time step 3.

At time step 3, the time wheel 340 populates the event table 330 with posedge event of "fast_clk", and the simulation accelerator 110 executes instructions by propagating the scheduled events through the instructions of clock domain of "fast_clk". The simulation accelerator 110 also generates a posedge event for "fast_clk" at time step 9 for storage in the time wheel 340. The negedge event of "fast_clk" at time step 6 will be skipped.

At time step 6, the simulation system does not perform any task since no event was scheduled. At least some overhead cost associated with executing negedge instructions for "fast_clk" at this time step is avoided.

At time step 9, the time wheel 340 populates the event table 330 with posedge event of "fast_clk", and the simulation accelerator 110 executes instructions by propagating the scheduled events through instructions of clock domain of "fast_clk". The simulation accelerator 110 also generates a posedge event for "fast_clk" at time step 15 for storage in the time wheel 340. The negedge event of "fast_clk" at time step 12 will be skipped.

In some embodiments, the simulation system skips simulation of bypass-events by making sure that the event table 330 and/or the time wheel 340 contain only entries that correspond to perform-events, i.e., without any bypass-events. In some embodiments, this is accomplished by installing a filter at the input of the time wheel 340 and/or of the event table 330. The compiler provides configuration for this filter based on its classification of the scheduled events. Consequently, the simulation system simulates only instructions based on perform-events.

Figure 37:
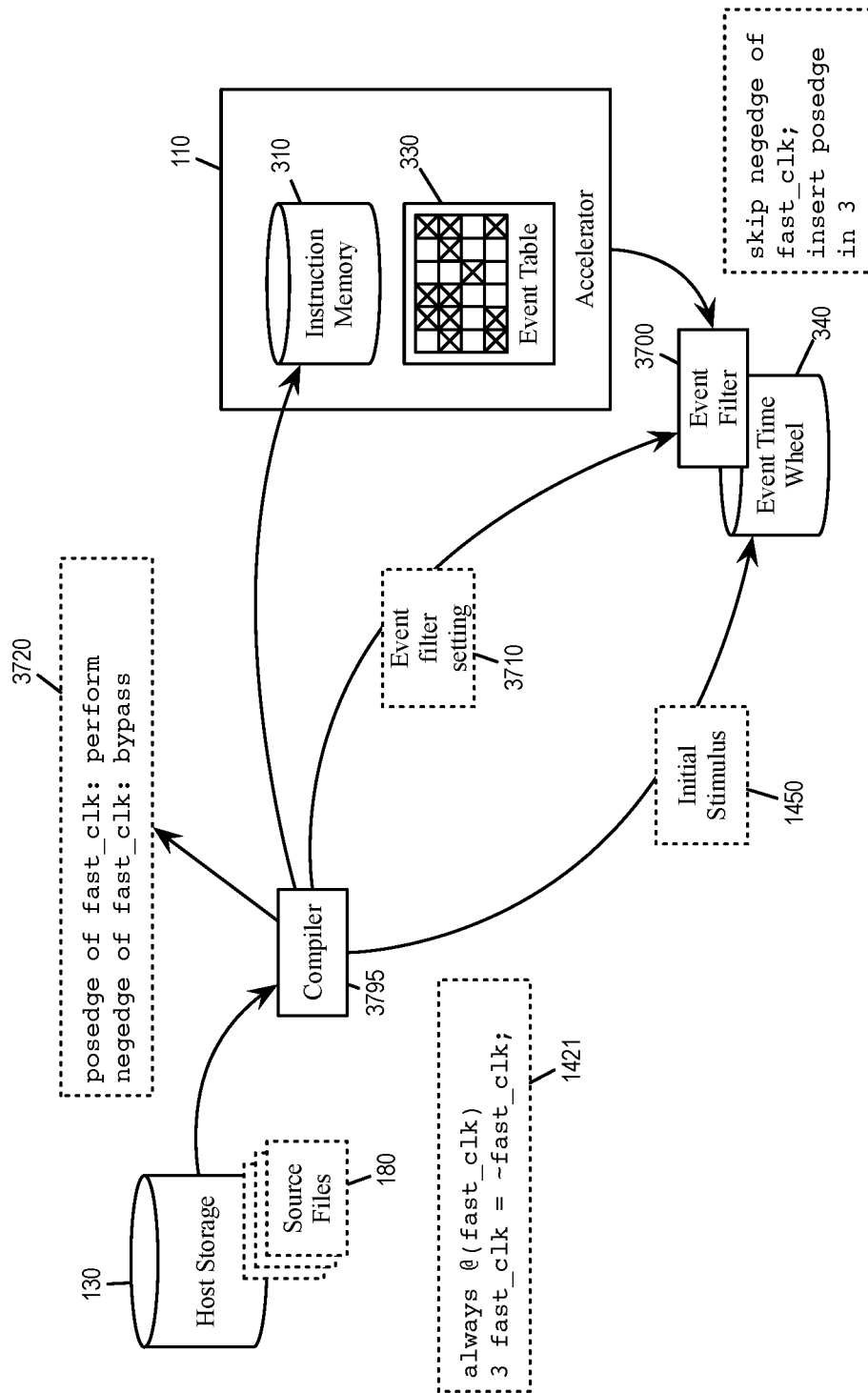
FIG. 37 illustrates a compiler that classifies scheduled events and generates a filter to prevent events classified as bypass-events from entering the event table and/or the time wheel.

FIG. 37 illustrates a compiler 3795 that classifies scheduled events and generates a filter to prevent events classified as bypass-events from entering the event table 330 and/or the time wheel 340. The compiler 3795 is similar to the compiler 3595 in that it performs all operations of the compiler 195 as well as classifying scheduled events into bypass-events and perform-events. However, unlike the compiler 3595 that generates accelerator instructions based on the classification 3520 and thus do not have any negedge instructions, the compiler 3795 enforces event-skipping by installing a filter 3700 that prevents bypass-events from entering the event table 330 and/or the time wheel 340. The filter 3700 also schedules perform-event following each bypass-event. In some embodiments, the time wheel 340 is maintained by the simulation processor 120, and the event filter 3700 is a program running at the simulation processor.

As illustrated, a compiler 3795 receives and compiles the source files 180 having the clock generation statement 1421 for "fast_clk". The compiler 3795 creates a classification 3720 that classifies the posedge events of "fast_clk" as perform-events and negedge events as bypass-events. Based on the classification 3720, the compiler 3795 generates an event filter setting 3710, which is used to configure the event filter 3700 at the input of the event time wheel 340 and/or the event table 330. As illustrated, the event filter setting 3710 specifies that the negedge of "fast_clk" are bypass-events so that the event time wheel 340 would not store negedge event of "fast_clk". The event filter 3700 blocks scheduled event (from the accelerator 110) for negedge of "fast_clk" from being stored at the event time wheel 340, which also prevents negedge events from populating the event table. The event filter 3700 also schedules the next posedge event for "fast_clk" following each skipped negedge event.

Figure 38:
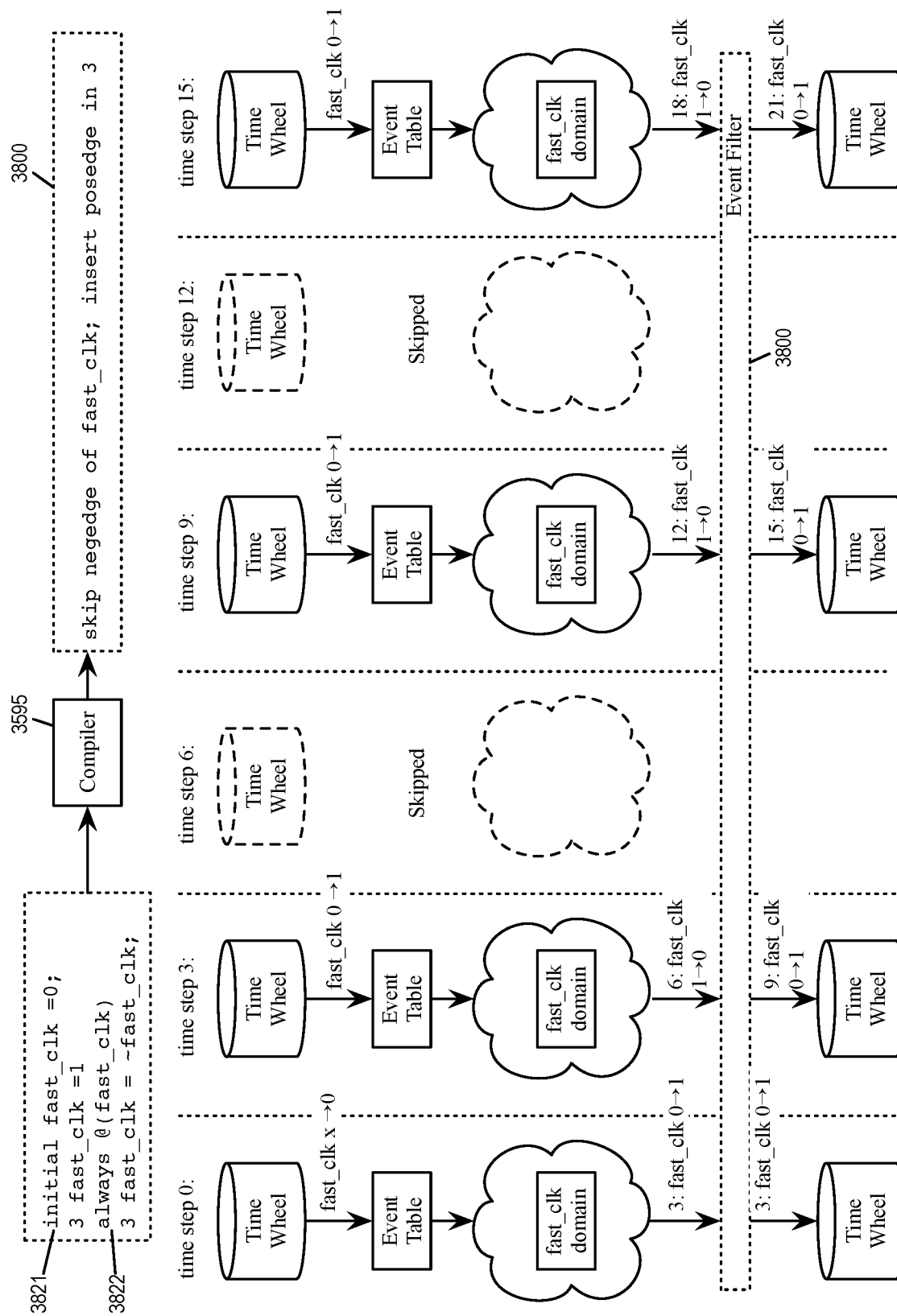
FIG. 38 illustrates the operations of the simulation system when it is configured to prevent bypass-events from entering the time wheel and/or the event table.

FIG. 38 illustrates the operations of the simulation system when it is configured to prevent bypass-events from entering the time wheel and/or the event table. Bypass-events are blocked by a filter whose setting is provided by the compiler 3595, which classifies scheduled events generated by event schedulers into bypass-events and perform-events.

The simulation is based on a testbench having event schedulers 3821 and 3822. The event scheduler 3821 schedules initial events for "fast_clk" by setting the clock signal to logic 0 at time step 0 and then to logic 1 at time step 3 (hence generating an initial posedge event). The event scheduler 3822 schedules clock transition for "fast_clk" event once every 3 time units and alternates between posedge and negedge. The compiler 3795 classifies the negedge events of "fast_clk" as bypass-events and produces a filter 3800 that blocks the bypass-event from entering the time wheel. The filter 3800 also schedules the next perform-events by generating and inserting posedge events into the time wheel storage. The figure shows the operations of the simulation system based on the event filter 3800.

At time step 0, the time wheel is filled with initially scheduled events that sets "fast_clk" to 0. The simulation accelerator 110 executes instructions by propagating the scheduled events through instructions of clock domain of "fast_clk". The simulation accelerator 110 also generates scheduled events for future time steps for storage in the time wheel 340, specifically a posedge event for "fast_clk" at time step 3.

At time step 3, the time wheel 340 populates the event table 330 with posedge event of "fast_clk", and the simulation accelerator 110 executes instructions by propagating the scheduled events through the instructions of the clock domain of "fast_clk". The simulation accelerator 110 also generates a negedge event for "fast_clk" at time step 6 for storage in the time wheel 340. However, this negedge event is blocked by the filter 3800 and replaced with a posedge event for "fast_clk" scheduled for the time step 9.

At time step 6, the simulation system does not perform any task since no event was scheduled. At least some overhead cost associated with executing negedge instructions for "fast_clk" at this time step is avoided.

At time step 9, the time wheel 340 populates the event table 330 with posedge event of "fast_clk", and the simulation accelerator 110 executes instructions by propagating the scheduled events through the instructions of the clock domain of "fast_clk". The simulation accelerator 110 also generates a negedge event for "fast_clk" at time step 12 for storage in the time wheel 340. However, this negedge event is blocked by the filter 3800 and replaced with a posedge event for "fast_clk" scheduled for the time step 15.

In some embodiments, an event-driven simulation produces only the simulation result data for events that are actually simulated but not the events that are skipped. In other words, the simulation result data is partial simulation result data that lacks data for the bypass-events and/or time steps. In order to create a complete simulation result data for all events and all time steps, some embodiments provide a post processor to generate the missing simulation result data for the bypass-events.

Figure 39A:
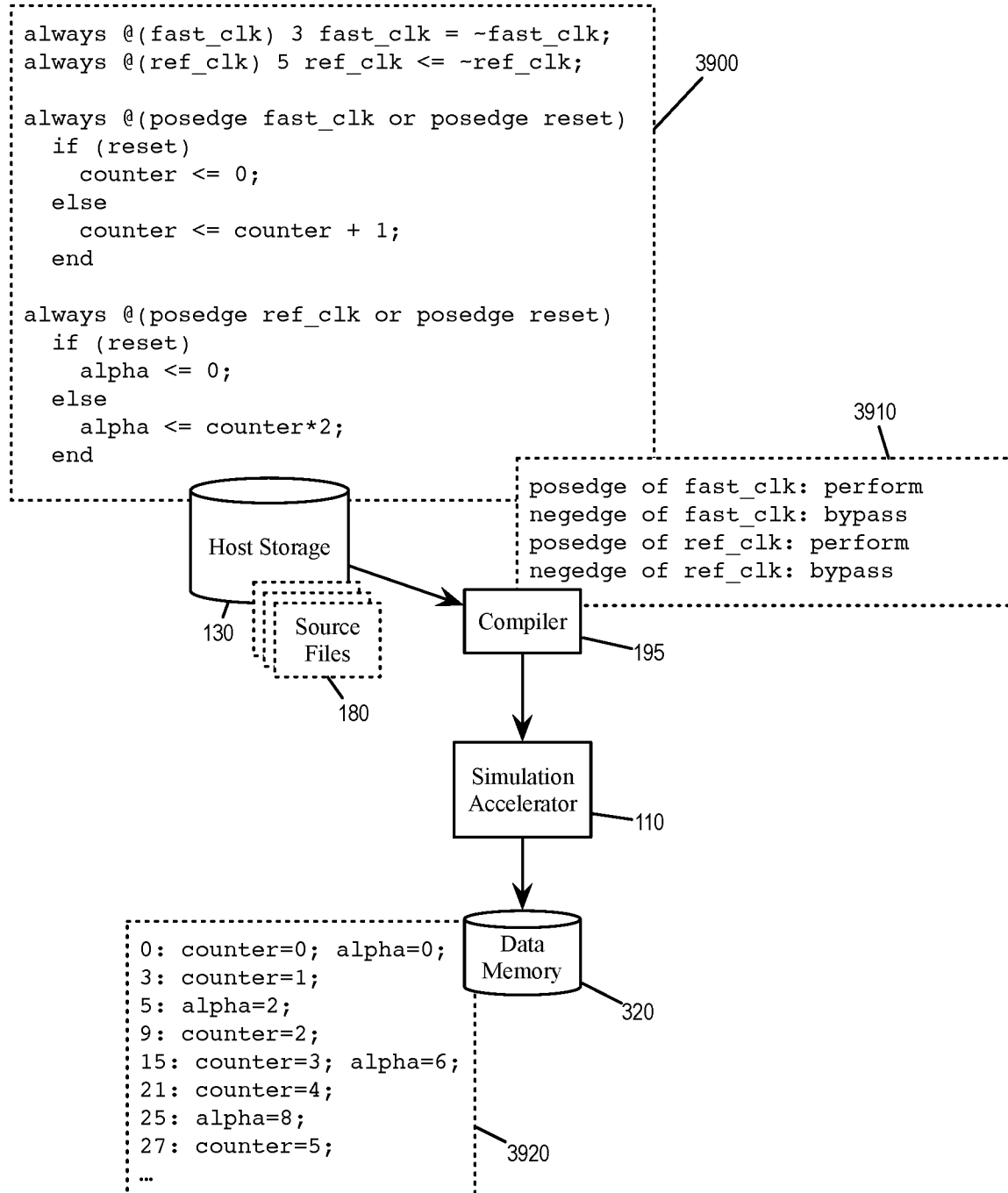
FIG. 39a-b illustrates the generation of missing simulation result data for bypass-events by post-processing.
Figure 39B:
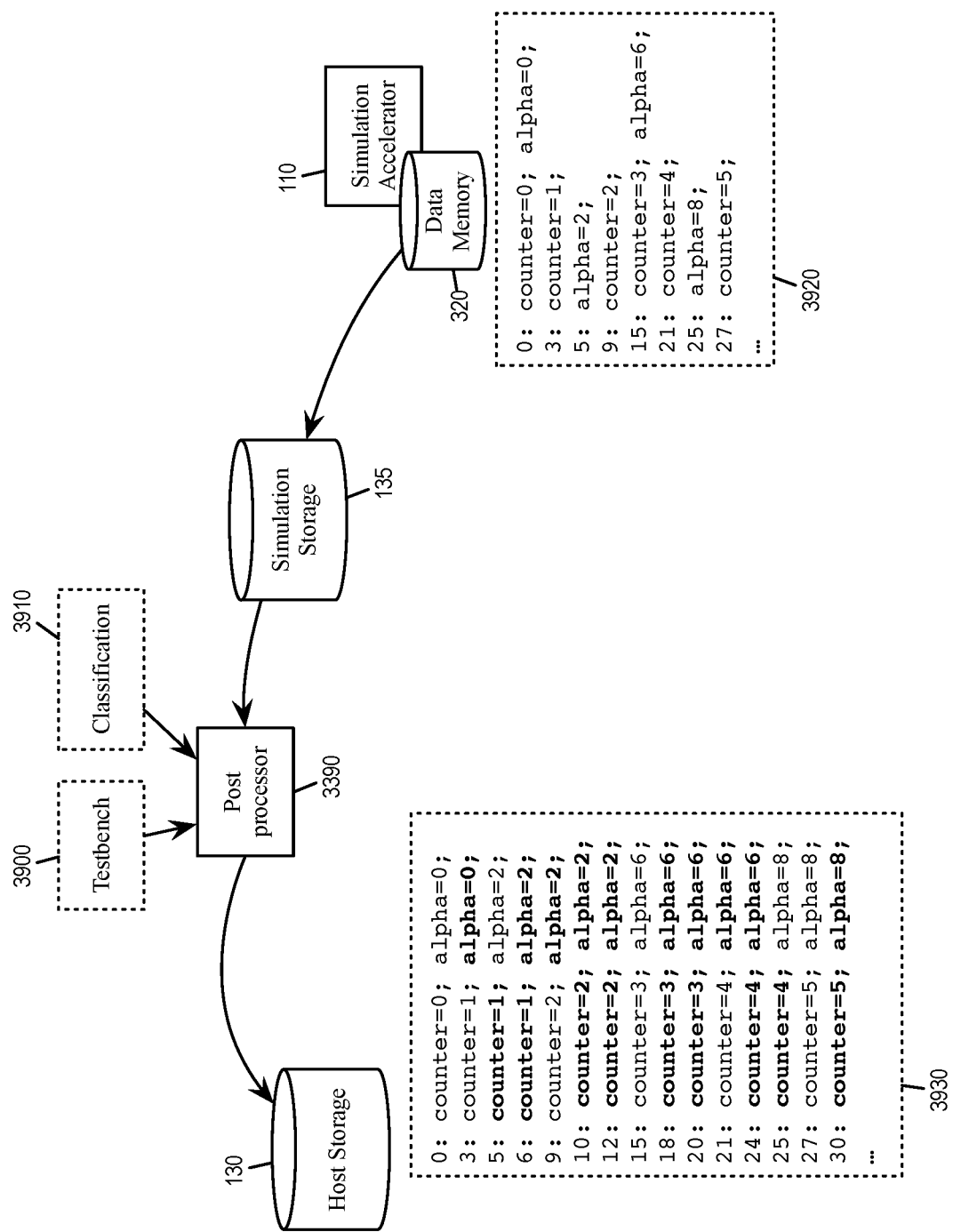

FIG. 39a-b illustrates the generation of missing simulation result data for bypass-events by post-processing. The figure illustrates the post-processing of the simulation result data of an event driven simulation of an example testbench 3900. The event driven simulation skips certain events that are classified as bypass-events.

The tesbench includes clock generation statements for "fast_clk" and "ref_clk", respectively. The posedge of the clock signal "fast_clk" is used to clock a signal "counter", while the posedge of the clock signal "ref_clk" is used to clock a variable "alpha". The negedge event of "ref_clk" and "fast_clk" are not used except to toggle the polarity of their respective signal constructs.

The compiler 195 compiles the testbench 3900 into instructions for the simulator 110. The compiler classifies the posedge events of "fast_clk" and "ref_clk" as perform-events and the negedge events as bypass-events (and recording the classification in a metadata 3910). In some embodiments, the compiler 195 generates instructions that generate only perform-events (i.e., similar to the compiler 3595 of FIG. 35). In some embodiments, the compiler 195 generates a filter setting to configure an event filter that prevents the time wheel 340 and the event table 330 from storing bypass-events (i.e., similar to the compiler 3795 of FIG. 37).

The simulation accelerator 110 performs event driven simulation based on the instructions (and the filter settings) provided by the compiler 195 and produces a set of simulation result data 3920. In some embodiments, the simulation result data 3920 is the accumulation of the output data from the instructions executed by the simulation accelerator 110. In some embodiments, the data access unit 420 transports the output data of the instructions from the data memory 320 to the simulation storage 135. The accumulation of simulation result data, i.e., instrumentation, is described by reference to FIG. 23 above.

The simulation result data 3920 is partial simulation result data, because it includes only data from perform-events. As illustrated, the partial simulation result data 3920 has data for "counter" where "fast_clk" has posedge events, (e.g., time steps 0, 3, 9, 15, 21, and 27). The partial simulation result data 3920 also has data for "alpha" where "ref_clk" has posedge events, (e.g., time steps 0, 5, 15, 25). There is no data for "counter" where "fast_clk" has negedge events (e.g., time steps 6, 12, 18, 24), and there is no data for "alpha" where "ref_clk" has negedge events (e.g., time steps 10, 20, 30).

The post processor 3390 post-processes the partial simulation result data 3920 to produce a complete simulation result data 3930. The post processor 3390 can be the host computer 190 (i.e., a program running on the host computer 190), or any other computing device that is capable of receiving the partial simulation result data 3360 and generating the missing simulation result data.

In some embodiments, the post-processor 3390 and the compiler (195, 3595, or 3795) are programs running on a same computing device (e.g., the host computer 190.) Such a computing device receives a testbench for a design of an integrated circuit (IC) and classifies a first type of events scheduled by the testbench as bypass-events and a second type of events scheduled by the testbnech as perform-events. The computing device configures the simulation system to perform event-based simulation of the testbench based on the first type of events but not the second type of events. The computing device receives a first simulation result data from the simulation system based on the simulation of the first type of events and generates a second simulation result data for the second type of events by extrapolating from the first simulation result data.

In some embodiments, the post-processor generates the missing simulation result data by extrapolating from the partial simulation result data. Specifically, the post-processor generates data for a signal construct at a time step by extending a previous known the value of the signal construct from the partial simulation result data. In the example illustrated in FIG. 39b, the partial simulation result data 3920 has no entry for the signal "counter" at time step 5 and 6, so the post processor 3390 extends the previous known value for the signal "counter" at time step 3 (counter=1) to time steps 5 and 6. In some embodiments, the post-processor uses this approach to generate the missing data for a signal if the bypass-events for the signal (e.g., negedge events of a clock) is known to trigger no instruction other than to flip its own polarity.

In some embodiments, a bypass-event may trigger one or more stateless instructions. The post processor 3390 in these instances would use the testbench 3900 to generate the simulation result data for the bypass-event by using the partial simulation data as input.

In some embodiments, the post-processor uses the testbench 3900 or the classification metadata 3910 to identify which events and/or which time step was skipped due to bypass-events so the post-processor 3390 can construct the complete simulation result data by generating and filling in the simulation result data for the skipped time steps and/or events. In some embodiments, the partial simulation result data has placeholders for the missing time steps and/or missing events. In some embodiments, the partial simulation result data has no such placeholders and the post-processor identifies the missing time steps and/or missing events by analyzing the testbench 3900 or the classification metadata 3910.

Figure 40:
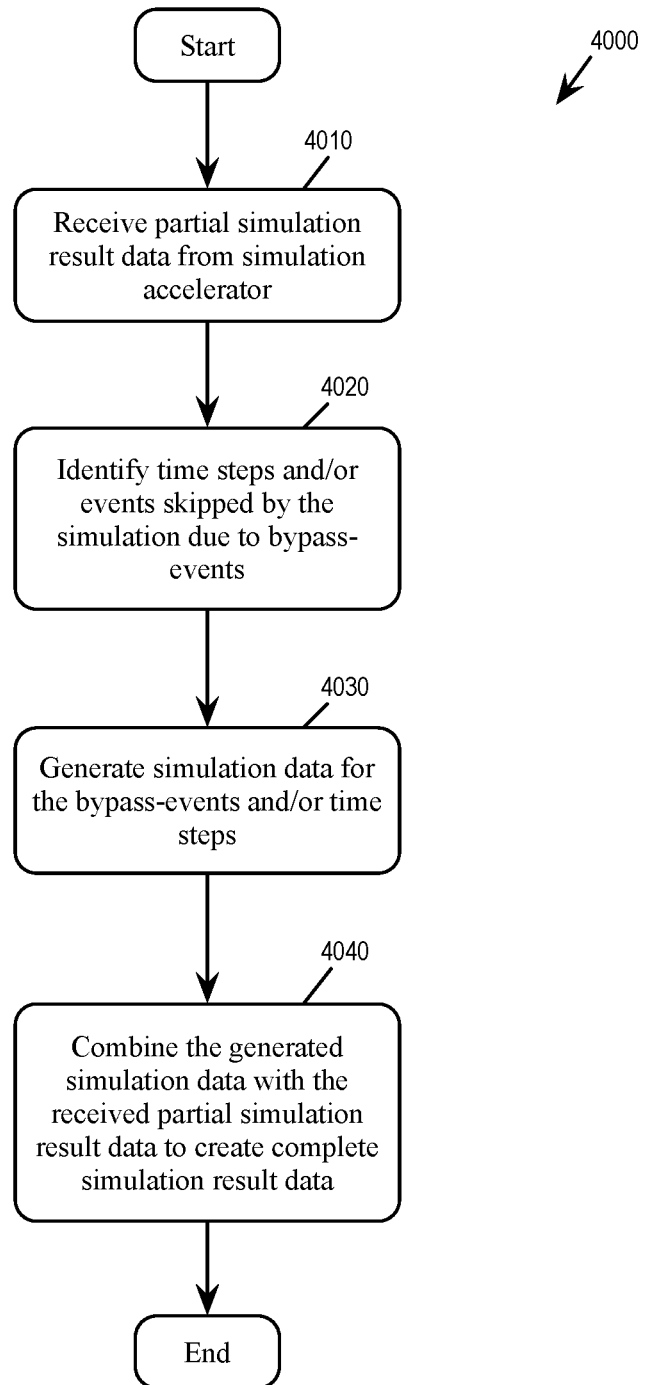
FIG. 40 conceptually illustrates a process for post-processing a partial simulation result data from an event-driven simulation that skips certain events.

FIG. 40 conceptually illustrates a process 4000 for post-processing a partial simulation result data from an event-driven simulation that skips certain events. In some embodiments, one or more processing units of a computing device implementing the post processor 3390 (such as the host computer 190) performs the process 4000.

The process 4000 receives (at 4010) partial simulation result data from the simulation accelerator. In some embodiments, the partial simulation data is the accumulation of the output data from the instructions executed by the simulation accelerator. The output data of the executed instructions are stored in the data memory 320, and the content of data memory are dumped out periodically as simulation result data. The simulation result data is partial because the simulation result data is missing data from bypass-events that were skipped.

The process identifies (4020) the time steps and the events that were skipped by the simulation due to bypass-events. In some embodiments, the partial simulation result data has placeholders for the missing time steps and/or missing events. In some embodiments, the post-processor identifies the missing time steps and/or missing events by analyzing the testbench or a classification metadata that lists the bypass-events.

The process then generates (at 4030) simulation data for the bypass-events and/or the skipped time steps. For some bypass-events, this is accomplished by extrapolating from partial simulation result data. For some other bypass-events, this is accomplished by performing simulation for the bypass-events based on the testbench with the partial simulation result data as input.

The process then combines (at 4040) the generated simulation data with the received partial simulation result data to create a complete simulation result data. In some embodiments, the complete simulation result data is in value change dump (VCD) format, and the generated simulation data are merged with the partial simulation result data according to the VCD format. The complete simulation result data is then stored for analysis or forwarded to a simulation waveform viewer.

Figure 41A:
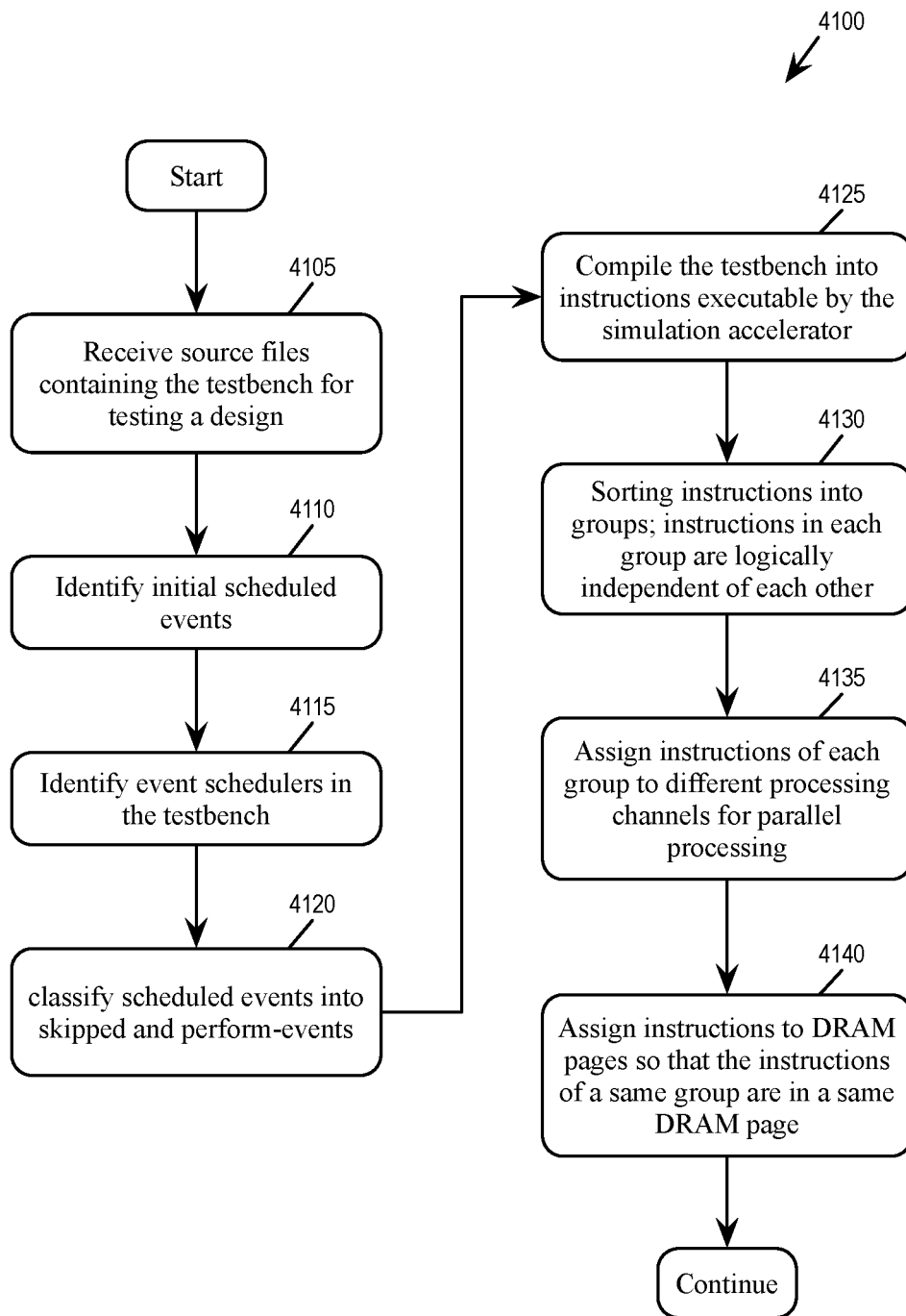
FIGS. 41a-b conceptually illustrates a process for compiling a testbench for a design into accelerator instructions.
Figure 41B:
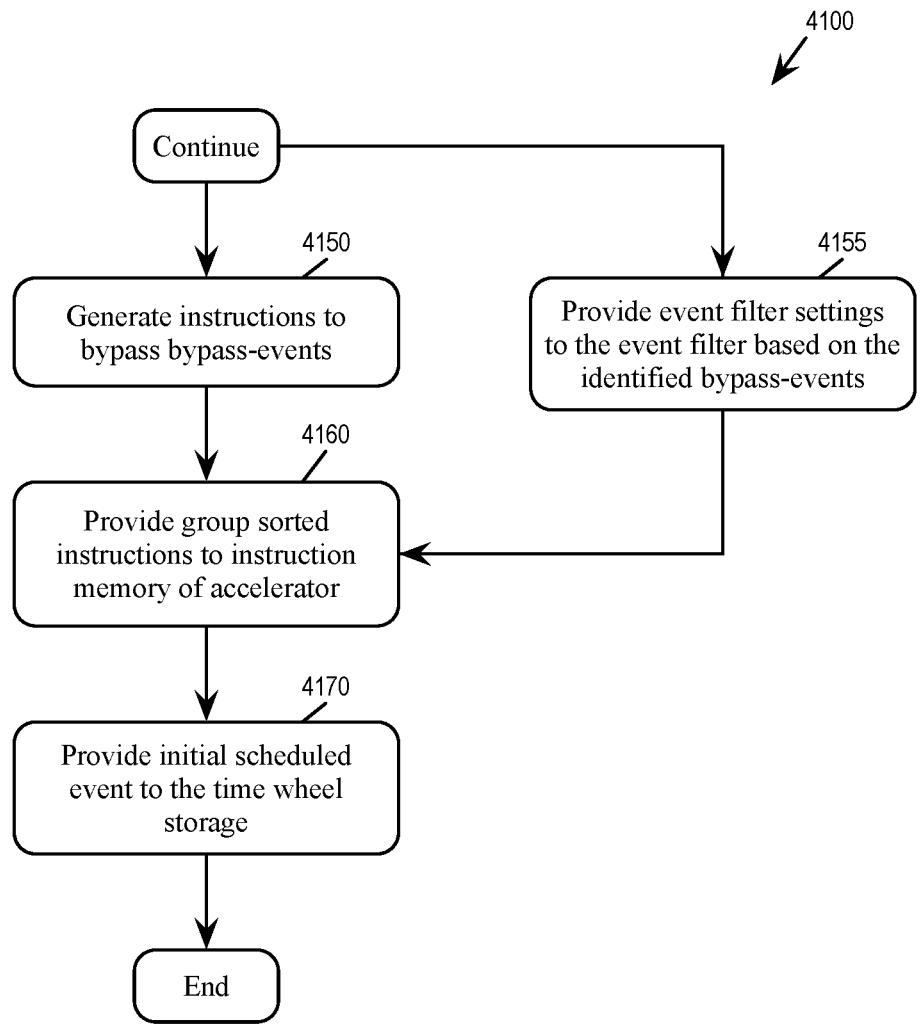

FIGS. 41a-b conceptually illustrates a process 4100 for compiling a testbench for a design into accelerator instructions. In some embodiments, one or more processing units (e.g., a processor) of a computing device implementing a compiler (e.g., the host computer 190 implementing the compiler 195, 3595, or 3795) performs the process 4100.

As illustrated in FIG. 41a, the process 4100 starts when it receives (at 4105) source files containing a testbench for testing a design. The process then identifies (at 4110) a set of initial scheduled events from the testbench. These initial scheduled events provide the initial stimulus (e.g., 1450) stored in the time wheel storage 340, which is in turn used to populate the event table 330 at the start of the simulation. The process also identifies (at 4115) event schedulers in the testbench. The event schedulers may include clock generation statements that generates rising and falling clock edge or delayed assignment statements.

Next, the process classifies (at 4120) the scheduled events into bypass-events and perform-events. In some embodiments, the compiler classifies different types of events produced by an event scheduler as being bypass-event or perform-event. In some embodiments, the process classifies scheduled events having sufficiently high number triggered instructions as perform-events while events that do not have sufficient number of triggered instructions as bypass-events. In some embodiments, all events generated by a particular module are classified as bypass-events. In some embodiments, the user specifies (through a user interface) a particular type of scheduled events at a particular signal construct to be bypass-events. In some embodiments, the source codes of the testbench directly specify a particular type of scheduled events at a particular signal construct to be bypass-events.

Next, the process compiles (at 4125) the testbench into instructions executable by the simulation accelerator. The process also sorts (at 4130) the instructions into groups. Instructions in each group are logically independent of other instructions in the group. The process of sorting instructions into groups is described in Section II.B above.

The process assigns (at 4135) the instructions of each group into different processing channels for parallel processing by different ALUs. In some embodiments, the assignment of instructions to ALUs is based on the complexity of instructions or expected execution time of instructions. Each ALU is assigned a different mix of instructions such that the different ALUs are expected to finish their assigned instructions around the same time. In some embodiments, the process 4100 does not perform the step 4135 but instead allow the accelerator to dynamically assign instructions to ALUs for execution.

The process also assigns (at 4140) instructions to DRAM pages so that the instructions belonging to a same group would be in the same page in order to minimize page change penalties. In some embodiments, the process 4100 do not perform the step 4140 because the accelerator does not use DRAM as instruction memory for storing instructions. The process 4100 continues in FIG. 41b.

FIG. 41b shows the remaining steps of the process 4100 for some embodiments in which the compiler compiles the event scheduler into instructions that generate only perform-events. The process generates (at 4150) instructions to skip bypass-event. For example, in some embodiments, for a clock generation statement that generates both posedge events (perform-events) and negedge (bypass-events), the process modifies its corresponding accelerator instruction to bypass the negedge events and generate only posedge events. Bypassing bypass-events by having instructions that generate only perform-events is described above by reference to FIG. 35. The process 4100 then proceeds to 4160.

FIG. 41b also shows the remaining steps of the process 4100 for some embodiments in which the compiler classifies scheduled events and generates a filter to prevent bypass-events from entering the event table and/or the time wheel.

The process provides (at 4155) filter settings to the event filter based on the identified bypass-events. Generating filter settings to prevent bypass-events from entering the event table and/or the time wheel is described above by reference to FIG. 37. The process 4100 then proceeds to 4160.

At 4160, the process 3900 provides the group-sorted instructions to the instruction memory of the accelerator. The process also provides (4170) the initial pending event to the time wheel storage. In some embodiments, the compiler does not provide the instructions and the initial scheduled event to the simulation system directly, but instead store them for delivery to the simulation system later. The process 4100 then ends.

IV. Electronic System

Figure 42:
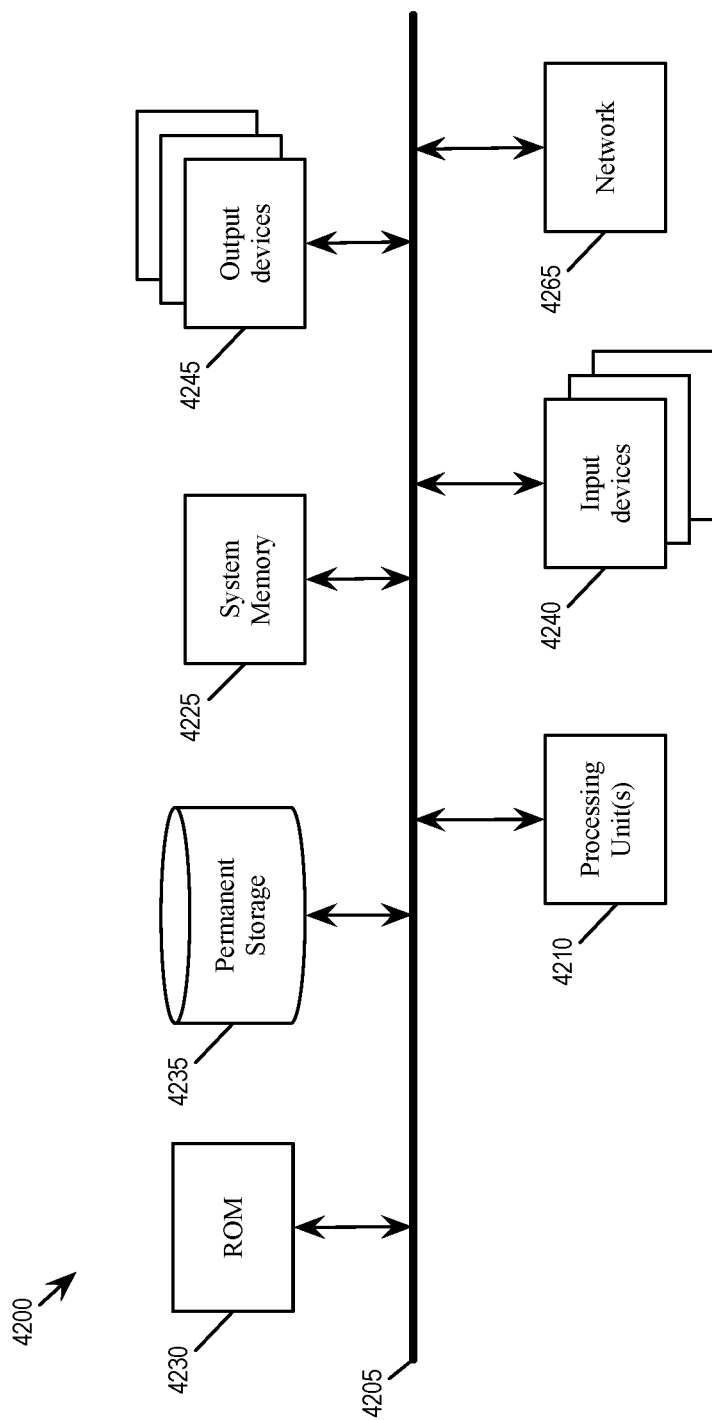
FIG. 42 conceptually illustrates an electronic system with which some embodiments of the invention are implemented.

FIG. 42 conceptually illustrates an electronic system 4200 with which some embodiments of the invention are implemented. The electronic system 4200 can be used to execute any of the control, virtualization, or operating system applications described above. The electronic system 4200 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 4200 includes a bus 4205, processing unit(s) 4210, a system memory 4225, a read-only memory 4230, a permanent storage device 4235, input devices 4240, and output devices 4245.

The bus 4205 collectively represents all system, peripheral, and chipset buses that communicatively connect the numerous internal devices of the electronic system 4200. For instance, the bus 4205 communicatively connects the processing unit(s) 4210 with the read-only memory 4230, the system memory 4225, and the permanent storage device 4235.

From these various memory units, the processing unit(s) 4210 retrieves instructions to execute and data to process in order to execute the processes of the invention. The processing unit(s) may be a single processor or a multi-core processor in different embodiments.

The read-only-memory (ROM) 4230 stores static data and instructions that are needed by the processing unit(s) 4210 and other modules of the electronic system. The permanent storage device 4235, on the other hand, is a read-and-write memory device. This device is a non-volatile memory unit that stores instructions and data even when the electronic system 4200 is off. Some embodiments of the invention use a mass-storage device (such as a magnetic or optical disk and its corresponding disk drive) as the permanent storage device 4235.

Other embodiments use a removable storage device (such as a floppy disk, flash drive, etc.) as the permanent storage device. Like the permanent storage device 4235, the system memory 4225 is a read-and-write memory device. However, unlike storage device 4235, the system memory is a volatile read-and-write memory, such a random access memory. The system memory stores some of the instructions and data that the processor needs at runtime. In some embodiments, the invention's processes are stored in the system memory 4225, the permanent storage device 4235, and/or the read-only memory 4230. From these various memory units, the processing unit(s) 4210 retrieves instructions to execute and data to process in order to execute the processes of some embodiments.

The bus 4205 also connects to the input and output devices 4240 and 4245. The input devices enable the user to communicate information and select commands to the electronic system. The input devices 4240 include alphanumeric keyboards and pointing devices (also called "cursor control devices"). The output devices 4245 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 42, bus 4205 also couples electronic system 4200 to a network 4265 through a network adapter (not shown). In this manner, the computer can be a part of a network of computers (such as a local area network ("LAN"), a wide area network ("WAN"), or an Intranet, or a network of networks, such as the Internet. Any or all components of electronic system 4200 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 18, 19, 20, 22, 31, 32, 40, and 41*a-b*,) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A method comprising:
receiving, at a first computing device, a testbench for a design of an integrated circuit (IC);
classifying a first type of events scheduled by the testbench as perform-events and a second type of events scheduled by the testbench as bypass-events;
configuring a second computing device to perform event-based simulation of the testbench based on the first type of events;
receiving a first simulation result data from the second computing device based on the simulation of the first type of events; and
generating a second simulation result data for the second type of events by extrapolating from the first simulation result data.

2. The method of claim 1, wherein configuring the second computing device comprises compiling the testbench to generate (i) a set of instructions that are executable at the second computing device for performing event-driven simulation for a first set of simulation time steps and (ii) a configuration for configuring the second computing device to block event-driven simulation based on the second type of events.

3. The method of claim 1, wherein the testbench comprises a clock signal that generates both the first and second types of events, wherein the second computing device is configured to simulate the first type of events for the clock signal but not the second type of events for the clock signal.

4. The method of claim 1, wherein the first type of events is a rising edge of a clock signal and the second type of events is a falling edge of the clock signal.

5. The method of claim 1, wherein said classifying comprises identifying a fan-out of the first type of events a fan-out of the second type of events.

6. The method of claim 1, wherein said classifying comprises classifying events scheduled by a particular module in the testbench as bypass-events.

7. The method of claim 1, wherein said classifying comprises identifying events that do not affect the simulation result of subsequent time steps as bypass-events.

8. The method of claim 1, wherein the second computing device is configured to perform event-based simulation of the testbench based on the first type of events without using the second type of events.

9. An electronic device comprising one or more integrated circuits (IC) configured to perform operations comprising:
receiving a testbench for a design of an integrated circuit (IC);
classifying a first type of events scheduled by the testbench as perform-events and a second type of events scheduled by the testbench as bypass-events;
configuring a particular computing device to perform event-based simulation of the testbench based on the first type of events;
receiving a first simulation result data from the particular computing device based on the simulation of the first type of events; and
generating a second simulation result data for the second type of events by extrapolating from the first simulation result data.

10. The electronic device of claim 9, wherein configuring the particular computing device comprises compiling the testbench to generate (i) a set of instructions that are executable at the particular computing device for performing event-driven simulation for a first set of simulation time steps and (ii) a configuration for configuring the particular computing device to block event-driven simulation based on the second type of events.

11. The electronic device of claim 9, wherein the testbench comprises a clock signal that generates both the first and second types of events, wherein the particular computing device is configured to simulate the first type of events for the clock signal but not the second type of events for the clock signal.

12. The electronic device of claim 9, wherein the first type of events is a rising edge of a clock signal and the second type of events is a falling edge of the clock signal.

13. The electronic device of claim 9, wherein said classifying comprises identifying a fan-out of the first type of events a fan-out of the second type of events.

14. The electronic device of claim 9, wherein said classifying comprises classifying events scheduled by a particular module in the testbench as bypass-events.

15. The electronic device of claim 9, wherein said classifying comprises identifying events that do not affect the simulation result of subsequent time steps as bypass-events.

16. The electronic device of claim 9, wherein the particular computing device is configured to perform event-based simulation of the testbench based on the first type of events without using the second type of events.

* * * * *